(12) United States Patent
Zieren et al.

(10) Patent No.: US 9,696,390 B2
(45) Date of Patent: Jul. 4, 2017

(54) DIFFERENTIAL LATERAL MAGNETIC FIELD SENSOR SYSTEM WITH OFFSET CANCELLING AND IMPLEMENTED USING SILICON-ON-INSULATOR TECHNOLOGY

(71) Applicant: NXP B.V., Eindhoven (NL)

(72) Inventors: Victor Zieren, Valkenswaard (NL); Olaf Wunnicke, Eindhoven (NL); Klaus Reimann, Eindhoven (NL)

(73) Assignee: NXP B.V., Eindhoven (NL)

( * ) Notice: Subject to any disclaimer, the term of this patent is extended or adjusted under 35 U.S.C. 154(b) by 281 days.

(21) Appl. No.: 14/741,285

(22) Filed: Jun. 16, 2015

(65) Prior Publication Data

US 2016/0003923 A1    Jan. 7, 2016

(30) Foreign Application Priority Data

Jul. 1, 2014  (EP) .................................... 14175285

(51) Int. Cl.
*H01L 27/22*    (2006.01)
*G01R 33/06*    (2006.01)
(Continued)

(52) U.S. Cl.
CPC ....... *G01R 33/066* (2013.01); *G01R 33/0206* (2013.01); *H01L 27/22* (2013.01); *H01L 43/02* (2013.01); *H01L 43/08* (2013.01)

(58) Field of Classification Search
CPC ..................................................... H01L 27/22
(Continued)

(56) References Cited

U.S. PATENT DOCUMENTS 4,829,352 A   5/1989 Popovic et al.
5,323,050 A   6/1994 Ristic
(Continued)

FOREIGN PATENT DOCUMENTS

WO    03/036733 A2    5/2003

OTHER PUBLICATIONS

Schurig, E. et al. "0.2 mT Residual Offset of CMOS Integrated Vertical Hall Sensors", Sensors and Actuators A, 110, pp. 98-104 (2004).

(Continued)

*Primary Examiner* — Chandra Chaudhari
(74) *Attorney, Agent, or Firm* — Rajeev Madnawat

(57) ABSTRACT

A differential magnetic field sensor system (10) is provided, in which offset cancelling for differential semiconductor structures in magnetic field sensors arranged close to each other is realized. The system (10) comprises a first, a second and a third magnetic field sensor (100, 200, 300), each of which is layouted substantially identically and comprises a, preferably silicon-on-insulator (SOI), surface layer portion (102) provided as a surface portion on a, preferably SOI, wafer and having a surface (104). On the surface (104) is arranged a central emitter structure (110, 210, 310) formed substantially mirror symmetrical with respect to a symmetry plane (106, 206, 306) that is substantially perpendicular to the surface (104, 204, 304), and a first and a second collector structure (116, 216, 316; 118, 218, 318), each of which is arranged spaced apart from the emitter structure (110, 210, 310) and which are arranged on opposite sides of the symmetry plane (106, 206, 306) so as to be substantially mirror images of each other. The first magnetic field sensor (100) is operated double-sided in that its first collector structure (116) and its emitter structure (110) are externally connected via a first read-out circuitry and its second collector structure (118) and its emitter structure (110) are externally connected via a second read-out circuitry. The (Continued)

second magnetic field sensor (200) is operated single-sided in that its first collector structure (216) and its emitter structure (210) are externally connected via a third read-out circuitry. The third magnetic field sensor (300) is operated single-sided in that its second collector structure (318) and its emitter structure (310) are externally connected via a fourth read-out circuitry.

16 Claims, 34 Drawing Sheets

(51) Int. Cl.
    *G01R 33/02*     (2006.01)
    *H01L 43/02*     (2006.01)
    *H01L 43/08*     (2006.01)

(58) Field of Classification Search
    USPC .................................................. 257/423, 426
    See application file for complete search history.

(56) References Cited

U.S. PATENT DOCUMENTS

| | | | | |
|---|---|---|---|---|
| 5,446,307 | A * | 8/1995 | Lux | H01L 29/82 |
| | | | | 257/423 |
| 8,442,787 | B2 * | 5/2013 | Ausserlechner | G01R 15/202 |
| | | | | 702/57 |
| 8,981,442 | B2 | 3/2015 | Zieren et al. | |
| 9,024,630 | B2 * | 5/2015 | Koop | H05K 1/18 |
| | | | | 29/832 |
| 2005/0230770 | A1 | 10/2005 | Onhira | |
| 2009/0256559 | A1 | 10/2009 | Ausserlechner et al. | |
| 2013/0015853 | A1 | 1/2013 | Raz et al. | |
| 2013/0080087 | A1 | 3/2013 | Donovan et al. | |
| 2013/0338956 | A1 | 12/2013 | Zieren et al. | |
| 2013/0342194 | A1 | 12/2013 | Motz et al. | |
| 2014/0175528 | A1 | 6/2014 | Zieren et al. | |

OTHER PUBLICATIONS

Munter, P. "A Low-Offset Spinning-Current Hall Plate", Sensors & Actuators, A21-23, pp. 743-746 (1990).
Popovic, R.S. "The Vertical Hall-Effect Device", IEEE Electron Device Letters, vol. 5, No. 9, pp. 357-358 (Sep. 1984).
Munter, P. "Spinning-Current Method for Offset Reduction in Silicon Hall Plates", PhD Thesis, Delft University of Technology, 155 pgs. (1992).
Extended European Search Report for EP Patent Appln. No. 14175285.7 (Jan. 16, 2015).

* cited by examiner

DIFFERENTIAL LATERAL MAGNETIC FIELD SENSOR SYSTEM WITH OFFSET CANCELLING AND IMPLEMENTED USING SILICON-ON-INSULATOR TECHNOLOGY

CROSS-REFERENCE TO RELATED APPLICATIONS

This application claims the priority under 35 U.S.C. §119 of European patent application no. 14175285.7, filed on Jul. 1, 2014, the contents of which are incorporated by reference herein.

TECHNICAL AREA OF THE INVENTION

The present invention relates to differential lateral magnetic field sensor systems, which are implemented using silicon-on-insulator technology and in which offset cancelling of differential semiconductor structures in magnetic field sensors arranged close to each other is realized.

BACKGROUND

Magnetic sensor systems are increasingly important in various industries. For instance in the automotive industry, various sensor systems, such as parking sensors, angular sensors e.g. in throttle valves, ABS (Automatic Braking System) sensors and tire pressure sensors are found in modern vehicles for improving comfort and safety. Magnetic sensor systems are particularly important in automotive applications, because magnetic fields penetrate easily through most materials. In addition, magnetic sensors are highly insensitive to dirt, unlike for example optical sensors.

Several different magnetic sensor technologies are currently available, such as sensors based on the Hall effect, lateral magnetic field sensors based on silicon and constructed on the basis of bipolar lateral magnetoresistors (LMRs), lateral magnetotransistors (LMTs), and lateral magnetodiodes (LMDs) as well as sensors based on the magnetoresistive effect, such as anisotropic magnetoresistive (AMR) and giant magnetoresistive (GMR) sensors. Hall effect based sensors and the bipolar lateral magneto-resistors, transistors and diodes, i.e. LMRs, LMTs and LMDs, rely on the Lorentz force caused by the magnetic flux acting on moving charge carriers. The sensing principle of AMR and GMR sensor systems is based on the physical phenomenon that the electric resistance of a ferromagnetic material depends on the angle between the magnetization and the direction of the electric current within an AMR or GMR sensing element.

Silicon-based magnetic sensors which are sensitive for magnetic field (H) or flux-density (B) components in the plane of a chip can be constructed in plural ways, for example as bipolar magnetoresistors (MRs), magnetotransistors (MTs) and magnetidiodes (MDs), each comprising two or more current-collecting contacts (collectors) and at least one current-emitting contact (emitter) arranged in between the collectors. MTs have a base contact in addition to the emitter and collector contacts and have at least one pn-junction between an emitter and a collector. MDs also have at least one pn-junction between an emitter and a collector, like MTs, but do not have a base contact, unlike MTs. MRs have no pn-junction between an emitter and a collector.

On SOI (silicon on oxide) substrates, the contact structures are made as vertical or lateral magnetotransistors (VMTs or LMTs, respectively), lateral magnetodiodes (LMDs) or lateral magnetoresistors (LMRs). Using SOI substrates has the advantage of preventing leakage currents that would be present in such sensors when made in bulk CMOS (complementary-symmetry metal-oxide-semiconductor) process technology.

The operation of lateral magneto (transistor, resistor and diode) sensors relies on the substantially symmetric geometry of the emitter-collector-contact structure and the fact that the emitter current is split in two components having opposite directions in the space between the collectors, and is influenced by the magnetic flux density (B) through the Lorentz force acting on the two split current portions in two opposite directions. Accordingly, the differential collector current is a measure for the magnetic flux density (B). The splitting of the emitter current suffers from an imbalance in the resulting collector currents even when the magnetic flux density B is zero. This difference of collector currents is referred as the "offset" of the sensor. Even emitter-collector-contact structures with substantially perfect geometric symmetry design suffer from offset (and offset spread).

One possible cause for the offset may be the presence of surface (shallow) trench isolation areas (called STI) between $p^+$ and $n^+$ areas used for collector and emitter contact structures (or for the contact areas associated with these functions). The strain and stress (and charged) interface states associated with these STI areas may be a source of the imbalance between the collector currents due to the statistical nature of the imperfections induced by the STI processing, whereby these imperfections are not all the same and are not equally or symmetrically distributed in the STI areas.

Other causes of the offset may be related to mask misalignment, to non-uniform doping distributions, to mechanical stresses and to thermal gradients. Since it is very difficult to fabricate devices that are insensitive to all these causes, one has to do anything possible to make the devices symmetrical, in layout, in doping distribution, etc. The doping distribution in a standard process is not always ideal. For example, implantation is often performed under a tilt angle of the substrate. The doping symmetry may be improved by making such implantation four times (quad), whereby each time the substrate is rotated by 90 degrees. However, if this is not possible, a systematic offset remains.

The object of the present invention is to provide silicon, preferably SOI, -based lateral magnetic field sensor systems, which have substantially symmetrically layouted emitter-collector-structures and involve a splitting of the emitter current in collector-related components of mutually opposite directions, in which the offset and eventually the offset of the differential current spread is reduced or even cancelled to zero.

DISCLOSURE OF THE INVENTION

The object is solved, according to a first aspect, by a differential magnetic field sensor system according to the independent claim 1 and, according to a second aspect, by a two-dimensional array arrangement of magnetic field sensors according to the independent claim 15. Preferred embodiments are subject matter of the dependent claims.

According to the first aspect of the invention, there is provided a differential magnetic field sensor system, which comprises a first, a second and a third magnetic field sensor, each of which is layouted substantially identically and comprises a, preferably silicon-on-insulator (SOI), surface layer portion provided as a surface portion on a, preferably SOI, wafer. Each of the first, second and third magnetic field sensor has a surface, on and/or in which the following is arranged: a central emitter structure formed substantially mirror symmetrical with respect to a symmetry plane that is substantially perpendicular to the surface, and a first and a second collector structure, each of which is arranged spaced apart from the emitter structure and which are arranged on opposite sides of the symmetry plane so as to be substantially mirror images of each other. The first magnetic field sensor is operated double-sided in that its first collector structure and its emitter structure are externally connected via a first read-out circuitry and its second collector structure and its emitter structure are externally connected via a second read-out circuitry. The second magnetic field sensor is operated single-sided in that its first collector structure and its emitter structure are externally connected via a third read-out circuitry. And the third magnetic field sensor is operated single-sided in that its second collector structure and its emitter structure are externally connected via a fourth read-out circuitry.

In the sensor system according to the first aspect, due to the presence of three substantially identically layouted structures, systematic contributions to the offset, such as mask misalignment and doping gradients are effectively mutually cancelled by providing the second and the third magnetic field sensors, each of which is operated single-sided, in addition to the first magnetic field sensor, which is operated double-sided.

According to the second aspect of the invention, there is provided a two-dimensional magnetic field sensor array arrangement comprising an M×N array of magnetic field sensors, the array having M columns and N rows, wherein the M columns are numbered by an integer index i which can assume any value from 1 to M, the N rows are numbered by an integer index j which can assume any value from 1 to N, and wherein M and N are integers that are greater than or equal to 3. Each magnetic field sensor comprises a, preferably silicon-on-insulator (SOI), surface layer portion and has a surface, on and/or in which the following is arranged: a central emitter structure formed substantially mirror symmetrical with respect to a symmetry plane that is substantially perpendicular to the surface, and a first and a second collector structure, each of which is arranged spaced apart from the emitter structure and which are arranged on opposite sides of the symmetry plane so as to be substantially mirror images of each other. Each magnetic field sensor (i, j) is referenced by the integer index i indicating the column to which the sensor belongs and by the integer index j indicating the row to which the sensor belongs. The magnetic field sensor array arrangement further comprises external connection circuitry configured such that triplets of magnetic field sensors are formed according to one of the following triplet configurations:

(a) (i, j), (i, j+1) and (i, j+2) for any i in the range from 1 to M and any j in the range from 1 to N−2,
(b) (i, j), (i+1, j) and (i+2, j) for any i in the range from 1 to M−2 and any j in the range from 1 to N,
(c) (i, j), (i+1, j+1) and (i+2, j+2) for any i in the range from 1 to M−2 and any j in the range from 1 to N−2,
(d) (i, j), (i−1, j+1) and (i−2, j+2) for any i in the range from 3 to M and any j in the range from 1 to N−2, and
(e) a random selection of three magnetic field sensors out of all available magnetic field sensors (i, j) for any i in the range from 1 to M and any j in the range from 1 to N.

Each of the triplet configurations (a) through (e) is configured to form a differential magnetic field sensor system according to the first aspect of the invention.

In the two-dimensional array arrangement according to the second aspect, the formation of triplet configurations yields the same advantage as does the sensor system according to the first aspect, viz. a mutual cancellation of systematic offset. The provision of multitudes of triplet configurations renders an averaging effect with respect to random causes of offset, which leads to a an additional reduction also of random offset.

FURTHER ADVANTAGES

Each of the first, second and third magnetic field sensor has a lateral dimension. In the sensor system, the distance between the first and the second magnetic field sensor and the distance between the first and the third magnetic field sensor may be less than ten times, preferably less than five times and more preferably less than two times the lateral dimension. In other words, the first, second and third magnetic field sensor may be in close vicinity to each other. This leads to even a better mutual cancellation of the stated causes of systematic offset.

In each of the first, second and third magnetic field sensor, the emitter structure is formed by a first portion emitter structure and a second portion emitter structure, wherein the first portion and the second portion emitter structure are arranged adjacent to each other, on opposite sides of the symmetry plane and so as to be substantially mirror images of one another. This arrangement of a dual emitter structure involves a better degree of symmetry, and accordingly a lower offset, as compared to the single emitter structure.

Each of the first, second and third magnetic field sensor may be implemented as a lateral magneto-resistor (LMR), in which the emitter structure and the first and the second collector structure are formed as $n^+$-type structures on and/or in the surface of an n-type well. In an LMR, the first, the second, the third and the fourth read-out circuitry may be one of a resistor read-out, a voltage read-out or a current read-out circuitry.

Alternatively, each of the first, second and third magnetic field sensor may be implemented as a lateral magneto-transistor (LMT), in which the emitter structure and the first and the second collector structure are formed as $n^+$-type structures on and/or in the surface of a p-type well. In an LMT, the first, the second, the third and the fourth read-out circuitry may be a current read-out circuitry.

Still alternatively, each of the first, second and third magnetic field sensor may be implemented as a lateral magneto-diode (LMD), in which one of the following configurations is implemented:

(1) the emitter structure is formed as an $n^+$-type structure and the first and the second collector structure are formed as $p^+$-type structures, all on and/or in the surface of an n-type well,
(2) the emitter structure is formed as a $p^+$-type structure and the first and the second collector structure are formed as $n^+$-type structures, all on and/or in the surface of an n-type well,
(3) the emitter structure is formed as an $n^+$-type structure and the first and the second collector structure are formed as $p^+$-type structures, all on and/or in the surface of a p-type well, or
(4) the emitter structure is formed as an $p^+$-type structure and the first and the second collector structure are formed as $n^+$-type structures, all on and/or in the surface of a p-type well.

In an LMD, the first, the second, the third and the fourth read-out circuitry may be one of a resistor read-out, a voltage read-out or a current read-out circuitry.

In an LMR and in an LMD, the first, the second and the third magnetic field sensor may externally connected to form a Wheatstone bridge type circuitry, in which a first and a second voltage divider is provided and is coupled between a, for example positive, supply voltage level and a common ground voltage level. The first voltage divider may comprise a structure comprising the first collector structure and the emitter structure of the second magnetic field sensor, and a structure comprising the first collector structure and the emitter structure of the first magnetic field sensor. The second voltage divider may comprise a structure comprising the second collector structure and the emitter structure of the third magnetic field sensor, and a structure comprising the second collector structure and the emitter structure of the first magnetic field sensor. Such a Wheatstone bridge type circuitry provides for an intrinsic compensation also of a potential resistor imbalance of the space between the first collector and the emitter and the space between the second collector and the emitter.

In the Wheatstone bridge type circuitry, in the first voltage divider, the first collector structure of the second magnetic field sensor may be coupled to the supply voltage level, the emitter structure of the second magnetic field sensor may be coupled to the first collector structure of the first magnetic field sensor and the emitter structure of the first magnetic field sensor may be coupled to the common ground voltage level. And in the second voltage divider, the second collector structure of the third magnetic field sensor may be coupled to the supply voltage level, the emitter structure of the third magnetic field sensor may be coupled to the second collector structure of the first magnetic field sensor. The sensor system may further comprise a differential voltage output terminal comprising a first and a second voltage output terminal, wherein the first voltage output terminal may be coupled to a first node in the connection between the emitter structure of the second magnetic field sensor and the first collector structure of the first magnetic field sensor, and the second voltage output terminal may be coupled to a second node in the connection between the emitter structure of the third magnetic field sensor and the second collector structure of the first magnetic field sensor. Such Wheatstone bridge type circuitry provides for an effective reduction of the systematic offset.

An even better reduction of offset is achieved, when the sensor system involving the Wheatstone bridge type circuitry further comprises a first 1-to-2 multiplexer and a second 1-to-2 multiplexer, provided for alternatively switching between connection states in the Wheatstone bridge.

The first 1-to-2 multiplexer may have a first and a second input terminal and a first to fourth output terminal, and may be adapted to be switchable into an "a" state and alternatively into a "b" state. In the "a" state, the first output terminal may be connected to the first input terminal and the third output terminal may be connected to the second input terminal, and in the "b" state, the second output terminal may be connected to the first input terminal and the fourth output terminal may be connected to the second input terminal. Further, the first input terminal may be coupled to the second input terminal and to the supply voltage level, the first output terminal may be connected to the second collector structure of the third magnetic field sensor, the second output terminal may be connected to the first collector structure of the third magnetic field sensor, the third output terminal may be connected to the first collector structure of the second magnetic field sensor, and the fourth output terminal may connected to the second collector structure of the second magnetic field sensor.

Furthermore, the second 1-to-2 multiplexer may have a first and a second input terminal and a first to fourth output terminal, and may adapted to be switchable into an "a" state and alternatively into a "b" state. In the "a" state, the second output terminal may be connected to the first input terminal and the fourth output terminal may be connected to the second input terminal, while in the "b" state, the first output terminal may be connected to the first input terminal and the third output terminal may be connected to the second input terminal. Further, the first input terminal may be coupled to the second emitter structure of the first magnetic field sensor and to the second voltage output terminal of the Wheatstone bridge type circuitry, the second input terminal may be coupled to the first emitter structure of the first magnetic field sensor and to the first voltage output terminal of the Wheatstone bridge type circuitry, the first output terminal may be connected with the fourth output terminal and coupled to the emitter structure of the second magnetic field sensor, and the second output terminal may be connected with the third output terminal and coupled to the emitter structure of the third magnetic field sensor.

Alternatively or in addition to the afore-mentioned measures, another reduction of offset is achieved, when the sensor system involving the Wheatstone bridge type circuitry may further comprise external switching circuitry adapted to cyclically switch the magnetic field sensor system from a first state to a second state, from the second state to a third state, from the third state to the first state, and so on. In the first state, the first magnetic field sensor may be operated double-sided via its first collector structure to its emitter structure and via its second collector structure to its emitter structure, the second magnetic field sensor may be operated single-sided via its first collector structure to its emitter structure, and the third magnetic field sensor may be operated single-sided via its second collector structure to its emitter structure. In the second state, the first magnetic field sensor of the first state has become the third magnetic field sensor, the second magnetic field sensor of the first state has become the first magnetic field sensor and the third magnetic field sensor of the first state has become the second magnetic field sensor. In the third state, the first magnetic field sensor of the first state has become the second magnetic field sensor, the second magnetic field sensor of the first state has become the third magnetic field sensor and the third magnetic field sensor of the first state has become the first magnetic field sensor. In summary, when going from the first state via the second state to the third state, the three magnetic field sensors changes its role, i.e. being one of the first to third magnetic field sensor of the sensor system, in a cyclical manner.

The offset compensation circuitry involving a Wheatstone bridge type circuitry can be used in connection with LMRs and LMDs, but not in connection with LMTs. Accordingly, a compensation circuitry is needed that can be used in connection with LMTs.

To enable a use in connection with LMTs, but also with LMRs and LMDs, the sensor system according to the first aspect of the invention may further comprise a chopped differential magnetic field sensor read-out circuitry, which comprises a switchable 1-to-2 multiplexer, a first differential amplifier, a switchable 2-to-1 multiplexer, a second differential amplifier, a third differential amplifier, and clock circuitry, and which is adapted to provide a sensor output signal.

The switchable 1-to-2 multiplexer has a first and second input terminal and a first to fourth output terminal and is adapted to be switchable into an "a"-state and alternatively into a "b"-state. The first and second input terminals are connected to a current source. The first output terminal is connected to the first collector structure of the second magnetic field sensor. The second output terminal is connected to the second collector structure of the second magnetic field sensor. The third output terminal is connected to the second collector structure of the third magnetic field sensor. And the fourth output terminal is connected to the first collector structure of the third magnetic field sensor. Further, in the "a"-state, the first input terminal is connected to the second output terminal and the second input terminal is connected to the fourth output terminal, while in the "b"-state, the first input terminal is connected to the first output terminal and the second input terminal is connected to the third output terminal.

The first differential amplifier has a "+"-type input terminal, a "−"-type input terminal and an output terminal, wherein the "+"-type input terminal may be coupled to one of the first and second collector structure of the first magnetic field sensor and the "−"-type input terminal may coupled to the other one of the first and second collector structure of the first magnetic field sensor. The switchable 2-to-1 multiplexer has a first to fourth input terminal and a first and a second output terminal and may be adapted to be switchable into an "a"-state and alternatively into a "b"-state. In the "a"-state, the first input terminal may be connected to the first output terminal and the third input terminal may be connected to the second output terminal, while in the "b"-state, the second input terminal may be connected to the first output terminal and the fourth input terminal may be connected to the second output terminal. The first input terminal may be coupled to the second collector structure of the second magnetic field sensor, the second input terminal may be coupled to the second collector structure of the third magnetic field sensor, the third input terminal may be coupled to the first collector structure of the third magnetic field sensor, and the fourth input terminal may be coupled to the first collector structure of the second magnetic field sensor. The clock circuitry may be adapted to switch the 2-to-1 multiplexer sequentially from its "a"-state to its "b"-state, from its "b"-state to its "a"-state, and so on.

The second differential amplifier has a "+"-type input terminal, a "−"-type input terminal and an output terminal, wherein the "−"-type input terminal may be coupled to first output terminal of the 2-to-1 multiplexer, and the "+"-type input terminal may be coupled to second output terminal of the 2-to-1 multiplexer. The third differential amplifier has a "+"-type input terminal, a "−"-type input terminal and an output terminal, wherein the "+"-type input terminal may be coupled to output terminal of the first differential amplifier, the "−"-type input terminal may be coupled to output terminal of the second differential amplifier, and the output terminal may provide the sensor output signal.

As concerns the second aspect of the invention, the two-dimensional magnetic field sensor array arrangement may further comprise external connection circuitry and clock circuitry defining clock cycles starting at time instances t, t+Δt, t+2Δt, and so on, such that each triplet configuration of magnetic field sensors is sequentially stepped within the array arrangement according one of the following positional schemes:

(1) position at time instance t: (i, j),
    position at time instance t+Δt: (i+1, j) or (i−1, j), and
    position at time instance t+2Δt: (i+2, j) or (i−2, j);

(2) position at time instance t: (i, j),
    position at time instance t+Δt: (i, j+1) or (i, j−1), and
    position at time instance t+2Δt: (i, j+2) or (i, j−2);

(3) position at time instance t: (i, j),
    position at time instance t+Δt: (i+1, j+1) or (i−1, j−1), and
    position at time instance t+2Δt: (i+2, j+2) or (i−2, j−2); and (4) position at time instance t: (i, j),
    position at time instance t+Δt: (i+1, j−1) or (i−1, j+1), and
    position at time instance t+2Δt: (i+2, j−2) or (i−2, j+2);

The stated sequential positions (i, j) refer to the position in the array arrangement of the first magnetic field sensor of the triplet configuration, while the second and the third magnetic field sensor of the triplet configuration are located at respective fixed relative positions with respect to the first magnetic field sensor.

Further embodiments are described in the following and will become apparent for those skilled in the art upon examination of the following detailed description and the appended drawings.

SHORT DESCRIPTION OF THE DRAWINGS

Various aspects, features and advantages of different embodiments of the invention will become apparent from the following specifications, the appended drawings and the appended claims.

FIG. 1b shows a schematic top view of the magnetic field sensor of FIG. 1a.

FIG. 2b shows a schematic top view of the magnetic field sensor of FIG. 2a.

FIG. 5a shows a schematic top view of the differential lateral magnetic field sensor system of FIG. 4a.

Figure 9:
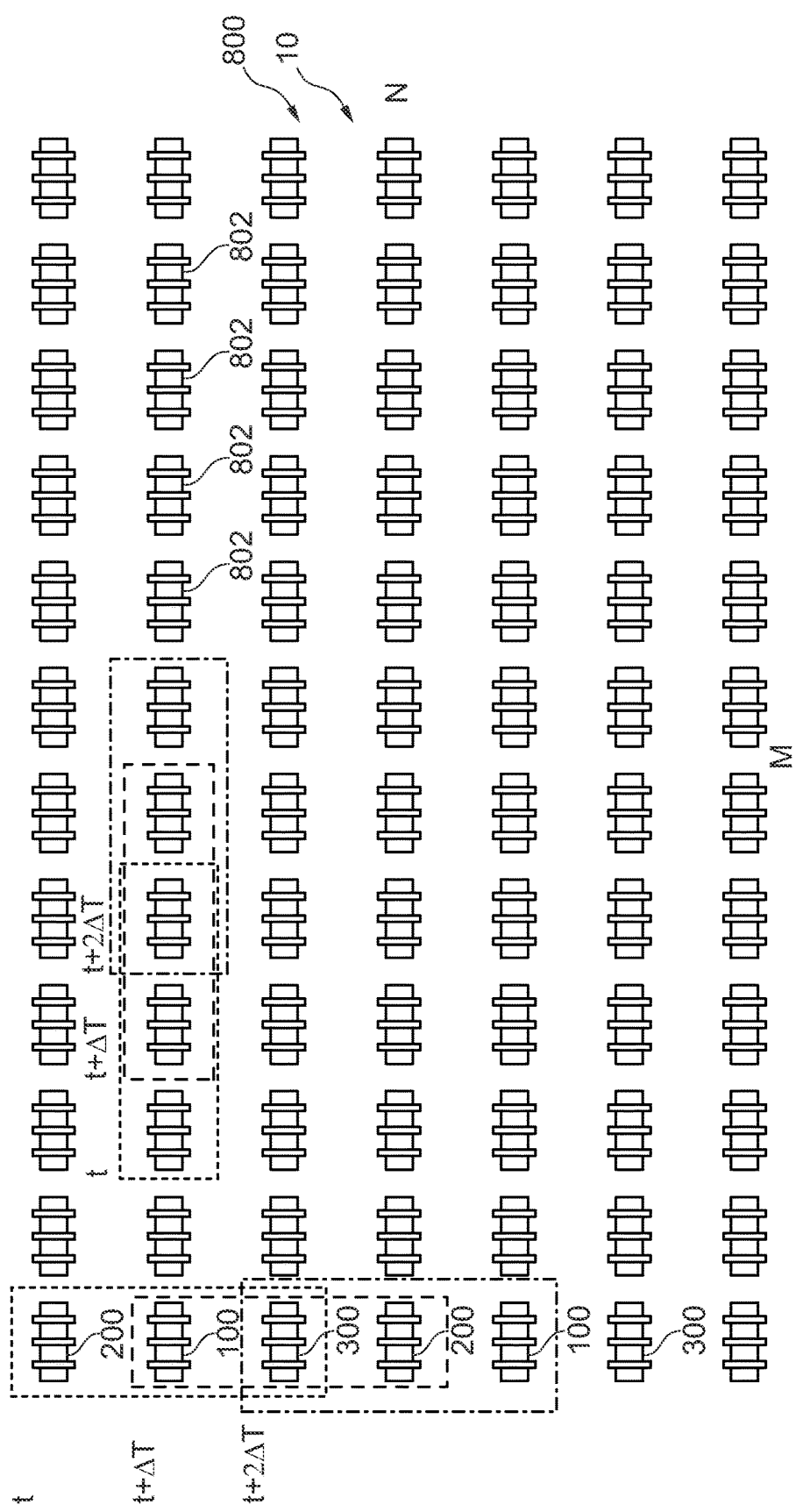

FIG. 9 shows a schematic top view of a two-dimensional array arrangement of differential lateral magnetic field sensors according to the invention, adapted to be switchable in multiple configurations of magnetic field sensor systems according to the invention, each formed by a triplet configuration of magnetic field sensors, wherein the triplet configuration can be moved stepwise within the array arrangement.

Figure 10:
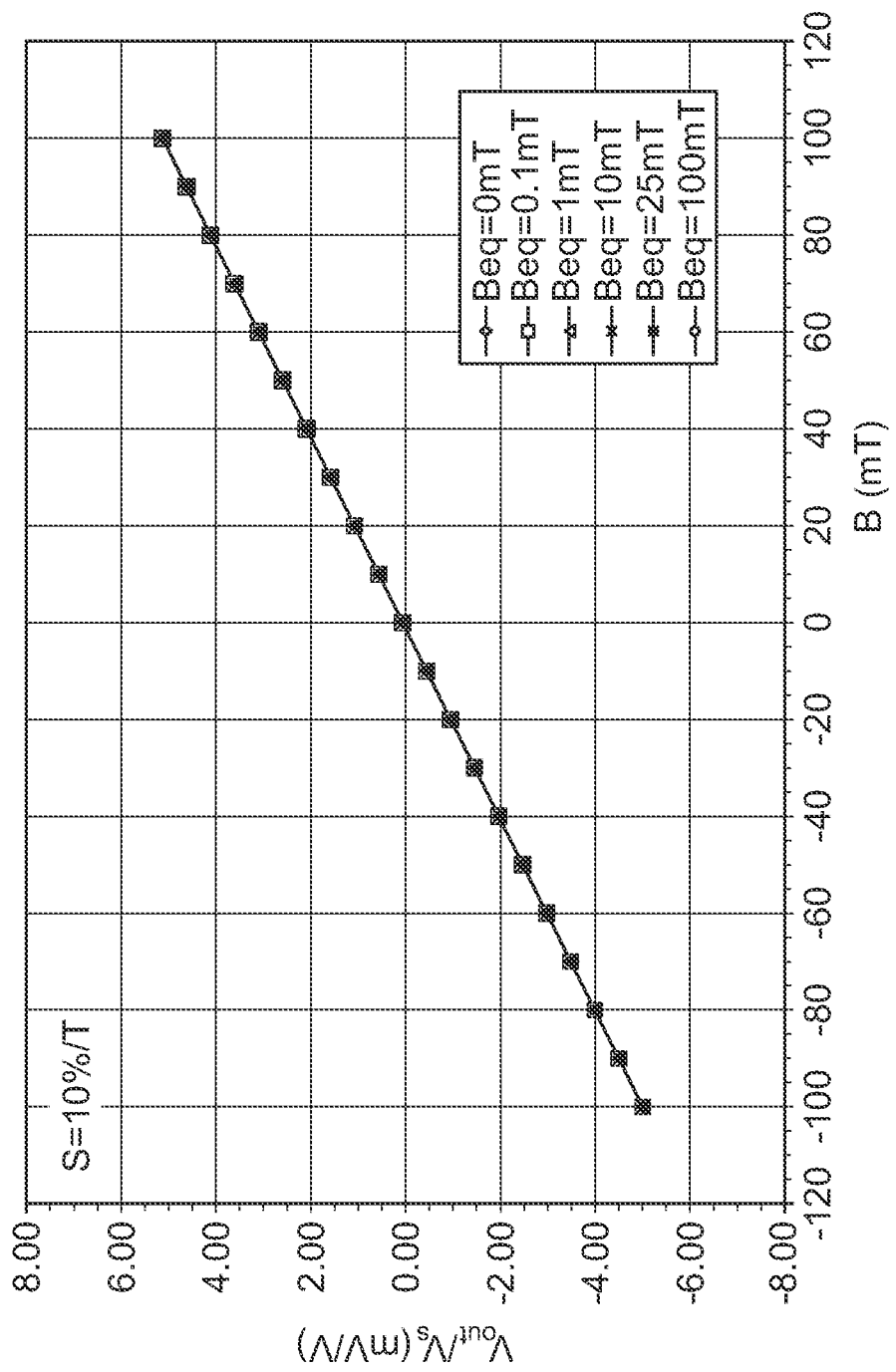

FIG. 10 shows a schematic diagram showing calculated relative voltage outputs $V_{out}/V_s$ of a Wheatstone bridge type offset compensation circuitry of one of FIG. 4a or 5a and FIG. 4b or 5b as a function of the applied lateral magnetic flux density B, exhibiting offset compensation.

Figure 11A:
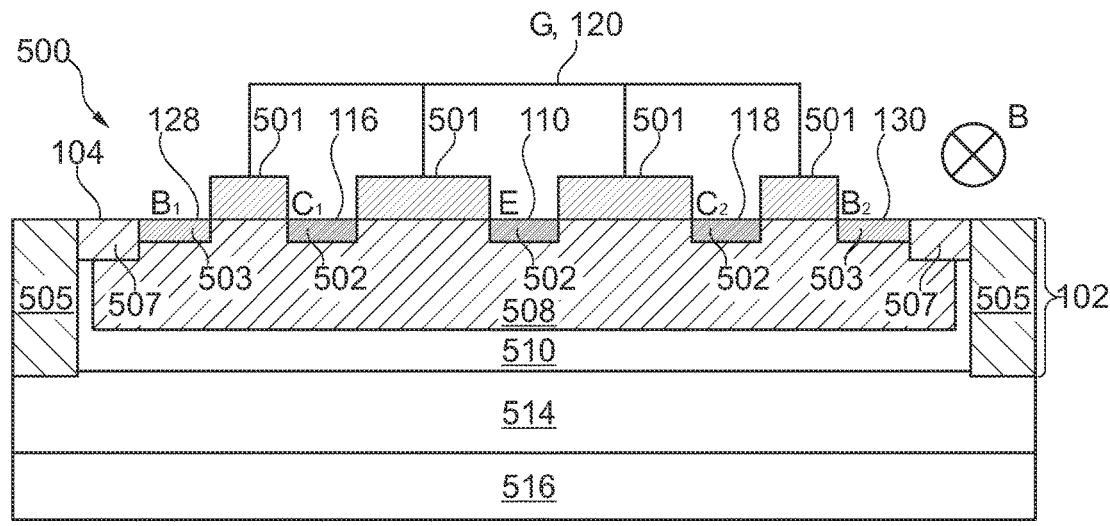

FIG. 11a shows a schematic cross section of a first embodiment of a differential lateral magnetic field sensor implemented in the form of a lateral magneto transistor for use in a differential magnetic field sensor system achieving offset cancelling by providing multiple instances of the magnetic field sensor according to the invention.

Figure 11B:
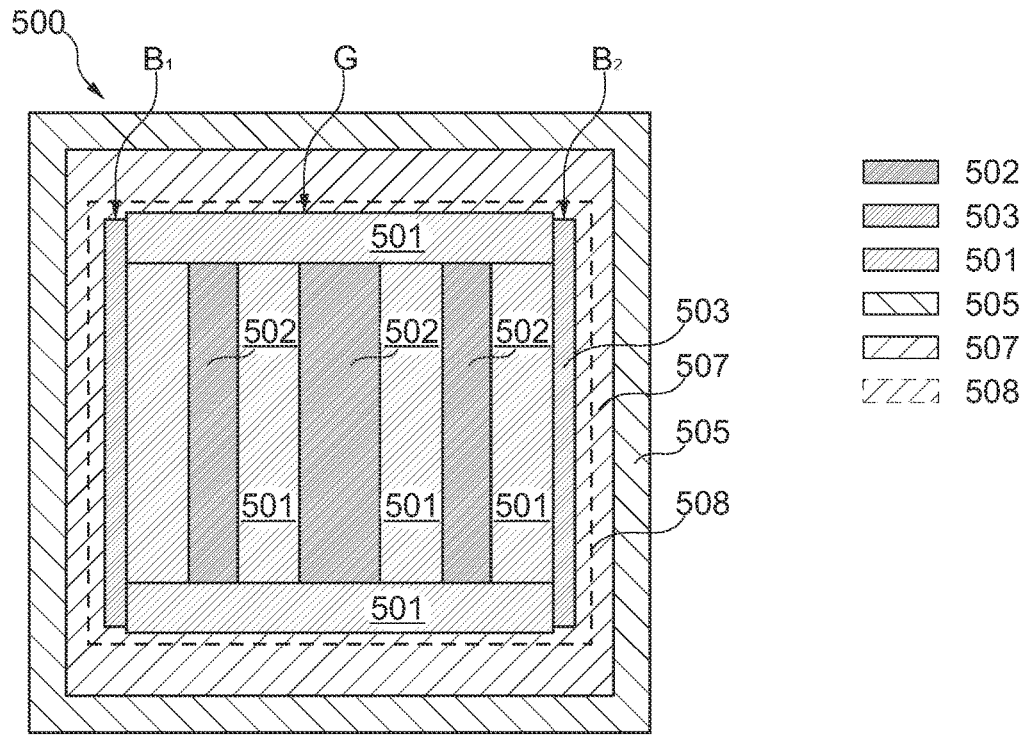

FIG. 11b shows a schematic top view of the magnetic field sensor of FIG. 11a.

Figure 12A:
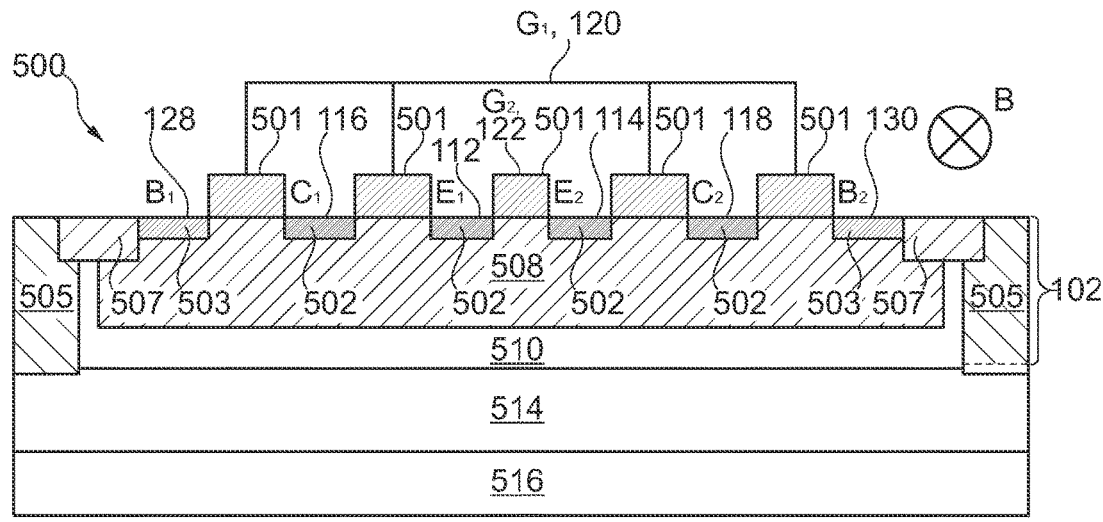

FIG. 12a shows a schematic cross section of a second embodiment of a differential lateral magnetic field sensor implemented in the form of a lateral magneto transistor for use in a differential magnetic field sensor system achieving offset cancelling by providing multiple instances of the magnetic field sensor according to the invention.

Figure 12B:
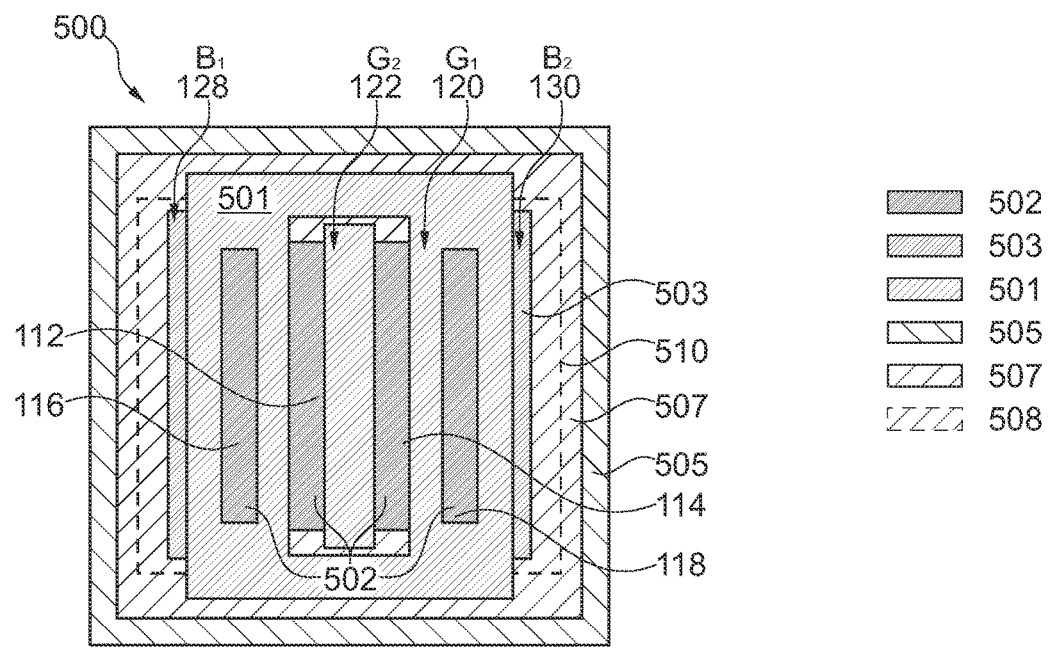

FIG. 12b shows a schematic top view of the magnetic field sensor of FIG. 12a.

Figure 13A:
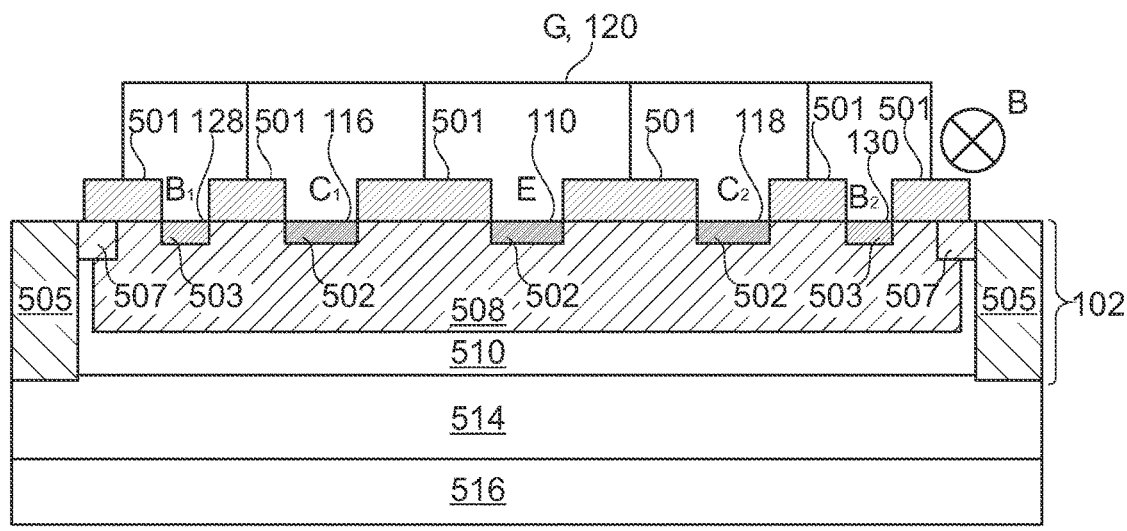

FIG. 13a shows a schematic cross section of a third embodiment of a differential lateral magnetic field sensor implemented in the form of a lateral magneto transistor for use in a differential magnetic field sensor system achieving offset cancelling by providing multiple instances of the magnetic field sensor according to the invention.

Figure 13B:
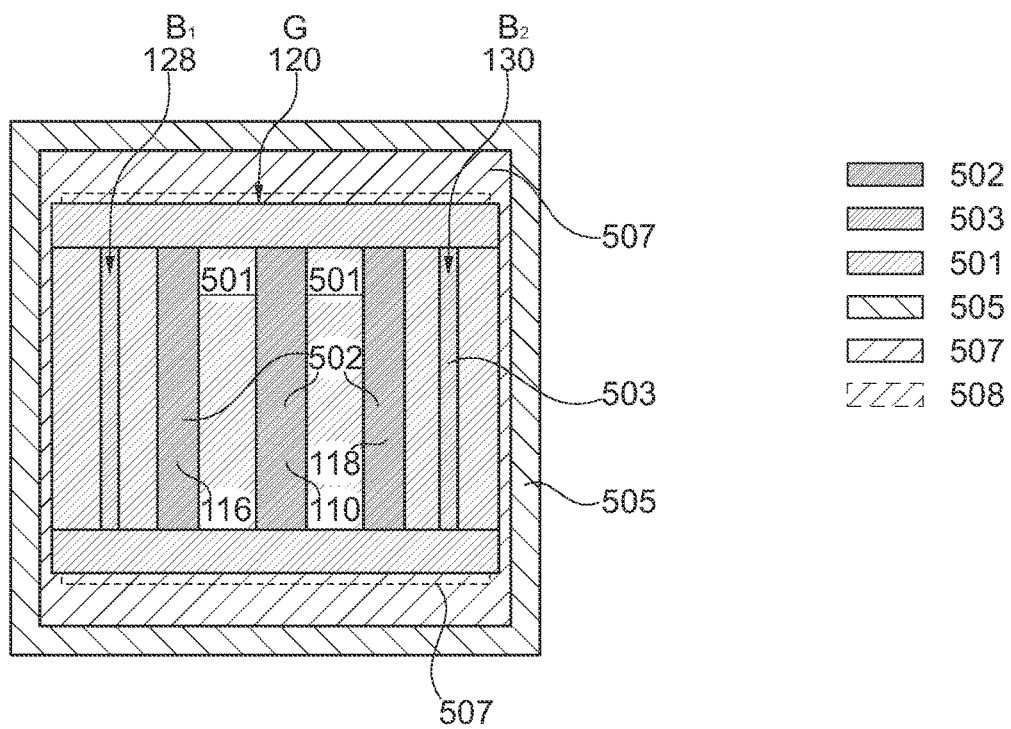

FIG. 13b shows a schematic top view of the magnetic field sensor of FIG. 13a.

Figure 14A:
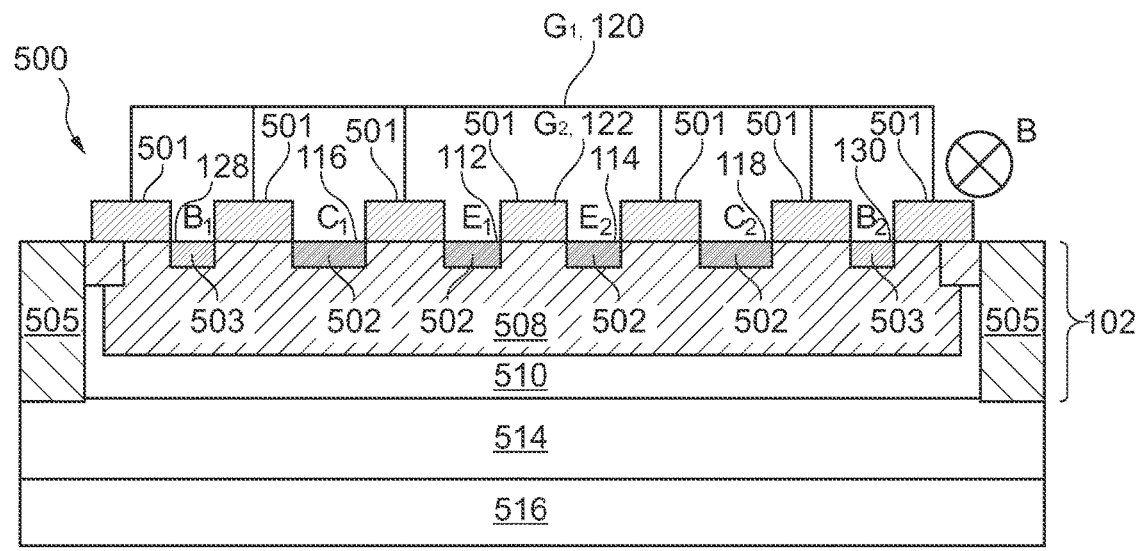

FIG. 14a shows a schematic cross section of a fourth embodiment of a differential lateral magnetic field sensor implemented in the form of a lateral magneto transistor for use in a differential magnetic field sensor system achieving offset cancelling by providing multiple instances of the magnetic field sensor according to the invention.

Figure 14B:
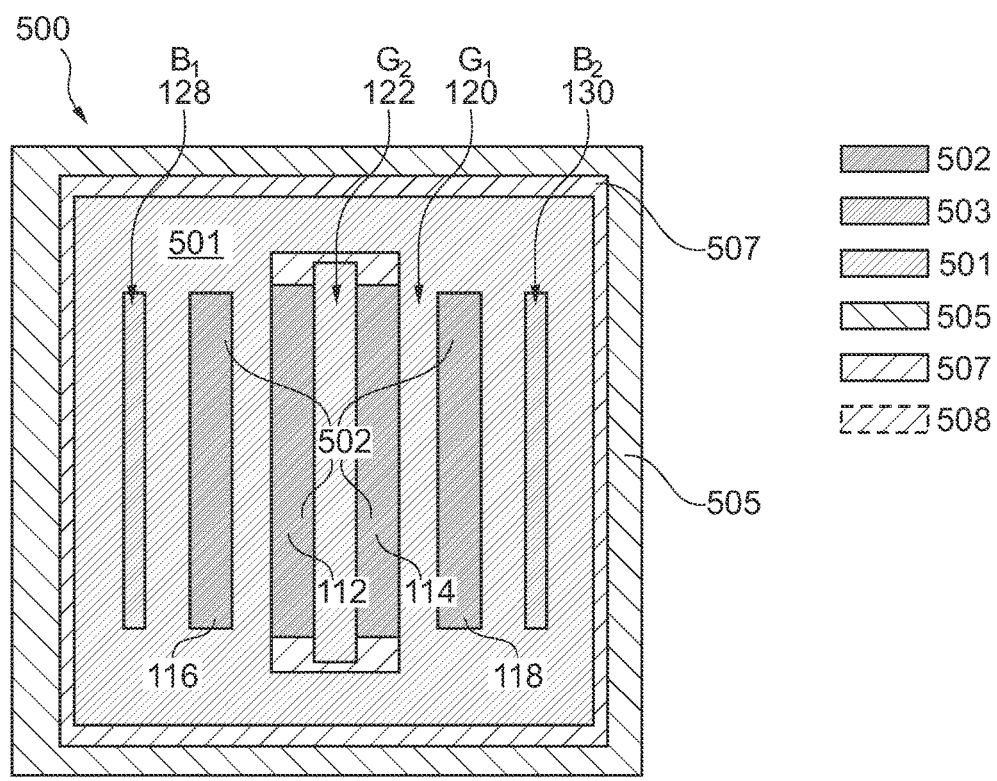

FIG. 14b shows a schematic top view of the magnetic field sensor of FIG. 14a.

Figure 15A:
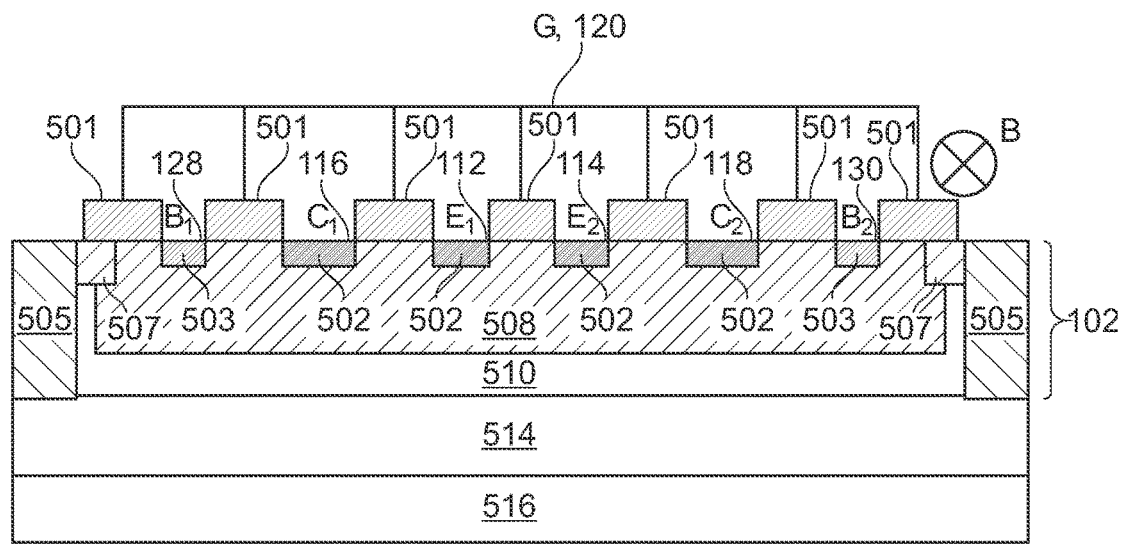

FIG. 15a shows a schematic cross section of a fifth embodiment of a differential lateral magnetic field sensor implemented in the form of a lateral magneto transistor for use in a differential magnetic field sensor system achieving offset cancelling by providing multiple instances of the magnetic field sensor according to the invention.

Figure 15B:
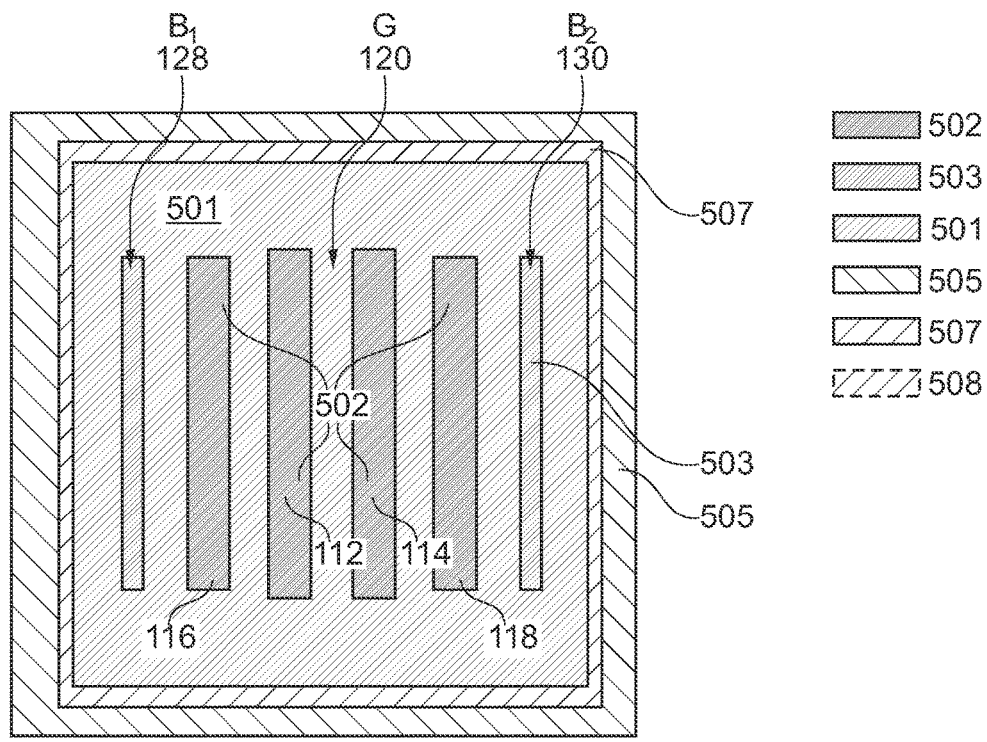

FIG. 15b shows a schematic top view of the magnetic field sensor of FIG. 15a.

Figure 16A:
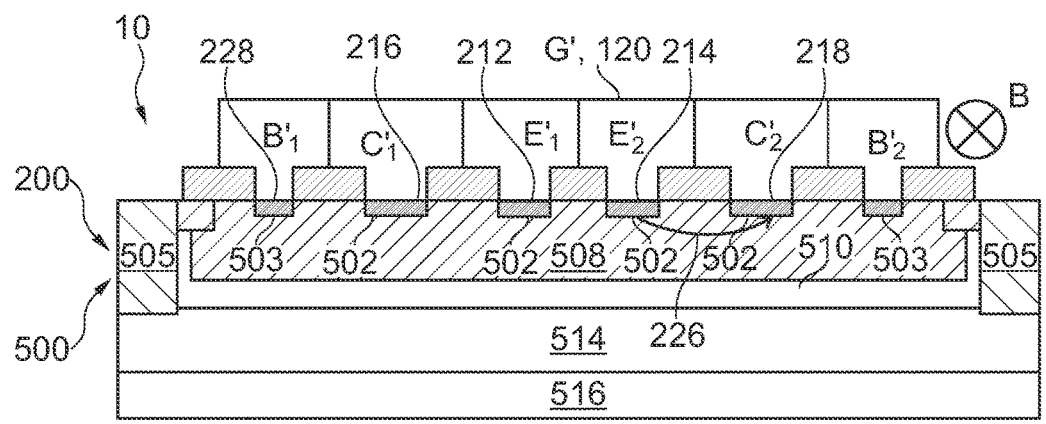
Figure 16A:
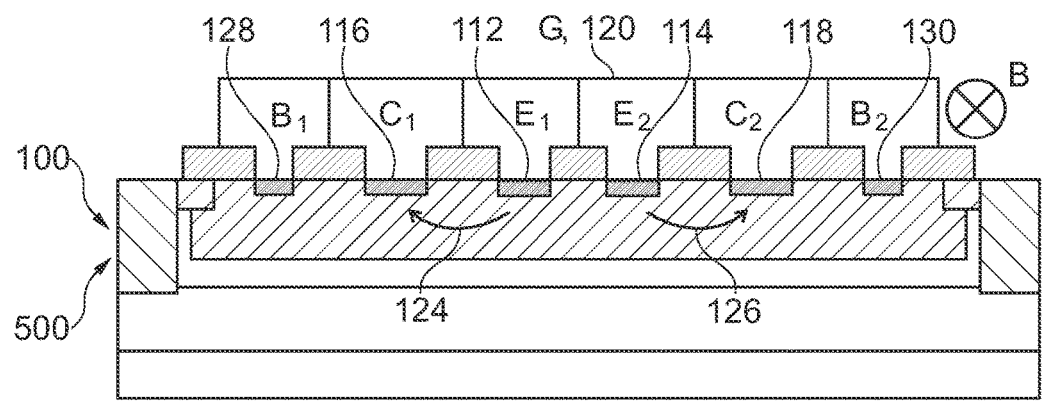
Figure 16A:
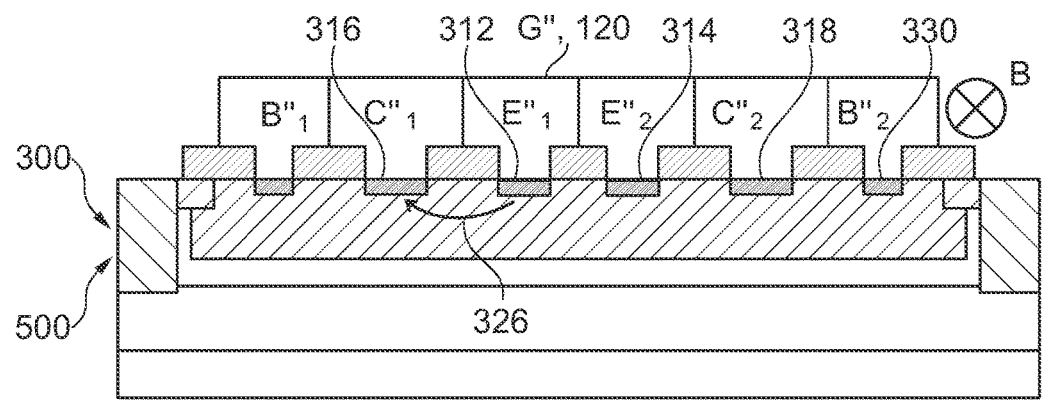

FIG. 16a shows a first embodiment of a differential lateral magnetic field sensor system according to the invention, formed by three instances of an embodiment of the lateral magneto transistor of FIGS. 15a and 15b, each of which is shown in a cross sectional view.

Figure 16B:
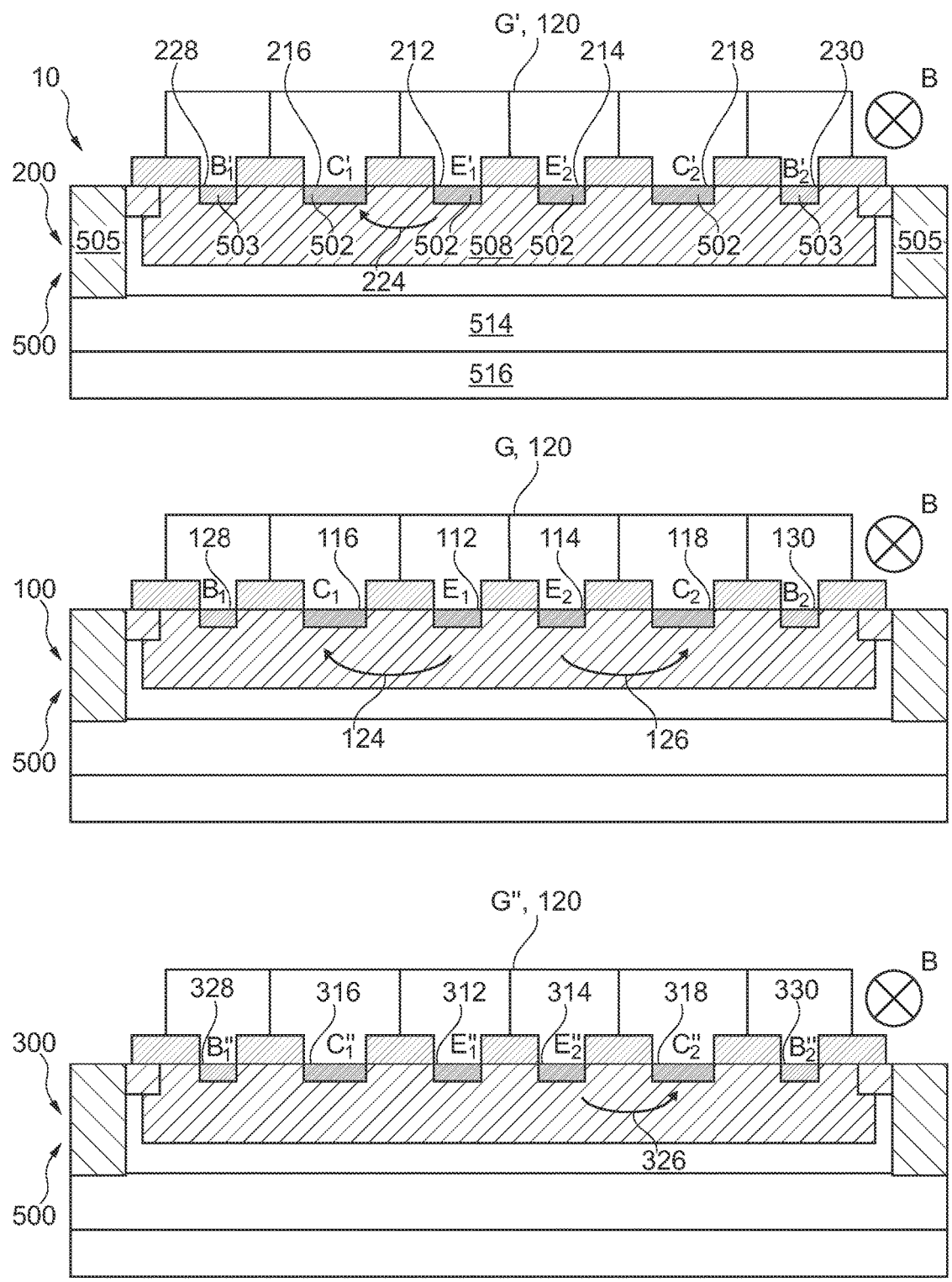

FIG. 16b shows a second embodiment of a differential lateral magnetic field sensor system according to the invention, formed by three instances of an embodiment of the lateral magneto transistor of FIGS. 15a and 15b, each of which is shown in a cross sectional view.

Figure 17:
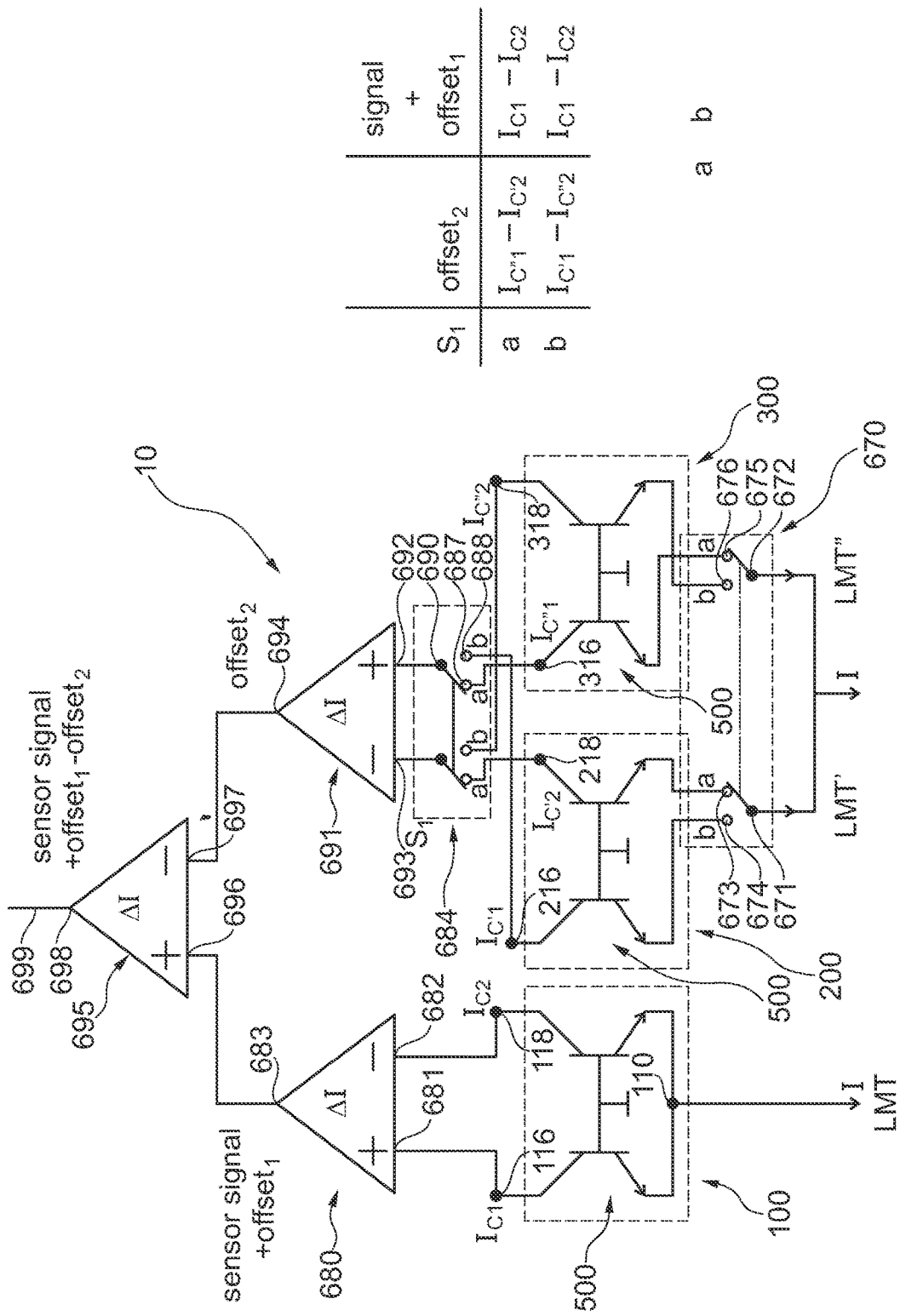

FIG. 17 shows a schematic circuit diagram of an embodiment of a differential lateral magnetic field sensor system according to the invention, implemented in the form of a chopped offset compensation differential read-out circuitry involving three instances of a lateral magneto transistor of FIGS. 11a and 11b.

Figure 18A:
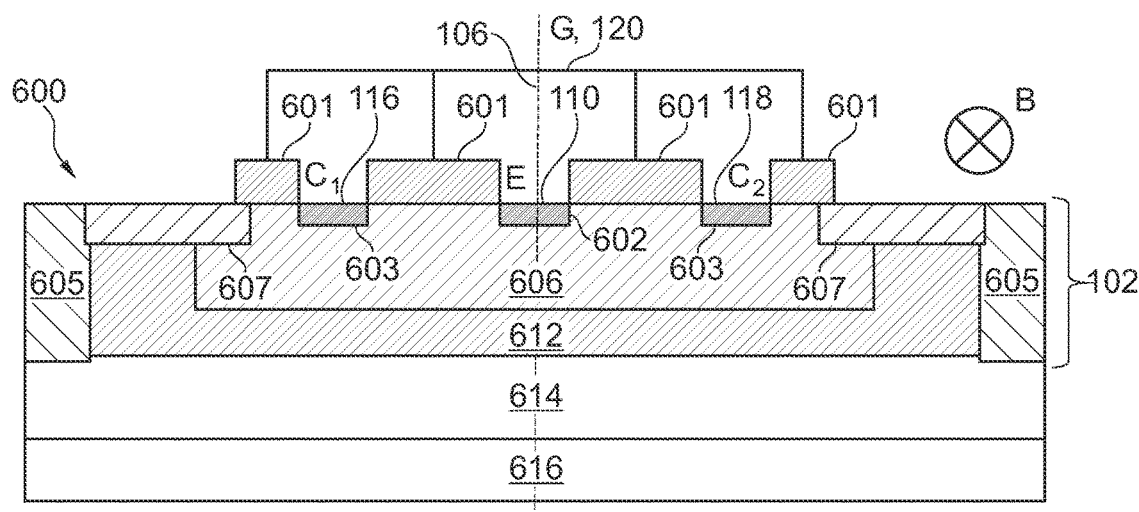

FIG. 18a shows a schematic cross section of a first embodiment of a differential lateral magnetic field sensor implemented in the form of a lateral magneto diode for use in a differential magnetic field sensor system achieving offset cancelling by providing multiple instances of the magnetic field sensor according to the invention.

Figure 18B:
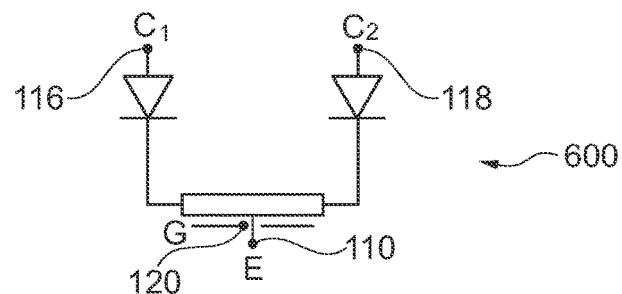

FIG. 18b shows a schematic circuit diagram of the magnetic field sensor of FIG. 18a.

Figure 18C:
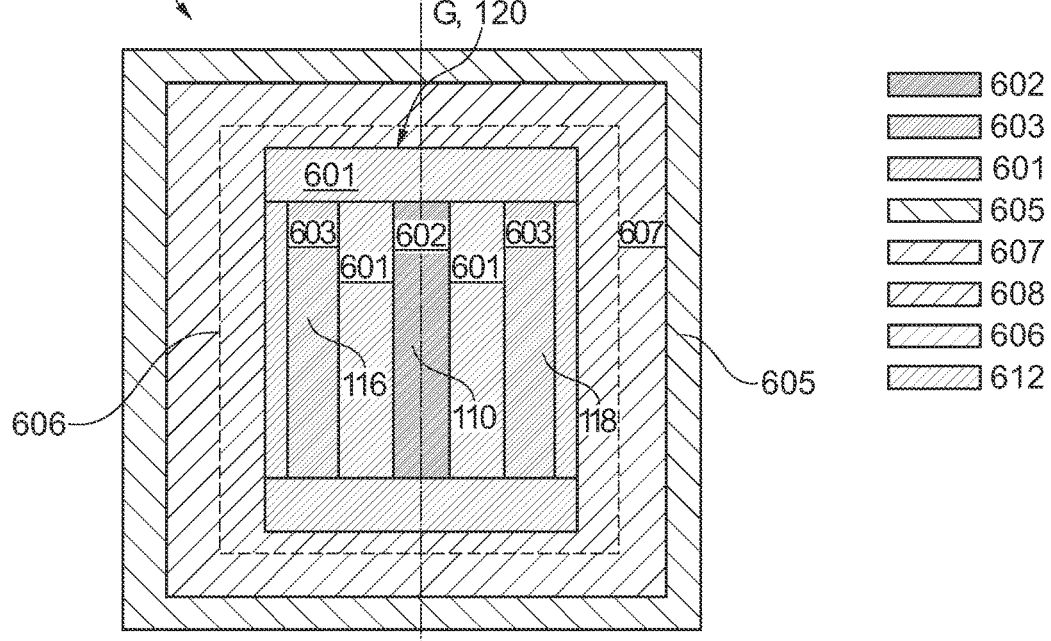

FIG. 18c shows a schematic top view of the magnetic field sensor of FIG. 18a.

Figure 19A:
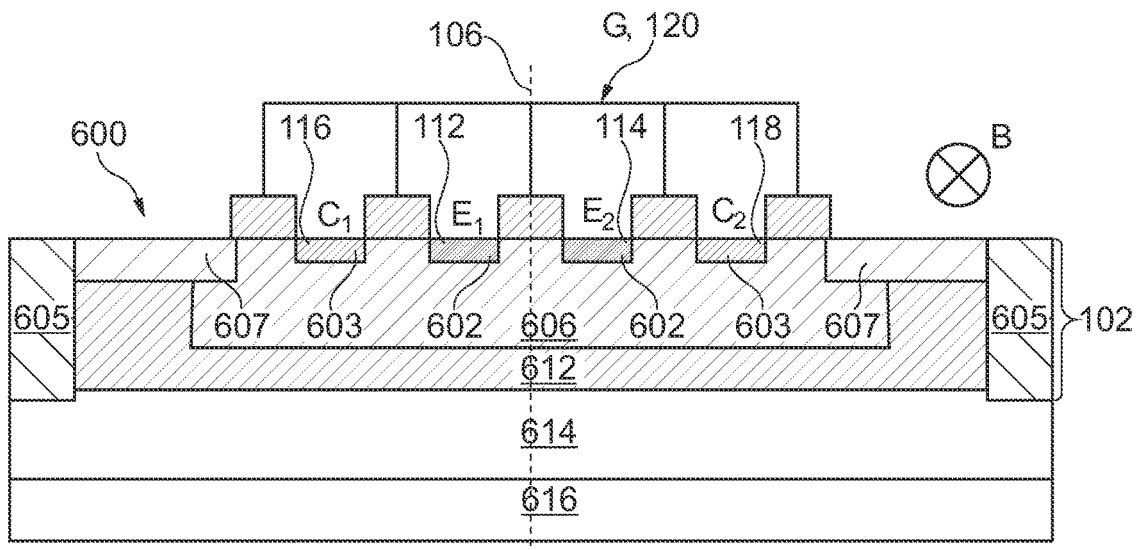

FIG. 19a shows a schematic cross section of a second embodiment of a differential lateral magnetic field sensor implemented in the form of a lateral magneto diode for use in a differential magnetic field sensor system achieving offset cancelling by providing multiple instances of the magnetic field sensor according to the invention.

Figure 19B:
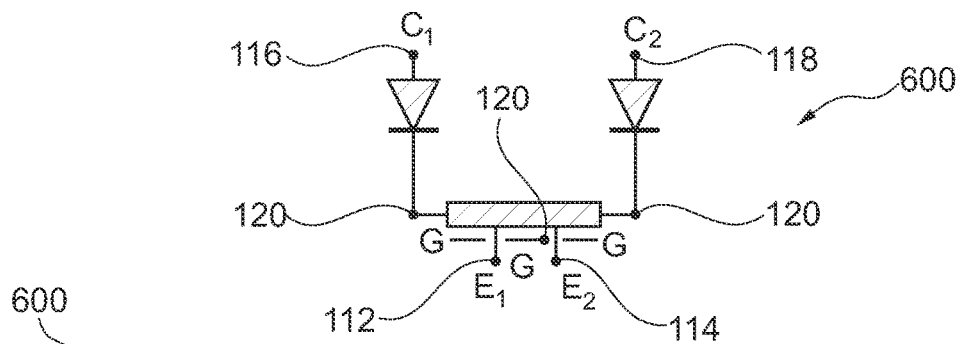

FIG. 19b shows a schematic circuit diagram of the magnetic field sensor of FIG. 19a.

Figure 19C:
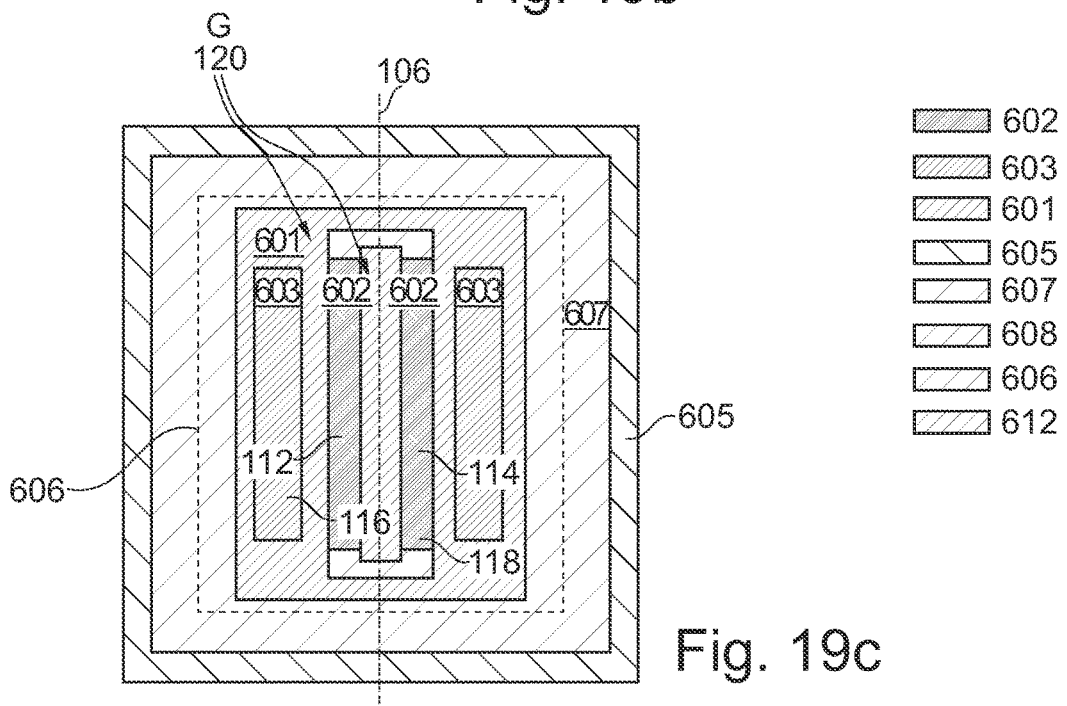

FIG. 19c shows a schematic top view of the magnetic field sensor of FIG. 19a.

Figure 20A:
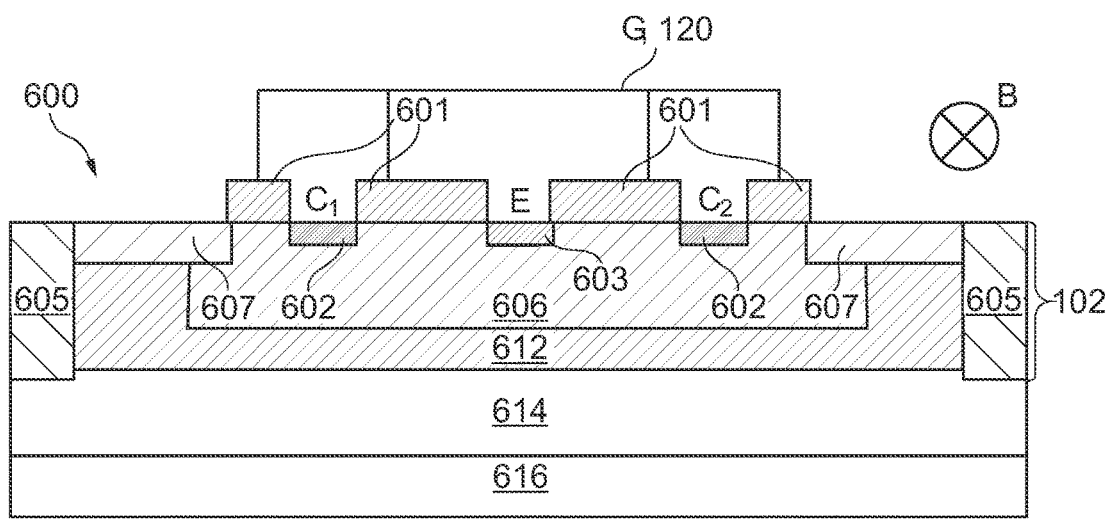

FIG. 20a shows a schematic cross section of a third embodiment of a differential lateral magnetic field sensor implemented in the form of a lateral magneto diode for use in a differential magnetic field sensor system achieving offset cancelling by providing multiple instances of the magnetic field sensor according to the invention.

Figure 20B:
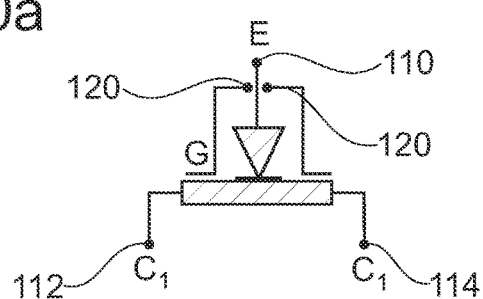

FIG. 20b shows a schematic circuit diagram of the magnetic field sensor of FIG. 20a.

Figure 20C:
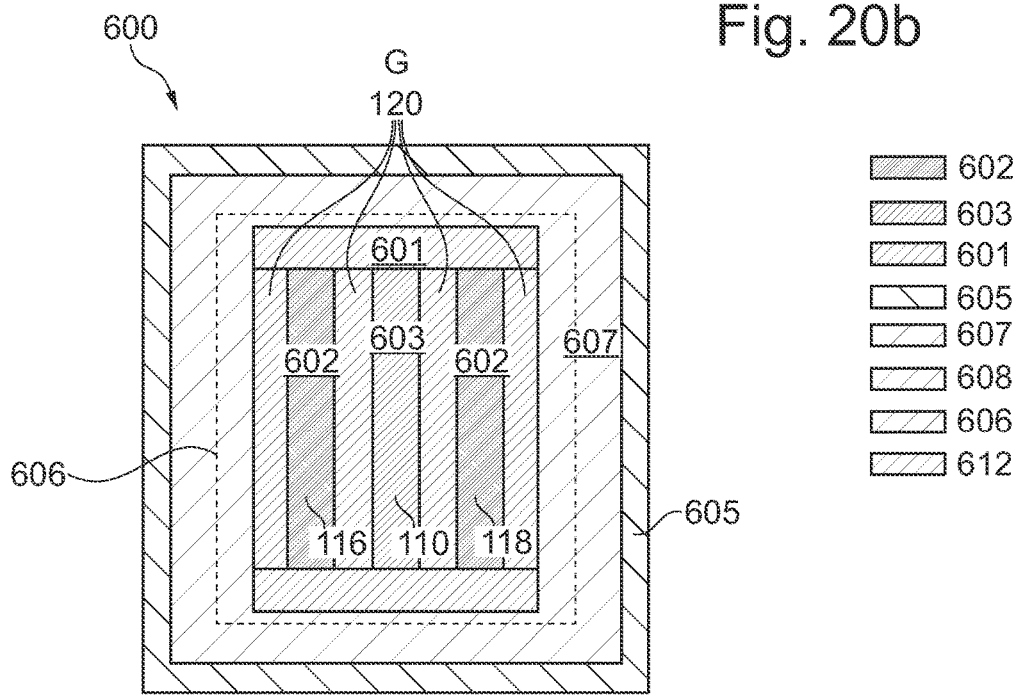

FIG. 20c shows a schematic top view of the magnetic field sensor of FIG. 20a.

Figure 21A:
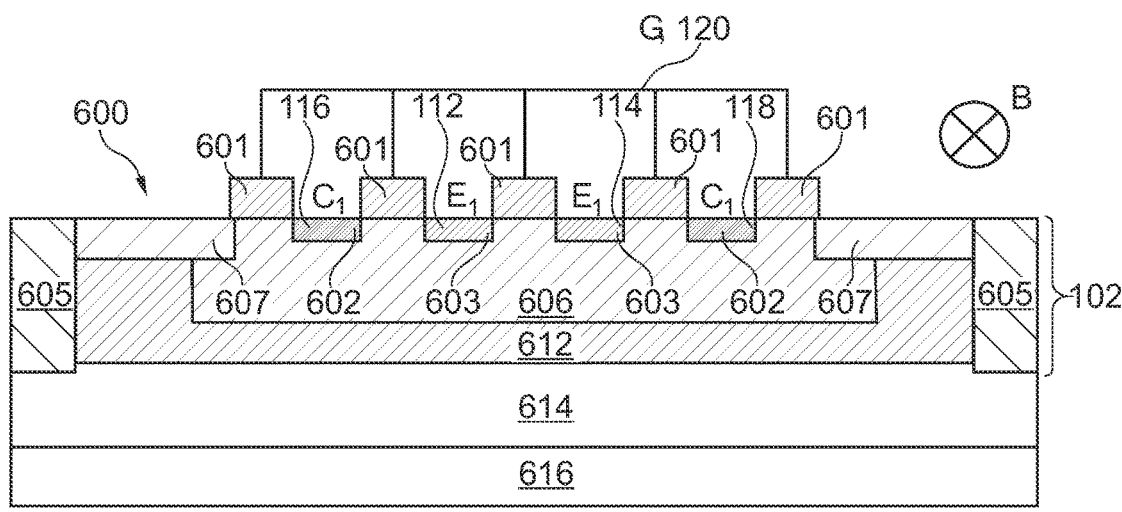

FIG. 21a shows a schematic cross section of a fourth embodiment of a differential lateral magnetic field sensor implemented in the form of a lateral magneto diode for use in a differential magnetic field sensor system achieving offset cancelling by providing multiple instances of the magnetic field sensor according to the invention.

Figure 21B:
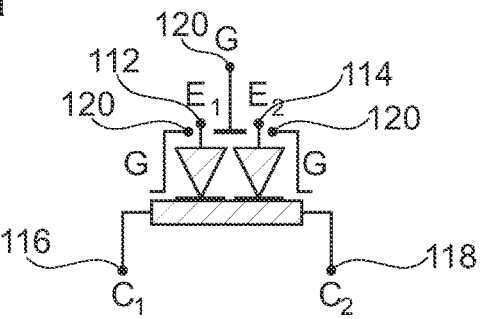

FIG. 21b shows a schematic circuit diagram of the magnetic field sensor of FIG. 21a.

Figure 21C:
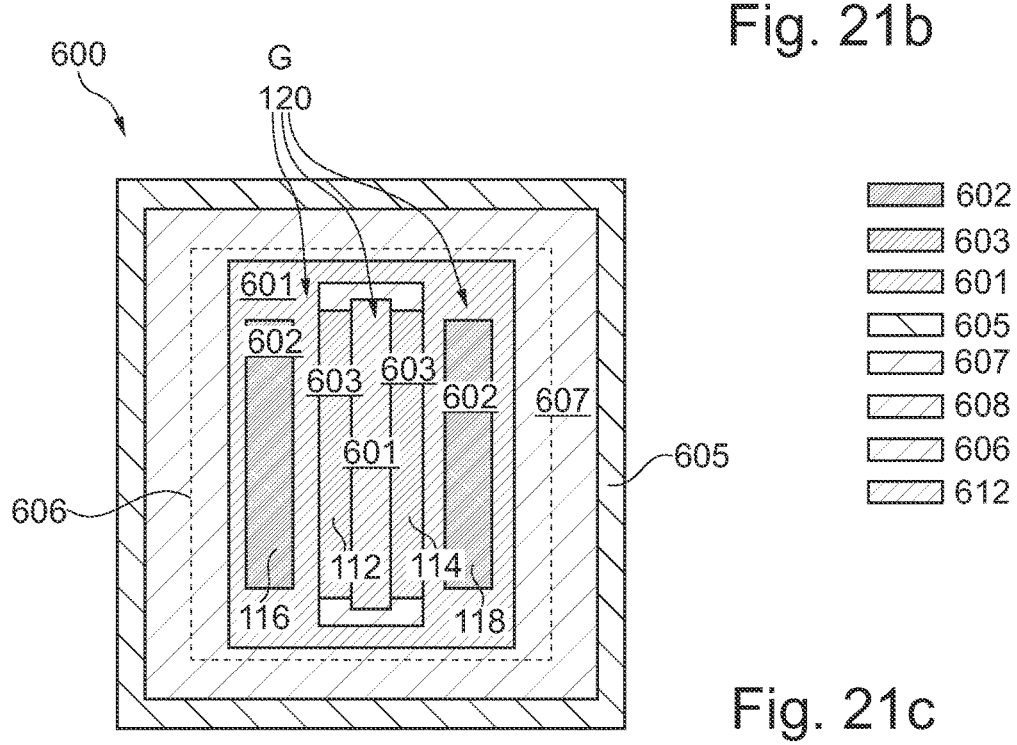

FIG. 21c shows a schematic top view of the magnetic field sensor of FIG. 21a.

Figure 22A:
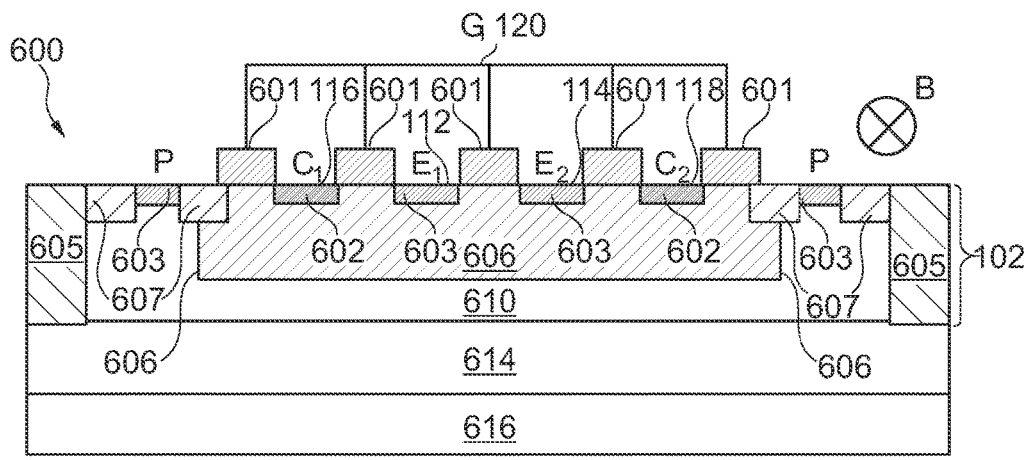

FIG. 22a shows a schematic cross section of a fifth embodiment of a differential lateral magnetic field sensor implemented in the form of a lateral magneto diode for use in a differential magnetic field sensor system achieving offset cancelling by providing multiple instances of the magnetic field sensor according to the invention.

Figure 22B:
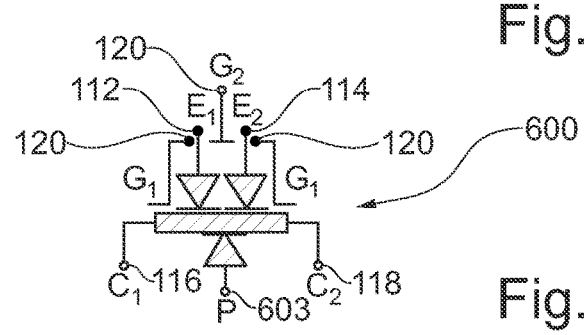

FIG. 22b shows a schematic circuit diagram of the magnetic field sensor of FIG. 22a.

Figure 22C:
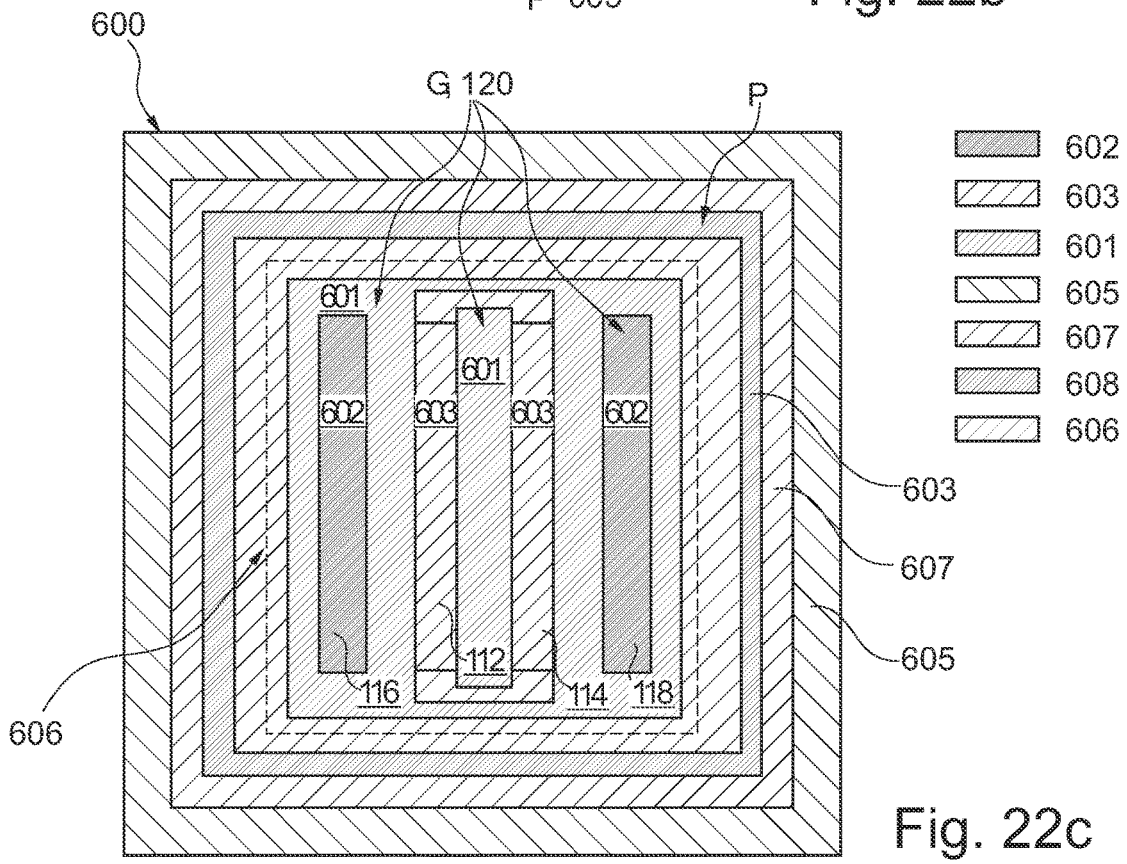

FIG. 22c shows a schematic top view of the magnetic field sensor of FIG. 22a.

Figure 23A:
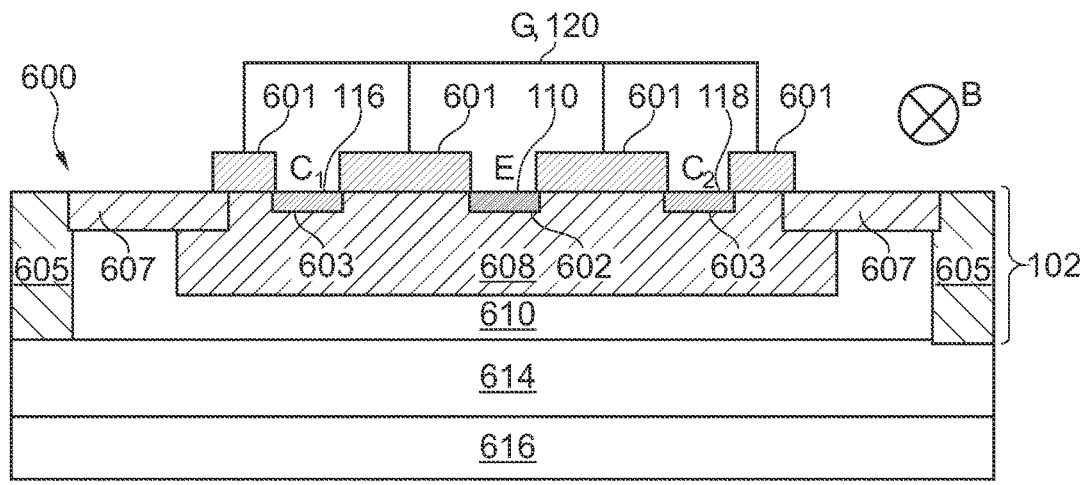

FIG. 23a shows a schematic cross section of a sixth embodiment of a differential lateral magnetic field sensor implemented in the form of a lateral magneto diode for use in a differential magnetic field sensor system achieving offset cancelling by providing multiple instances of the magnetic field sensor according to the invention.

Figure 23B:
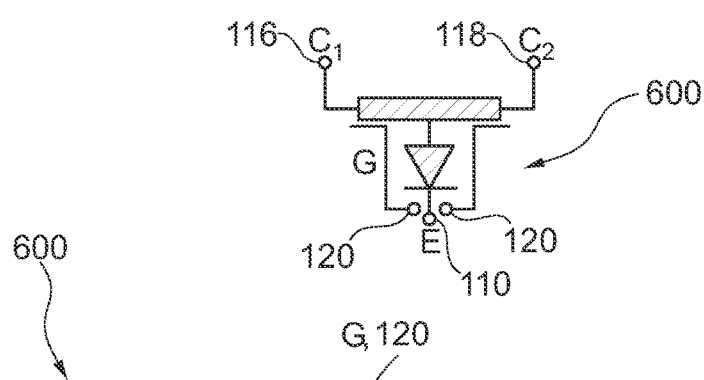

FIG. 23b shows a schematic circuit diagram of the magnetic field sensor of FIG. 23a.

Figure 23C:
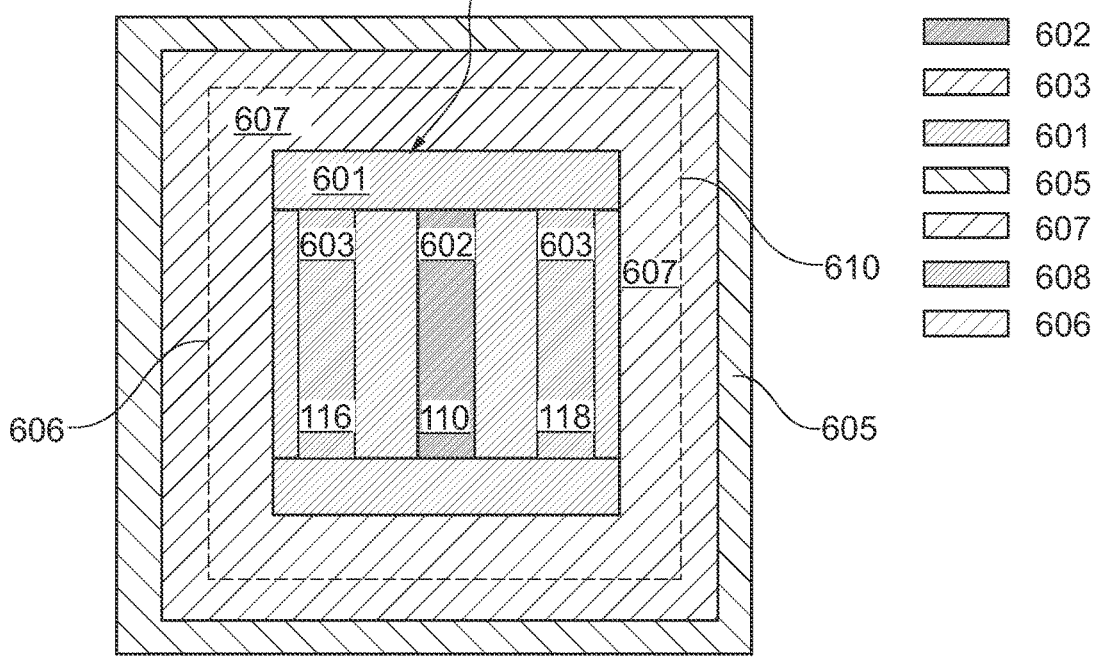

FIG. 23c shows a schematic top view of the magnetic field sensor of FIG. 23a.

Figure 24A:
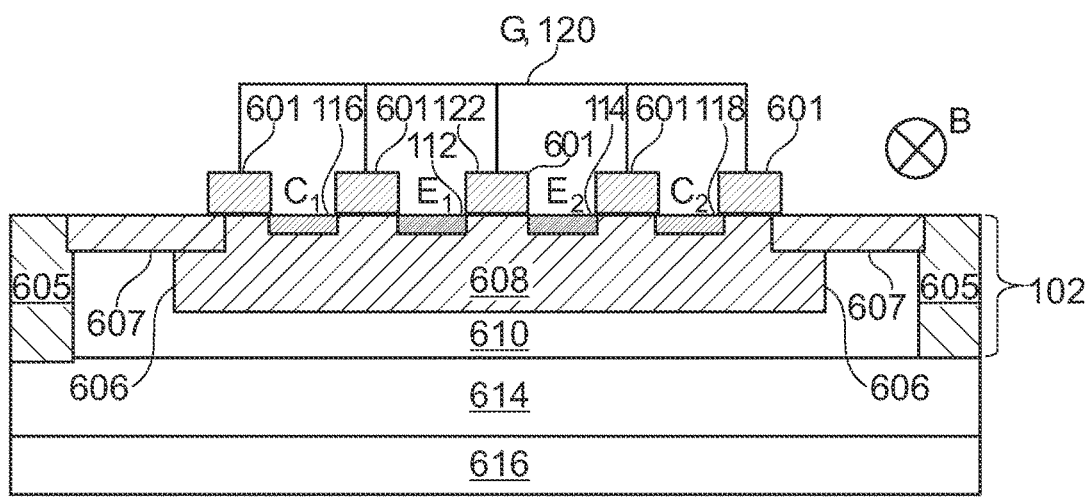

FIG. 24a shows a schematic cross section of a seventh embodiment of a differential lateral magnetic field sensor implemented in the form of a lateral magneto diode for use in a differential magnetic field sensor system achieving offset cancelling by providing multiple instances of the magnetic field sensor according to the invention.

Figure 24B:
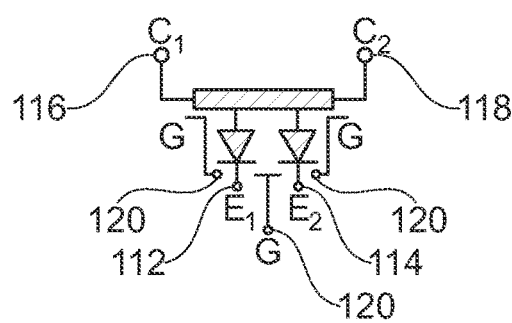

FIG. 24b shows a schematic circuit diagram of the magnetic field sensor of FIG. 24a.

Figure 24C:
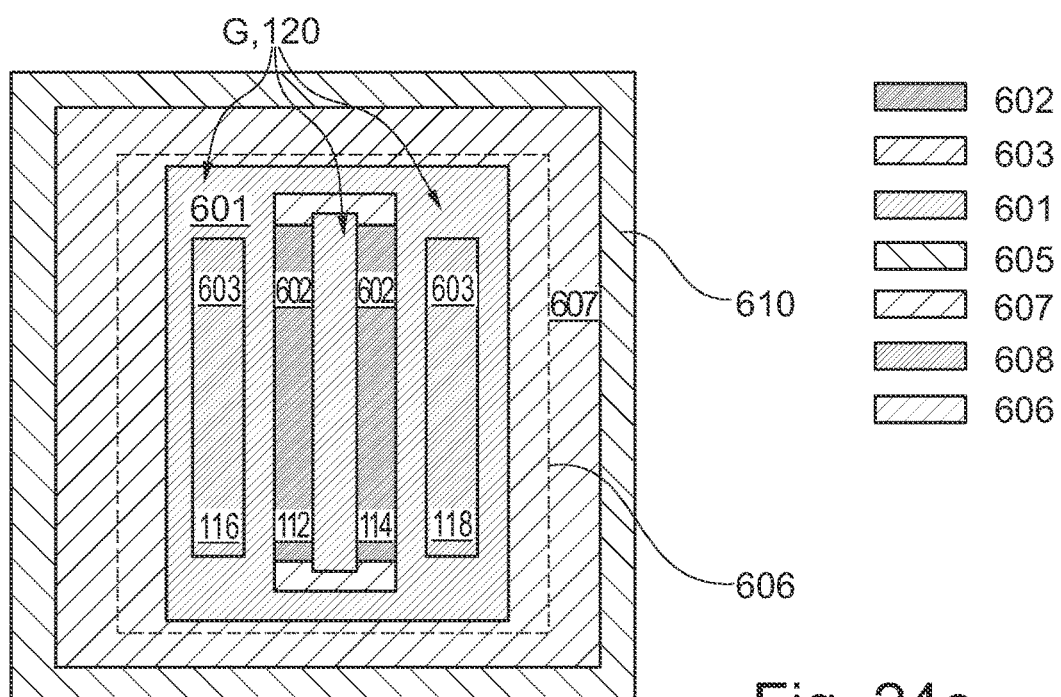

FIG. 24c shows a schematic top view of the magnetic field sensor of FIG. 24a.

Figure 25A:
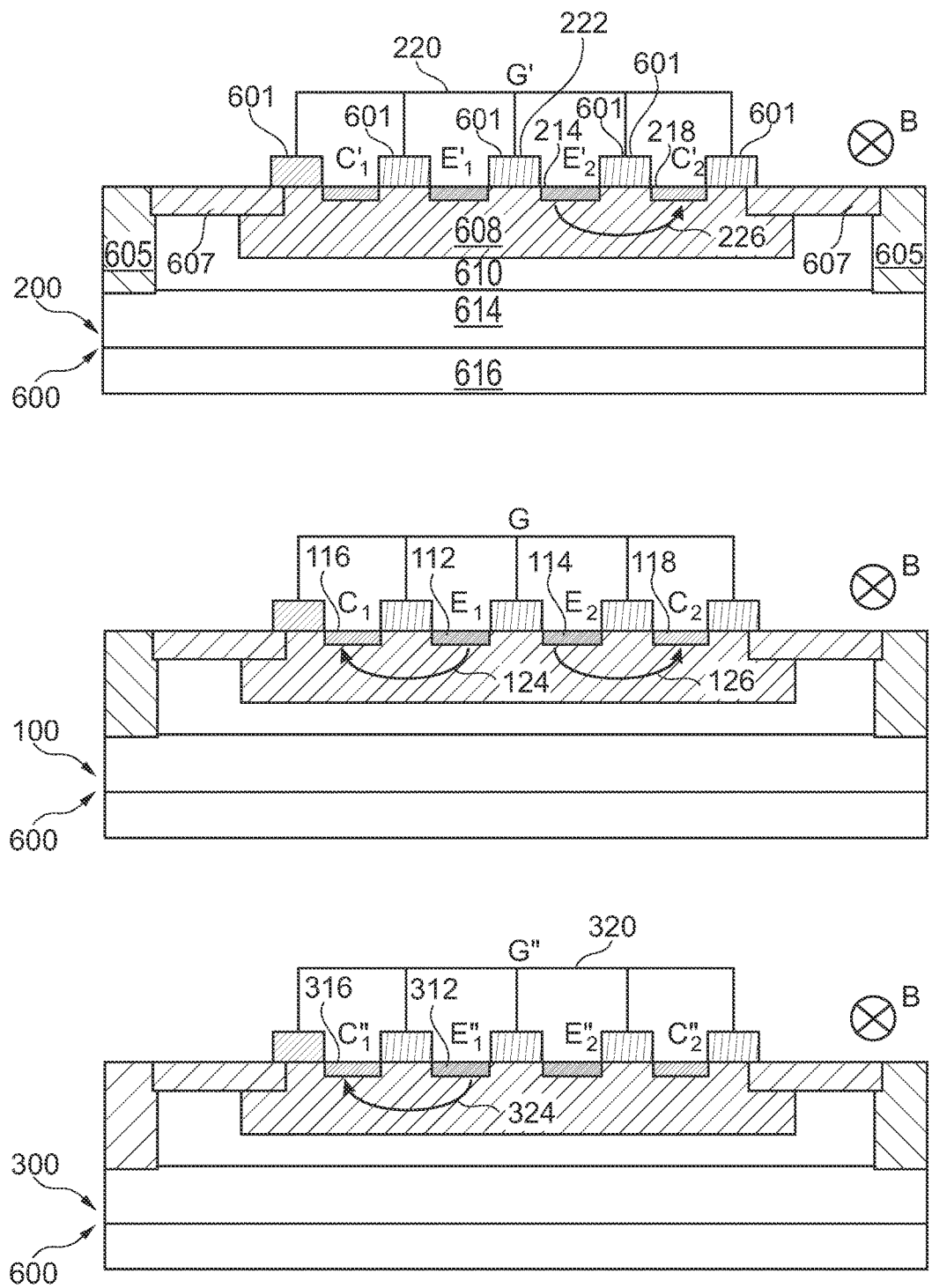

FIG. 25a shows a first embodiment of a differential lateral magnetic field sensor system according to the invention, formed by three instances of an embodiment of the lateral magneto diode of FIGS. 24a to 24c, each of which is shown in a cross sectional view.

Figure 25B:
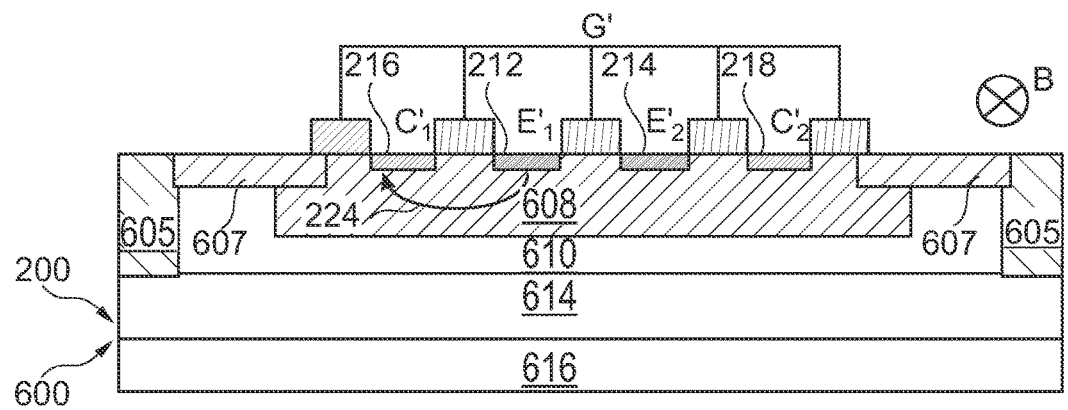
Figure 25B:
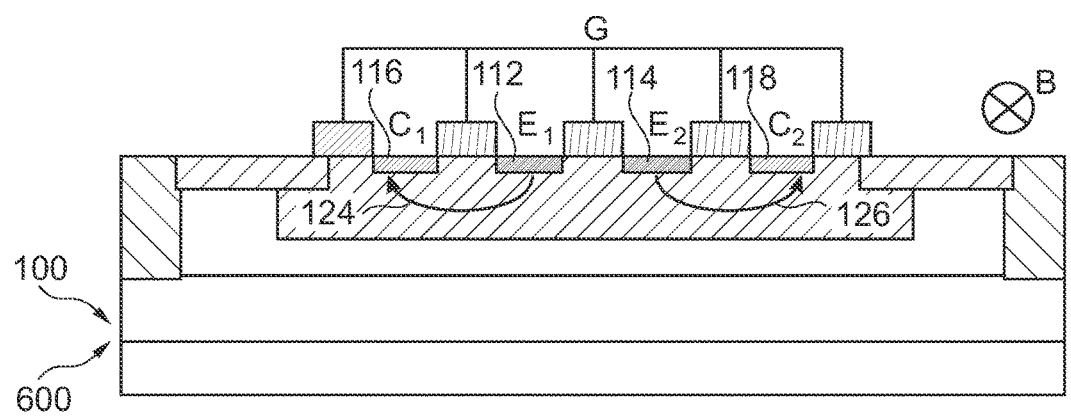
Figure 25B:
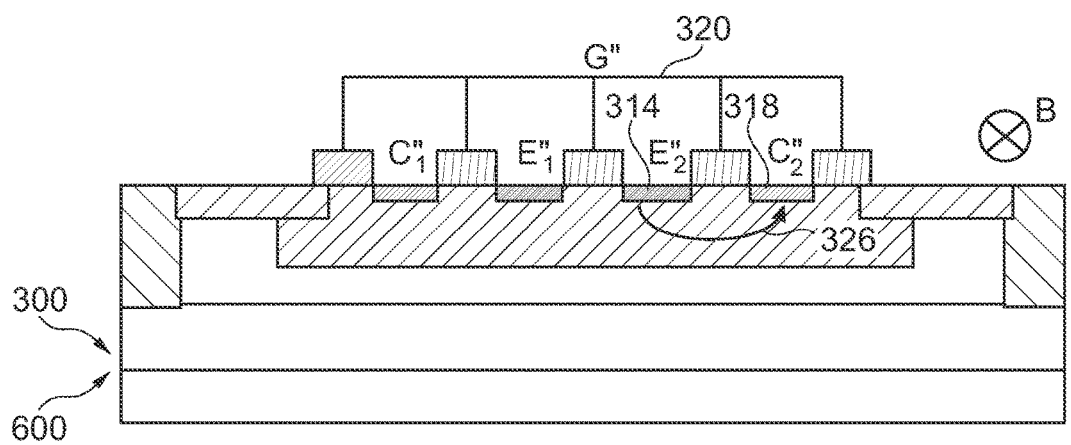

FIG. 25b shows a second embodiment of a differential lateral magnetic field sensor system according to the invention, formed by three instances of an embodiment of the lateral magneto diode of FIGS. 24a to 24c, each of which is shown in a cross sectional view.

Figure 26:
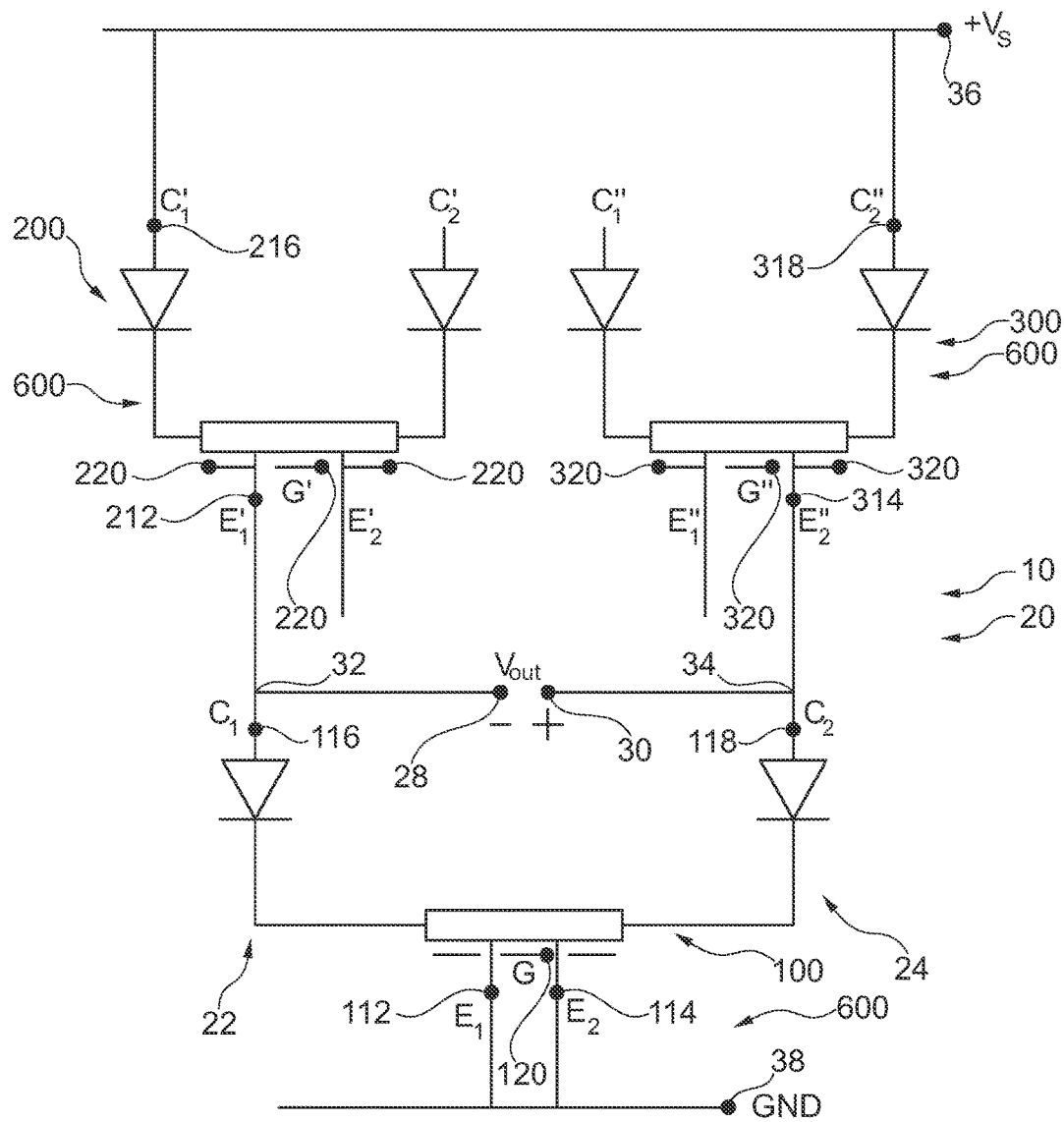

FIG. 26 shows a schematic circuit diagram of an embodiment of a differential lateral magnetic field sensor system according to the invention, implemented in the form of a Wheatstone bridge type offset compensation circuitry using three instances of the embodiment of a lateral magneto diode of FIGS. 19a to 19c.

Figure 27:
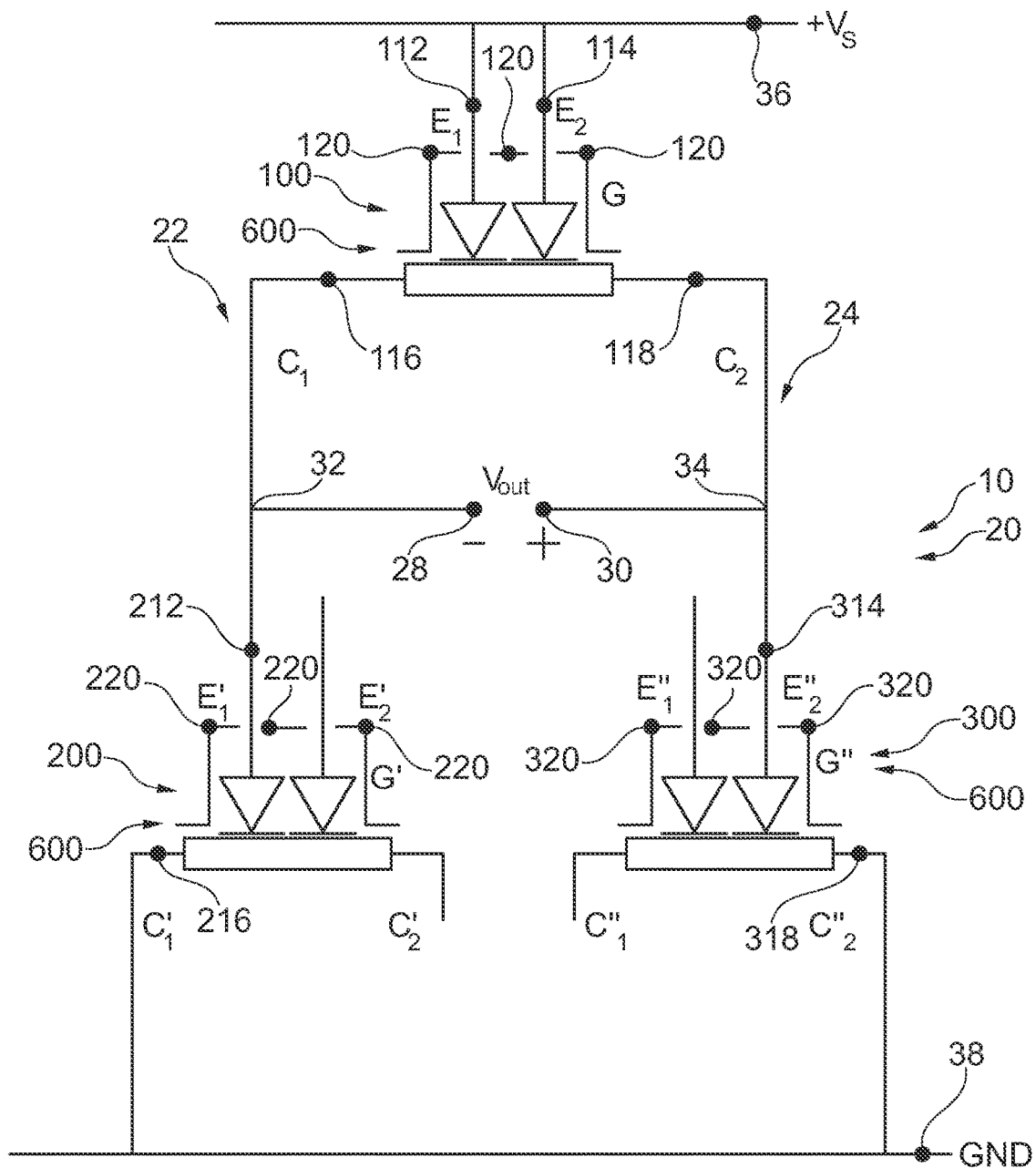

FIG. 27 shows a schematic circuit diagram of another embodiment of a differential lateral magnetic field sensor system according to the invention, implemented in the form of a Wheatstone bridge type offset compensation circuitry using three instances of the embodiment of a lateral magneto diode of FIGS. 21a to 21c.

Figure 28:
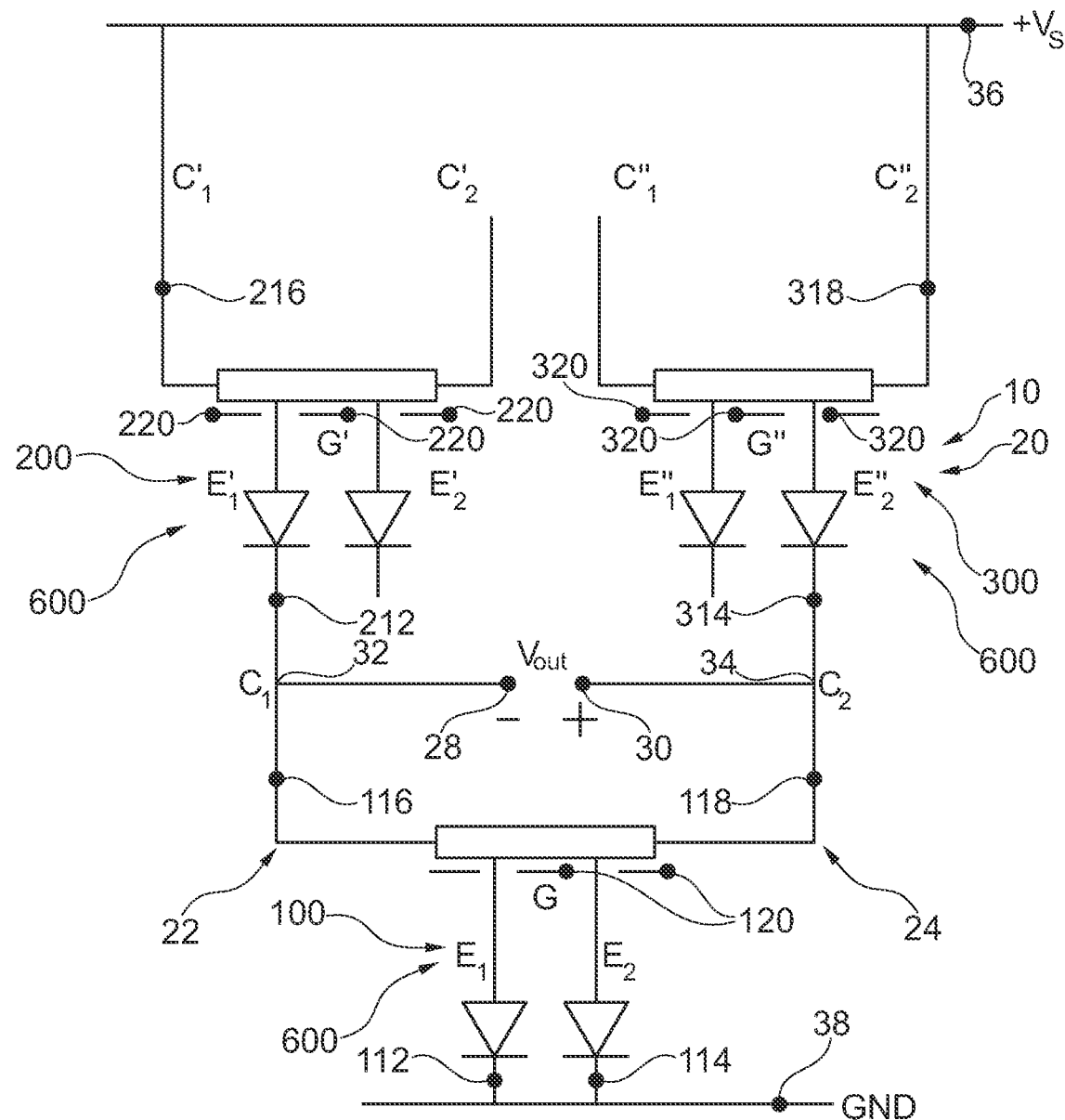

FIG. 28 shows a schematic circuit diagram of still another embodiment of a differential lateral magnetic field sensor system according to the invention, implemented in the form of a Wheatstone bridge type offset compensation circuitry using three instances of the embodiment of a lateral magneto diode of FIGS. 24a to 24c.

Figure 29:
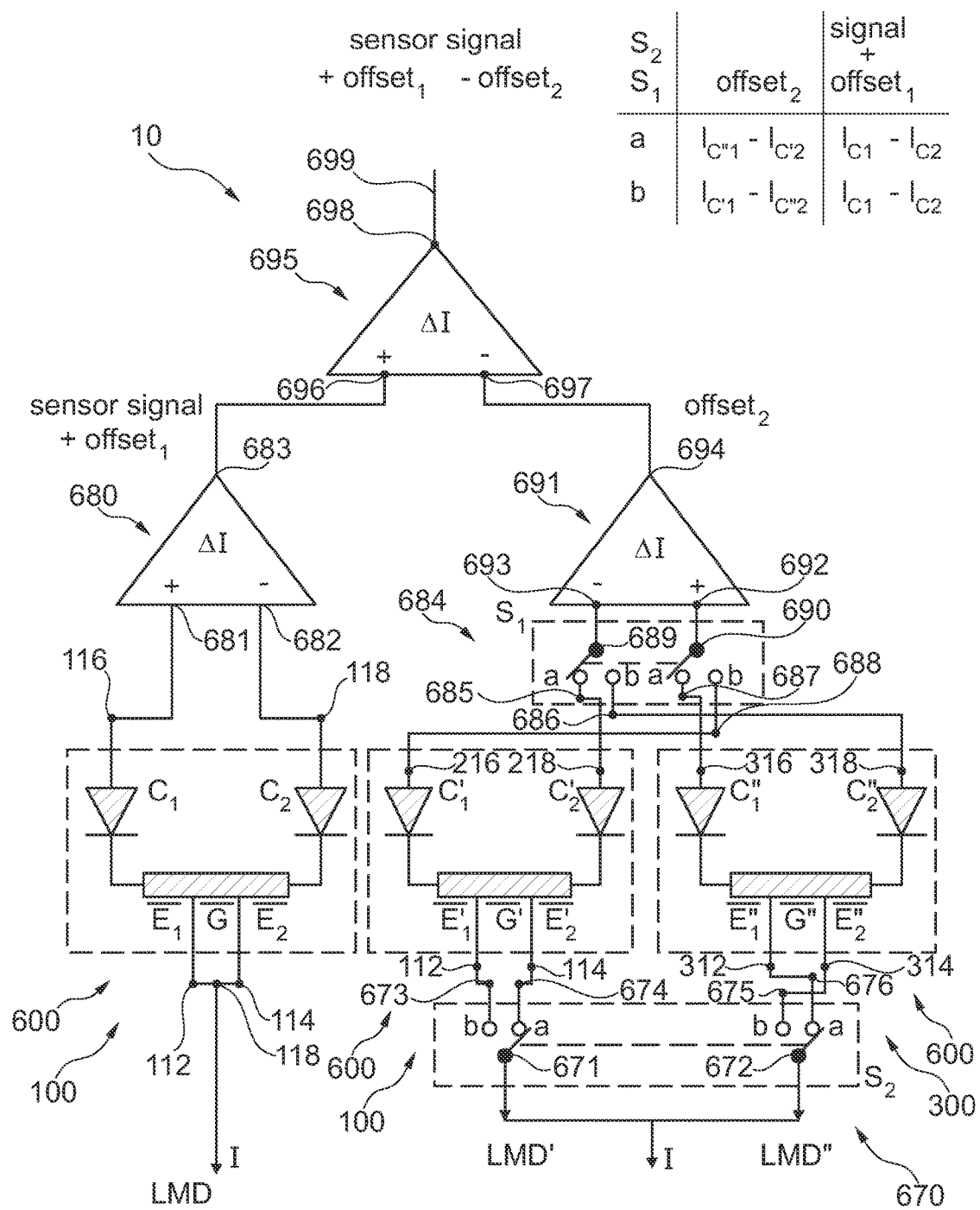

FIG. 29 shows a schematic circuit diagram of an embodiment of a differential lateral magnetic field sensor system according to the invention, implemented in the form of a chopped offset compensation differential read-out circuitry involving three instances of a lateral magneto diode of FIGS. 19a to 19c.

Figure 30:
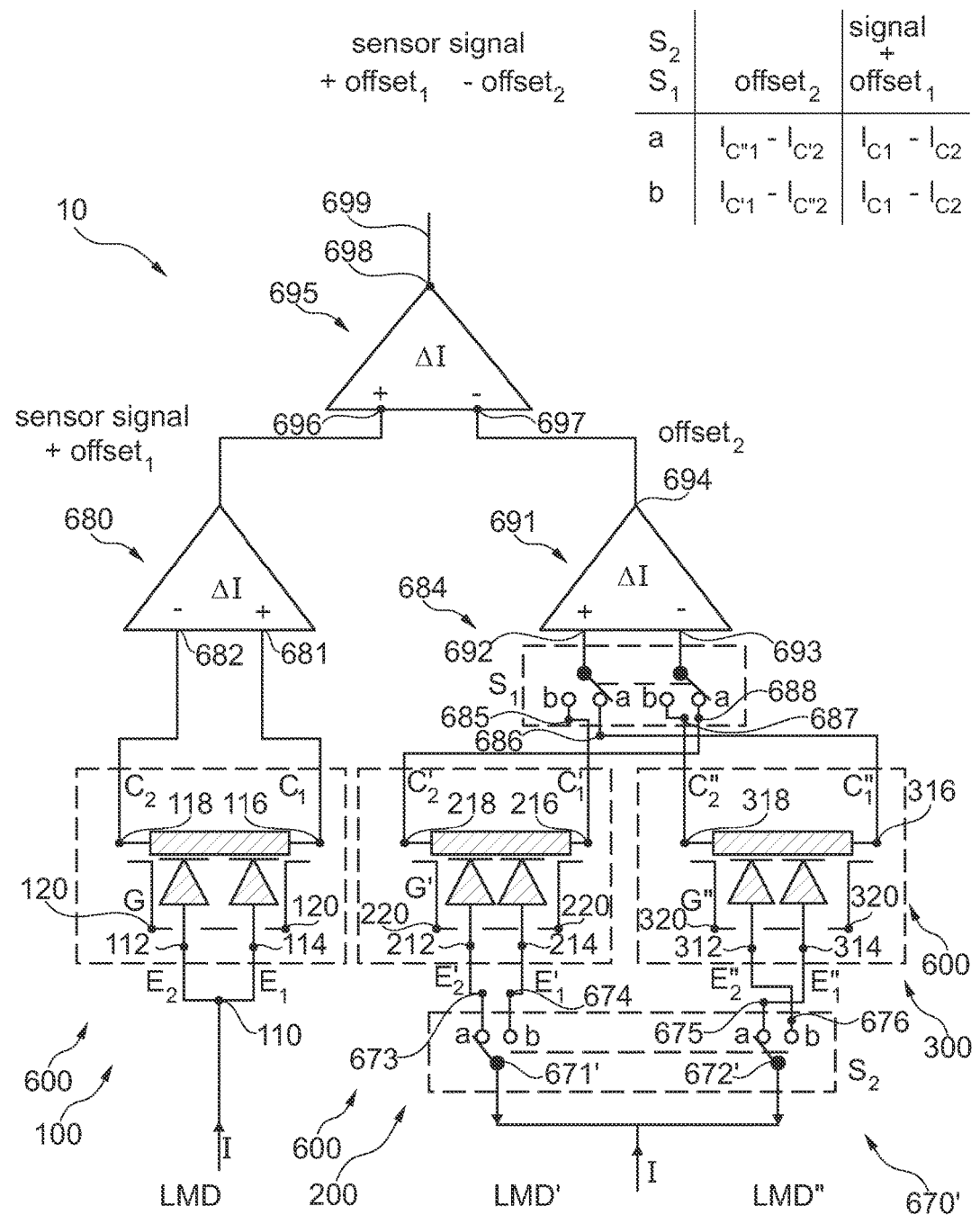

FIG. 30 shows a schematic circuit diagram of another embodiment of a differential lateral magnetic field sensor system according to the invention, implemented in the form of a chopped offset compensation differential read-out circuitry involving three instances of a lateral magneto diode of FIGS. 21a to 21c.

Figure 31:
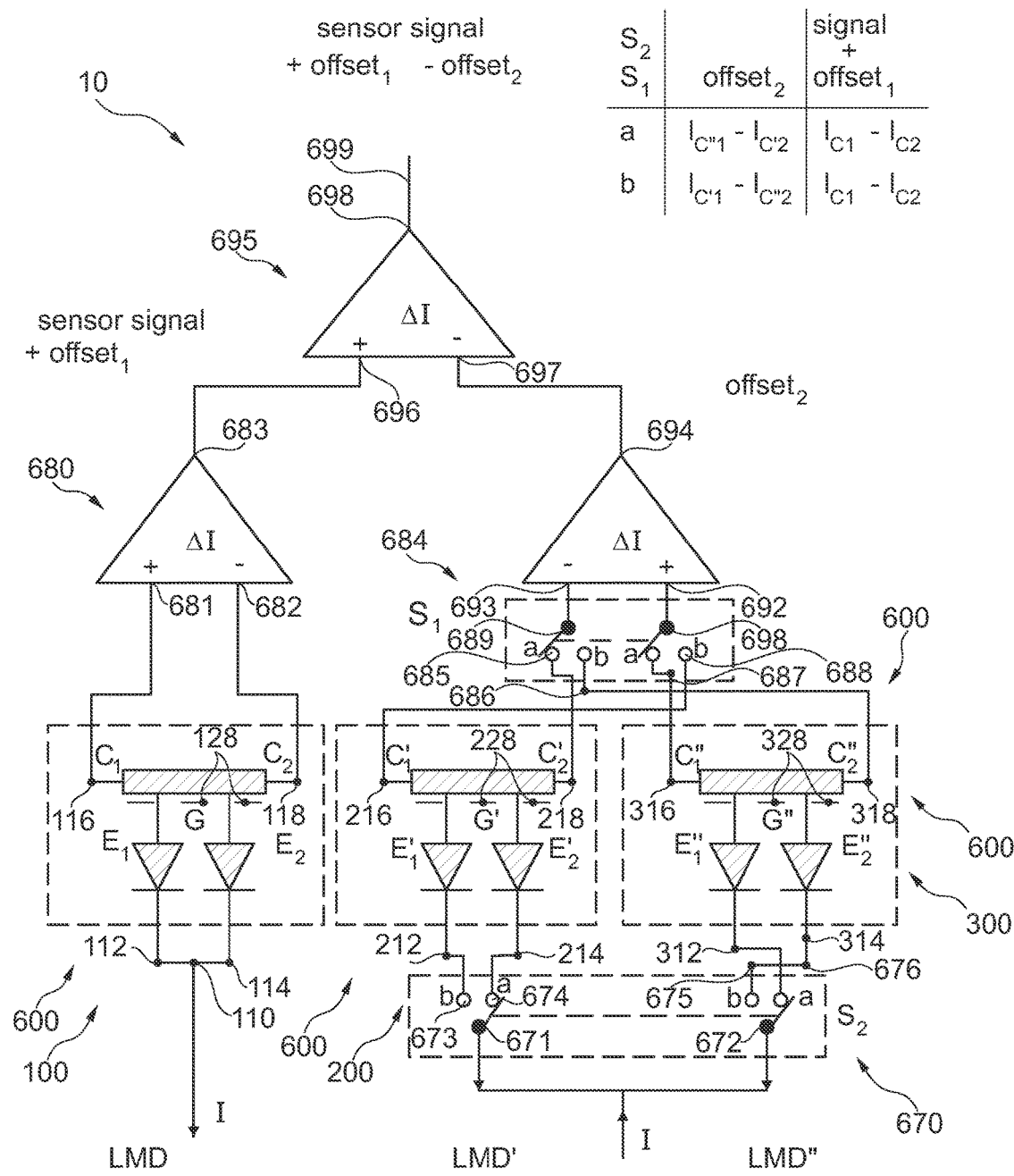

FIG. 31 shows a schematic circuit diagram of still another embodiment of a differential lateral magnetic field sensor system according to the invention, implemented in the form of a chopped offset compensation differential read-out circuitry involving three instances of a lateral magneto diode of FIGS. 24a to 24c.

DETAILED DESCRIPTION OF EMBODIMENTS OF THE INVENTION

Methods for manufacturing and methods for having manufactured the various components, elements, devices and systems that are described herein are comprised within the scope of the present invention. At least some of the circuitry, systems and methods, which are disclosed herein, may be implemented by using conventional semiconductor design and manufacturing techniques in order to provide a single integrated circuit or an application-specific-circuitry (ASIC).

Figure 1A:
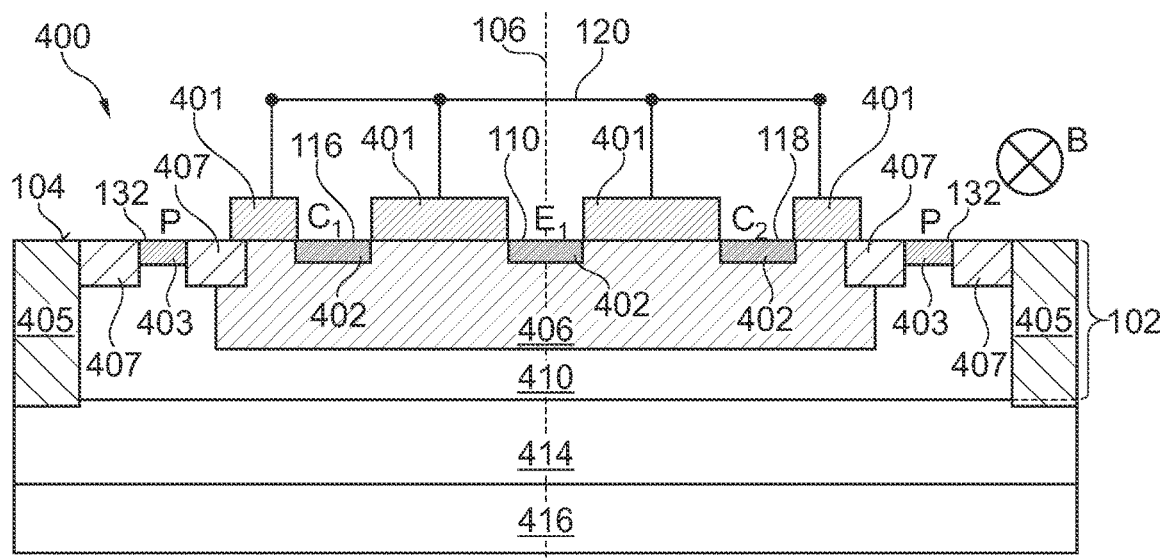
FIG. 1a shows a schematic cross section of a first embodiment of a differential lateral magnetic field sensor implemented in the form of a lateral magneto resistor for use in a differential magnetic field sensor system achieving offset cancelling by providing multiple instances of the magnetic field sensor according to the invention.
Figure 1B:
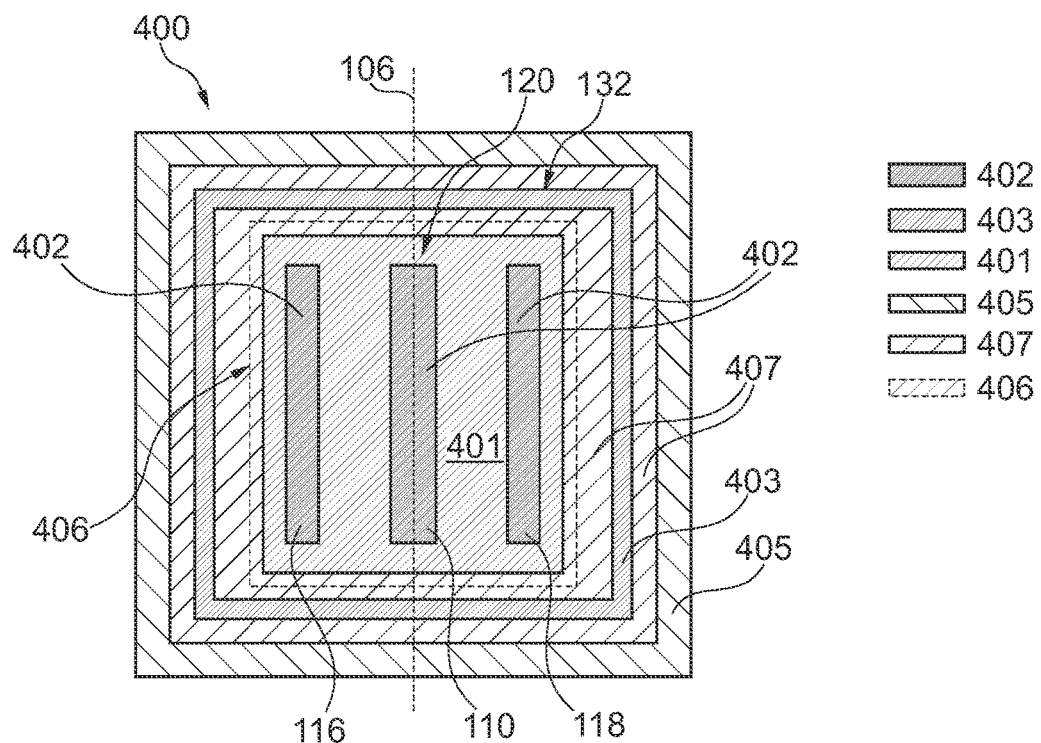

FIGS. 1a and 1b show one instance of a first embodiment of a lateral magneto resistor (LMR) 400 as an example of a magnetic field sensor 100, namely a MOS-gated LMR on n-type well and p-type epitaxial layer. The sensor 100 is for use in a magnetic field sensor system according to the invention, which generally involves three instances (100, 200, 300, see FIGS. 3a and 3b) of the same magnetic field sensor. The LMR 400 based magnetic field sensor 100 shown in FIGS. 1a and 1b is manufactured using MOS (metal-oxide-semiconductor) technology performed on a SOI (silicon on oxide) substrate, which is commonly available. The substrate comprises handle wafer silicon 416 employed as a basis, an oxide layer that is deposited on the silicon and that becomes a buried oxide layer 414 after deposition of the next layer, and a p-type epitaxial layer 410 that is deposited on the oxide layer. The further structures which make up the LMR 400 are deposited on this substrate, namely on the epitaxial layer 410.

The LMR 400 further comprises an n-type well 406 that is formed in the p-type epitaxial layer 410 and that forms the surface layer portion 102 mentioned in the appended claims, and an MTI (medium trench isolation) structure 405, which that is a ring-shaped isolation that extends from the top surface of the epitaxial layer 410 down into the buried oxide layer 414, so that isolated islands are formed for the sensor structure inside the ring. The LMR 400 further comprises an emitter structure 110 that is made as an $n^+$-type structure 402 in the centre of the n-type well 406 and symmetrically with respect to a symmetry plane 106 which in turn is perpendicular to the surface 104 of the layers 410 and 406 and perpendicular to the plane of drawing of FIGS. 1a and 1b. The LMR 400 further comprises a first collector structure 116 and a second collector structure 118 that are each made as an $n^+$-type structure 402 in the n-type well 406, on opposite sides of the symmetry plane 106 and such that the first and the second collector structure 116 and 118 are mirror images of each other with respect to the symmetry plane 106.

The LMR 400 further comprises a ring-type STI (shallow trench isolation) area 407 that is formed in an essentially rectangular shape so as to surround the emitter structure 110 and the first and second collector structures 116 and 118, and a P-contact that is formed as a $p^+$-type structure 403 in the STI area 407 and as a ring-type contact. Still further, the LMR 400 comprises a gate structure 120 that is formed of polysilicon 401 and deposited on the surface of the n-type well 406 in the area between the emitter structure 110 and the first collector structure 116, the area between the emitter structure 110 and the second collector structure 118, and in an area surrounding the emitter and collector structures 110, 116 and 118 between these structures and the surrounding ring-type STI area 407, see FIG. 1*b*.

In use of the magnetic field sensor 100 as an LMR 400-type magnetic field sensor, an electric current formed by electrons as the charge carriers is injected via the emitter structure 110 into the n-type well 406. There, the current is divided in two portions having opposite directions, a first current portion flowing to the first collector structure 116 and a second current portion flowing to the second collector structure 118. The first and second current portions are collected at the collector structures 116 and 118, respectively. When a magnetic flux density B is applied in a lateral direction and in the symmetry plane 106 (i.e. perpendicular into the plane of drawing of FIG. 1*a*, as indicated by B in FIG. 1*a*), the first and the second current portions are influenced by the Lorentz force acting on the electrons and deviated in opposite directions, respectively, one current portion being deviated closer to the surface and the other current portion being deviated away from the surface. This leads to a difference of the currents that are collected at the first and the second collector structure 116 and 118, which causes at the collector structures 116 and 118 a differential current signal that is a measure for the magnetic flux density B.

The n-type well 406 is formed in the p-type epitaxial layer 410 for shielding interface defects present at the interface with the buried oxide layer 414. The gate structure 120 made of polysilicon 401 may be connected to a negatively biasing electrical potential that can be adjusted so as to push the charge carriers, i.e. the electrons, into the volume and deplete the surface layers. For the reasons mentioned above and as will be explained below, the differential current signal may be superimposed by an offset current signal. The offset current signal is significant in magnitude and is to be compensated and/or cancelled, as will be explained further below with reference to FIGS. 4 to 9.

Figure 2A:
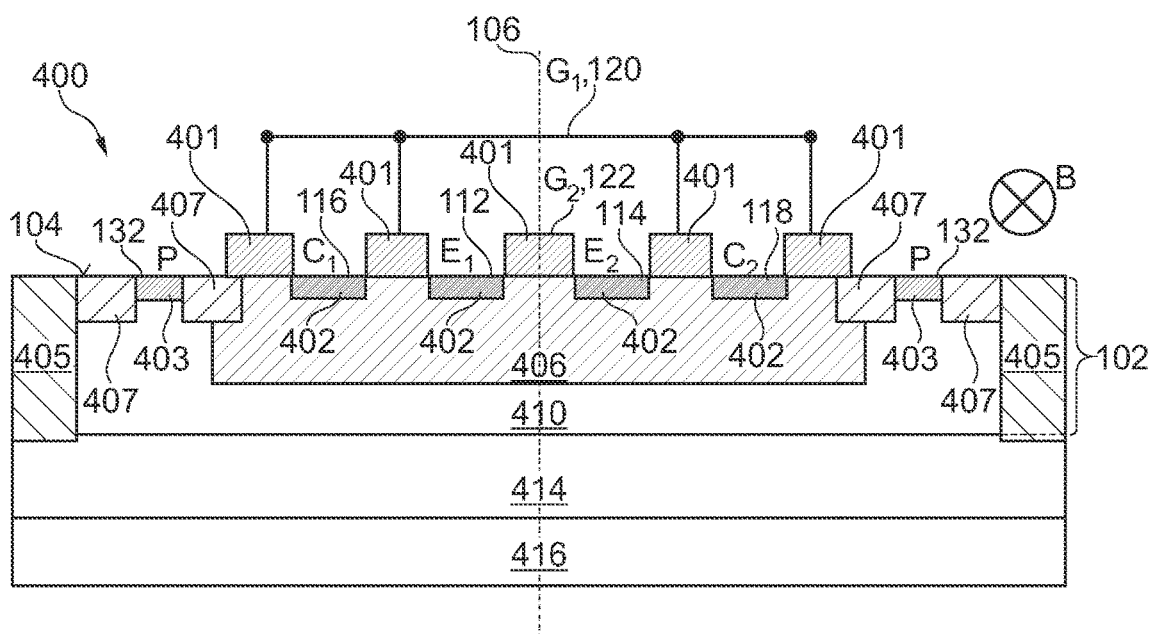
FIG. 2a shows a schematic cross section of a second embodiment of a differential lateral magnetic field sensor implemented in the form of a lateral magneto resistor for use in a differential magnetic field sensor system achieving offset cancelling by providing multiple instances of the magnetic field sensor according to the invention.
Figure 2B:
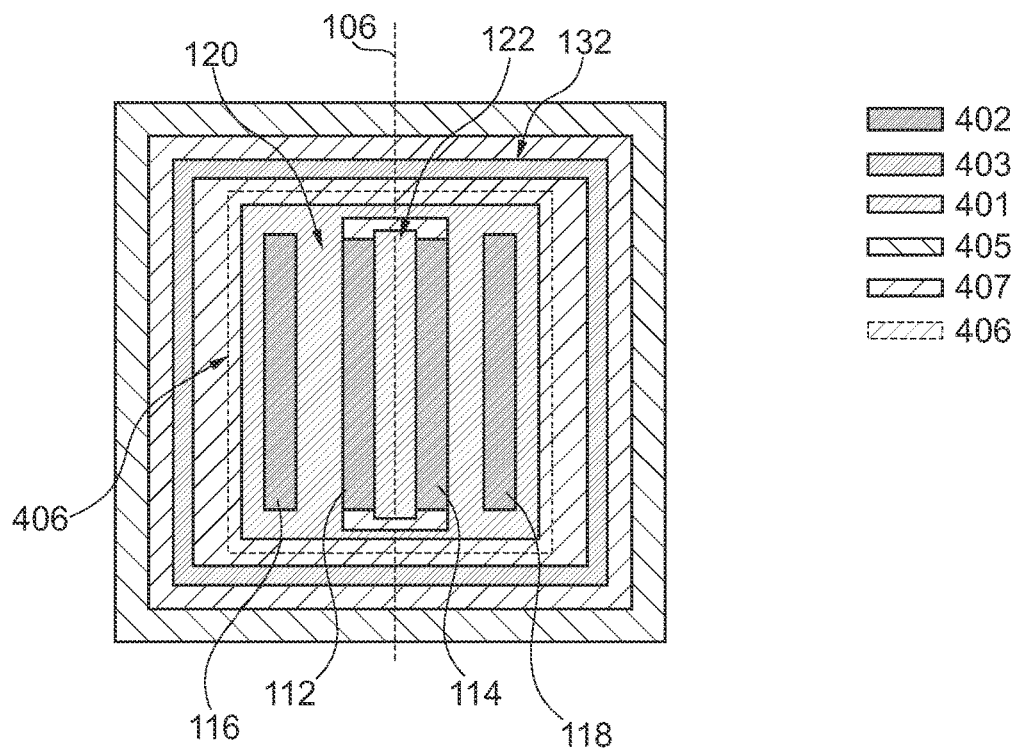

FIGS. 2*a* and 2*b* show one instance of a second embodiment of a lateral magneto resistor (LMR) 400 as an example of a magnetic field sensor 100, namely a MOS-gated LMR on n-type well and p-type epitaxial layer with dual gate control. Also this sensor 100 is for use in a magnetic field sensor system according to the invention. The LMR 400 of the second embodiment in FIGS. 2*a* and 2*b* is layouted substantially similar as the LMR 400 of the first embodiment in FIGS. 1*a* and 1*b*, except for the layout of the emitter structure and that of the gate structure and its electrical connection. Instead of the one emitter structure 110 in the LMR 400 of the first embodiment, in the LMR 400 of the second embodiment, the emitter structure comprises a first portion emitter structure 112 and a second portion emitter structure 114, which are arranged on opposite sides of the symmetry plane 106 so as to be substantially mirror images of one another and which can be electrically contacted individually. Further, instead of the one gate structure 120 in the LMR 400 of the first embodiment, in the LMR 400 of the second embodiment, the gate structure comprises a first gate structure 120 and a second gate structure 122. The second gate structure 122 is formed between the first portion emitter structure 112 and the second portion emitter structure 114 and can be electrically contacted individually. The first gate structure 120 is formed so as to surround the emitter structures 112 and 114 and the collector structures 116 and 118 and to be between the first portion emitter structure 112 and the first collector structure 116 and also between the second portion emitter structure 114 and the second collector structure 118 and can be electrically contacted individually and separately from the second gate structure 122.

According to the invention, the presently proposed approach toward offset cancellation is to combine one magnetic field sensor (in the following called the first magnetic field sensor 100) that is operated double-sided (as mentioned above and as will be explained in more detail below), i.e. via its first and second collector structures 116 and 118, with two additional identically layouted sensors (in the following called the second magnetic field sensor 200 and the third magnetic field sensor 300) that are each operated single-sided, i.e. via only a respective one of their collector structures and that are arranged in close vicinity to the first sensor 100 on the SOI substrate. The combination of the first magnetic field sensor 100 that is double-sidedly operated with the two additional sensors the second and the third magnetic field sensors 200 and 300, is shown in FIGS. 3*a* and 3*b* using as an example three instances of the LMR 400 of the first embodiment shown in FIGS. 1*a* and 1*b*.

Figure 3A:
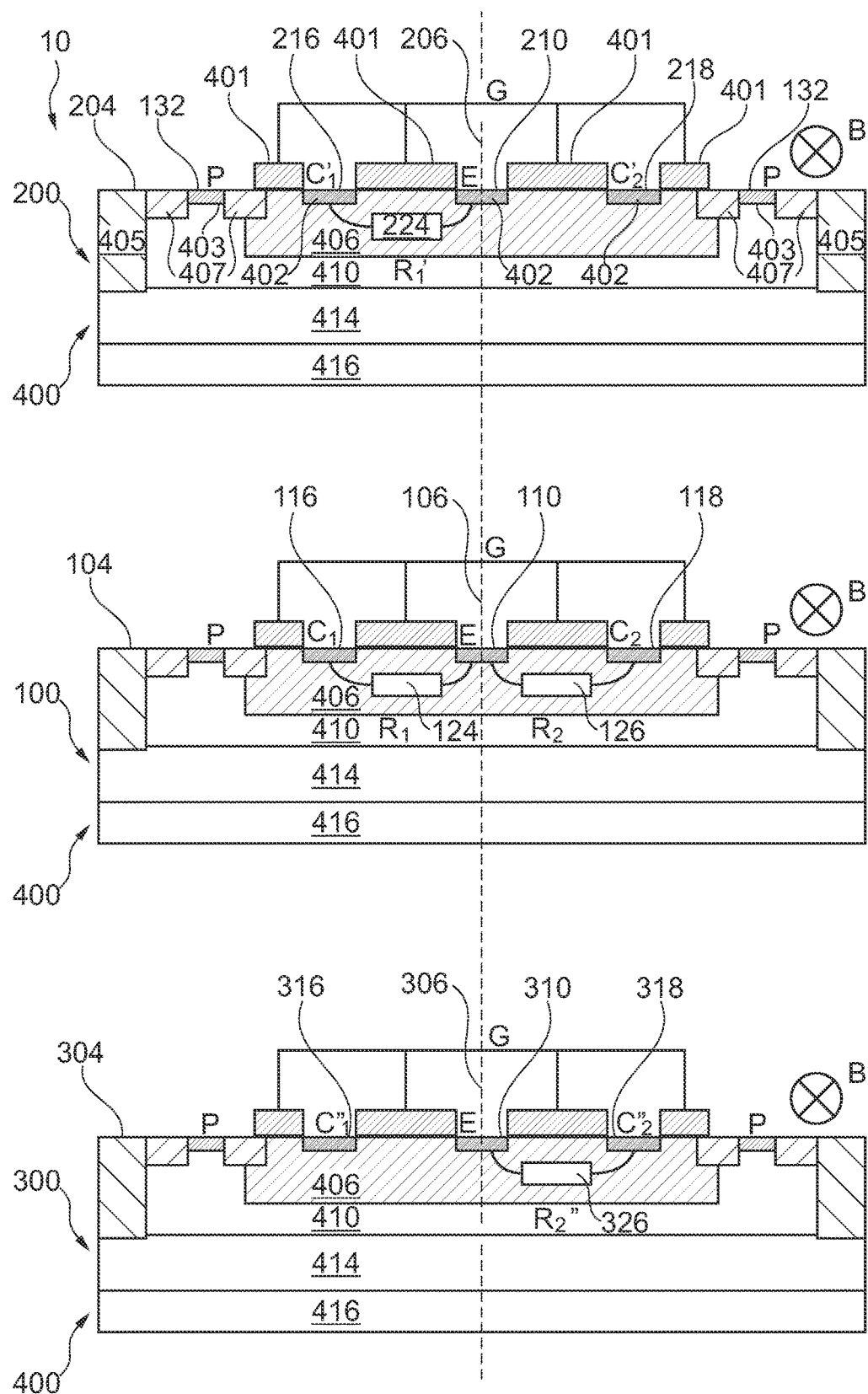
FIG. 3a shows a first embodiment of a differential lateral magnetic field sensor system according to the invention, formed by three instances of an embodiment of the lateral magneto resistor of FIGS. 1a and 1b, each of which is shown in a cross sectional view.

In FIG. 3*a*, the first magnetic field sensor 100 is operated double-sided in that an electric current is injected via the (n$^+$-type 402) emitter structure 110 and—due to the symmetric layout—separated in two current portions. The first current portion is registered at the (n$^+$-type 402) first collector structure 116 after it has passed through a portion of the n-type well 406, which portion is attributed a first resistance (equivalent first resistor) 124. The second current portion is registered at the (n$^+$-type 402) second collector structure 118 after it has passed through another portion of the n-type well 406, which portion is attributed a second resistance (equivalent second resistor) 126. The second magnetic field sensor 200 is operated single-sided in that an electric current is injected via its emitter structure 210 and registered at its first collector structure 216 after it has passed through a portion of its n-type well 406, which portion is attributed a first resistance (equivalent first resistor) 224 and which is analogue to the first resistance 124 in the first magnetic field sensor 100. The third magnetic field sensor 300 is operated single-sided in that an electric current is injected via its emitter structure 310 and registered at its second collector structure 318 after it has passed through a portion of its n-type well 406, which portion is attributed a second resistance (equivalent second resistor) 326 and which is analogue to the second resistance 126 in the first magnetic field sensor 100.

Figure 3B:
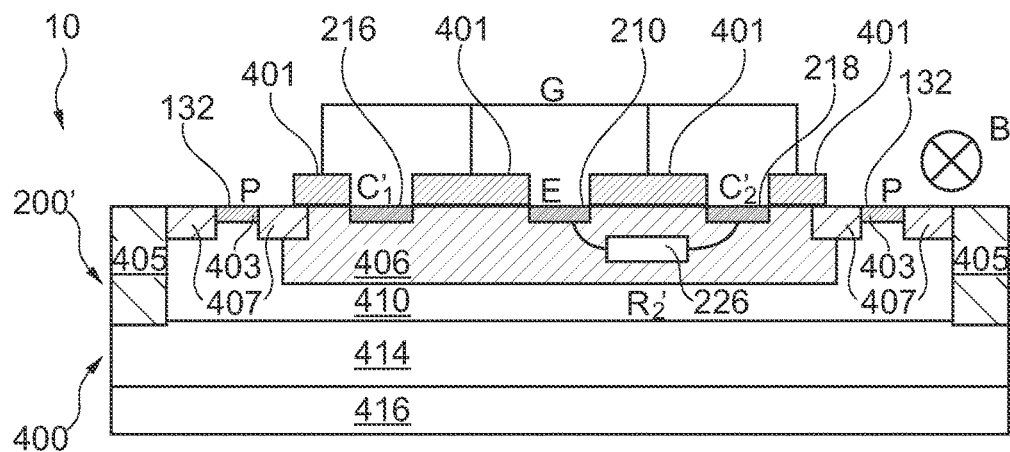
FIG. 3b shows a second embodiment of a differential lateral magnetic field sensor system according to the invention, formed by three instances of an embodiment of the lateral magneto resistor of FIGS. 1a and 1b, each of which is shown in a cross sectional view.
Figure 3B:
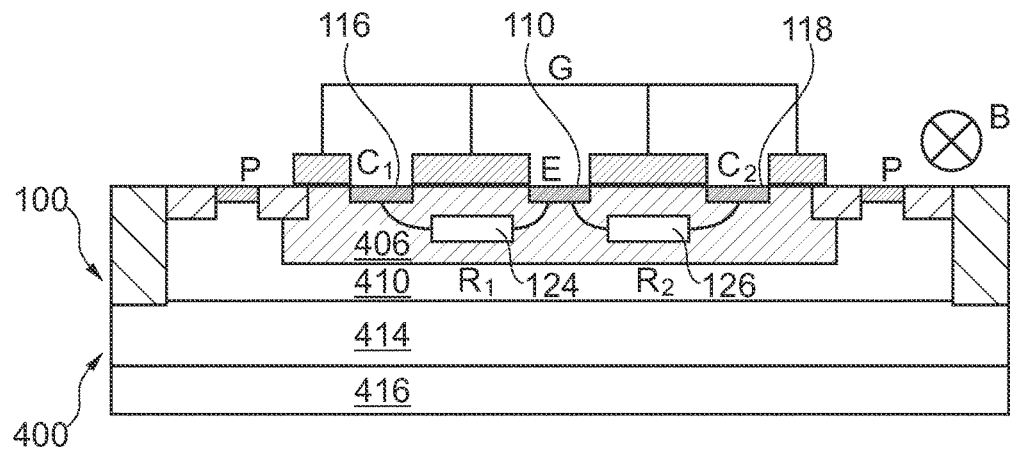
Figure 3B:
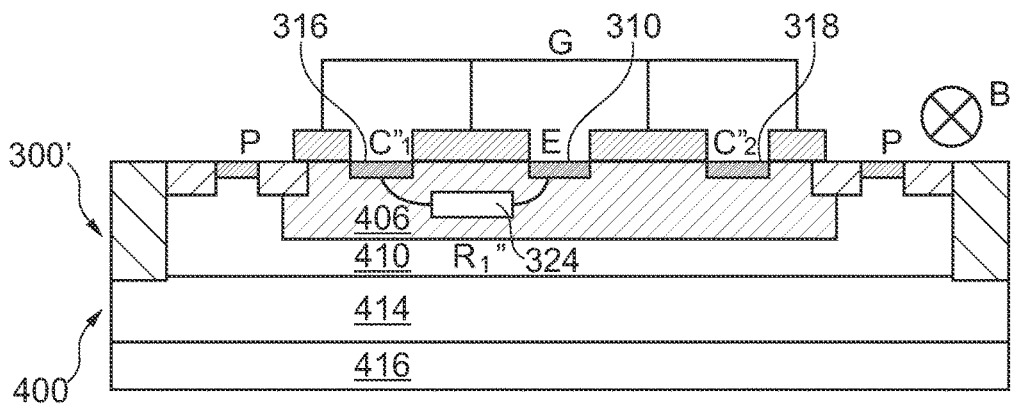

In FIG. 3*b*, the first magnetic field sensor 100 is operated as in FIG. 3*a*. However, contrary to the situation in FIG. 3*a*, the second magnetic field sensor 200 is operated single-sided in that an electric current is injected via its emitter structure 210 and registered at its second collector structure 218 after it has passed through a portion of its n-type well 406, which portion is attributed a second resistance (equivalent first resistor) 226 and which is analogue to the second resistance 126 in the first magnetic field sensor 100. Also contrary to the situation in FIG. 3*a*, the third magnetic field sensor 300 is operated single-sided in that an electric current is injected via its emitter structure 310 and registered at its first collector structure 316 after it has passed through a portion of its n-type well 406, which portion is attributed a first resistance (equivalent second resistor) 324 and which is analogue to the first resistance 124 in the first magnetic field sensor 100.

In both FIGS. 3*a* and 3*b*, by virtue of the differential current, i.e. the difference between the first and the second current portions, the first magnetic field sensor 100 is sensitive to the magnetic flux density B. And by virtue of the single-sided operation, the second and the third magnetic field sensors 200 and 300 are not sensitive to the magnetic flux density B and can therefore be called dummy structures.

Figure 4A:
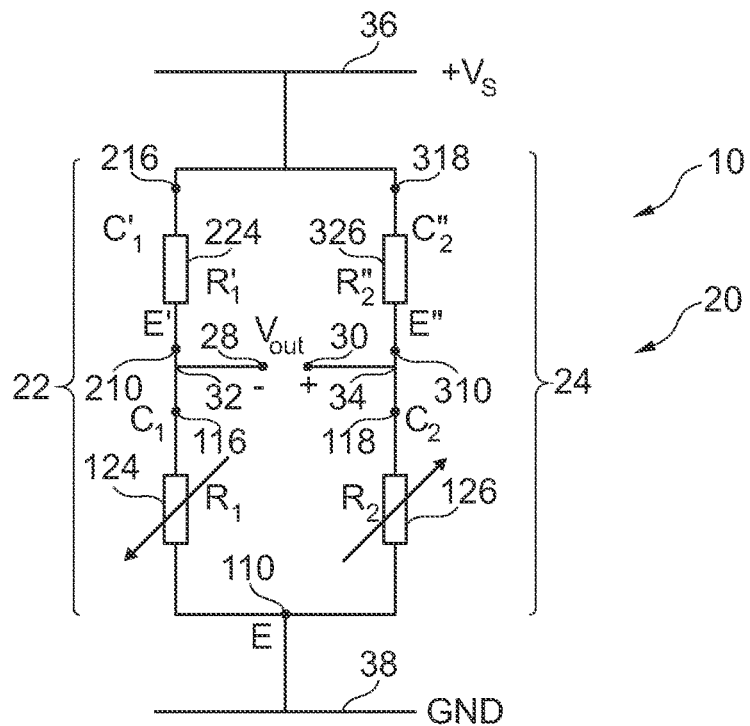
FIG. 4a shows a schematic circuit diagram of an embodiment of a differential lateral magnetic field sensor system according to the invention, implemented in the form of a Wheatstone bridge type offset compensation circuitry using three instances of the embodiment of a lateral magneto resistor of FIGS. 1a and 1b.
Figure 4B:
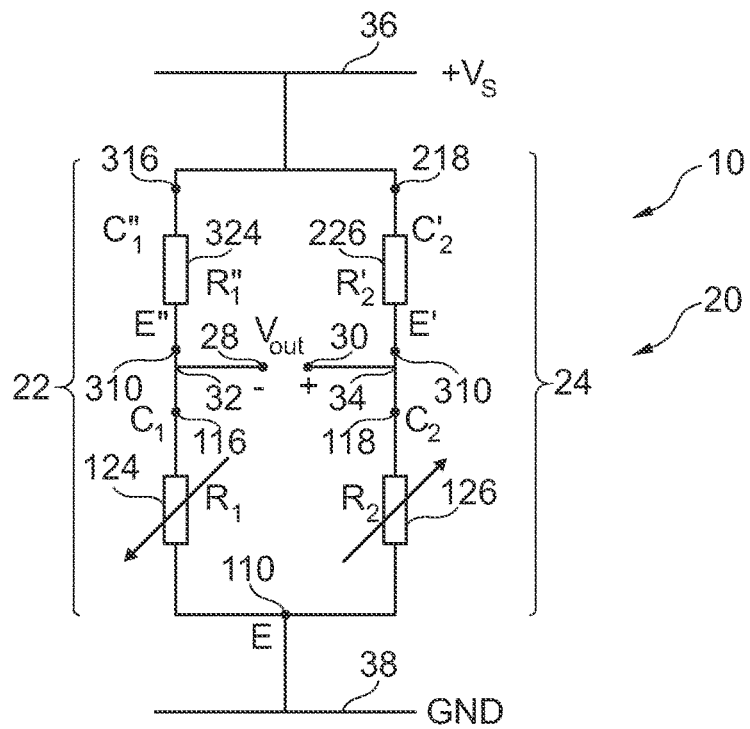
FIG. 4b shows a schematic circuit diagram of another embodiment of a differential lateral magnetic field sensor system according to the invention, implemented in the form of a Wheatstone bridge type offset compensation circuitry using three instances of the embodiment of a lateral magneto resistor of FIGS. 1a and 1b.

FIGS. 4a and 4b, respectively, show a magnetic field sensor structure 10 formed by the electrical connection of the two dummy structure magnetic field sensors 200 and 300 to the first magnetic field sensor 100 of FIGS. 3a and 3b in the form of a Wheatstone bridge type circuit 20. In particular, the LMR 400 based first, second and third magnetic field sensor 100, 200 and 300 are externally connected in the form of a Wheatstone bridge type circuitry 20, in which a first voltage divider 22 and a second voltage divider 24 are coupled between a, for example positive, supply voltage level 36 and a common ground voltage level 38.

In FIG. 4a, the first voltage divider 22 comprises a structure comprising the first collector structure 216 and the emitter structure 210 of the second magnetic field sensor 200, and a structure comprising the first collector structure 116 and the emitter structure 110 of the first magnetic field sensor 100. In the first voltage divider 22, the first collector structure 216 of the second magnetic field sensor 200 is coupled to the supply voltage level 36, the emitter structure 210 of the second magnetic field sensor 200 is coupled to the first collector structure 116 of the first magnetic field sensor 100 and the emitter structure 110 of the first magnetic field sensor 100 is coupled to the common ground voltage level 38. The second voltage divider 24 comprises a structure comprising the second collector structure 318 and the emitter structure 310 of the third magnetic field sensor 300, and a structure comprising the second collector structure 118 and the emitter structure 110 of the first magnetic field sensor 100. In the second voltage divider 24, the second collector structure 318 of the third magnetic field sensor 300 is coupled to the supply voltage level 36, and the emitter structure 310 of the third magnetic field sensor 300 is coupled to the second collector structure 118 of the first magnetic field sensor 100.

The sensor system 10 of FIG. 4a further comprises a differential voltage output terminal, which in turn comprises a first voltage output terminal 28 and a second voltage output terminal 30. The first voltage output terminal 28 is coupled to a first node 32 in the connection between the emitter structure 210 of the second magnetic field sensor 200 and the first collector structure 116 of the first magnetic field sensor 100. The second voltage output terminal 30 is coupled to a second node 34 in the connection between the emitter structure 310 of the third magnetic field sensor 300 and the second collector structure 118 of the first magnetic field sensor 100.

In the Wheatstone bridge 20 type electrical connection between the first magnetic field sensor 100 and the second and third magnetic field sensors 200 and 300 of FIG. 3a, the first resistance 124 of the first magnetic field sensor 100 is compensated by the analogous first resistance 224 of the second magnetic field sensor 200, and the second resistance 126 of the first magnetic field sensor 100 is compensated by the analogous second resistance 326 of the third magnetic field sensor 300. The differential signal $V_{out}$ at the differential output, viz. the difference of the signal at the output 28 and the signal at the output 30 in FIG. 4a, is a measure for the magnetic flux density B, whereby a compensation of the systematic offsets of the first and second resistances 124 and 126 in the first magnetic field sensor 100 is achieved by the electrical coupling as shown in FIG. 4a with the first resistance 224 in the second magnetic field sensor 200 and the second resistance 326 in the third magnetic field sensor 300.

In FIG. 3b, the role of the second and the third magnetic field sensors 200 and 300 are mutually exchanged. Otherwise, the formation of the magnetic field sensor system 10 in FIG. 3b is similar to that in FIG. 3a. FIG. 4b shows the electrical connection of the second and the third magnetic field sensors 200 and 300 to the first magnetic field sensor 100 in the form of a Wheatstone bridge type circuitry for the magnetic field sensor system 10 of FIG. 3b, in analogy to the Wheatstone bridge type circuitry of FIG. 4a for the magnetic field sensor system 10 of FIG. 3a.

Figure 5A:
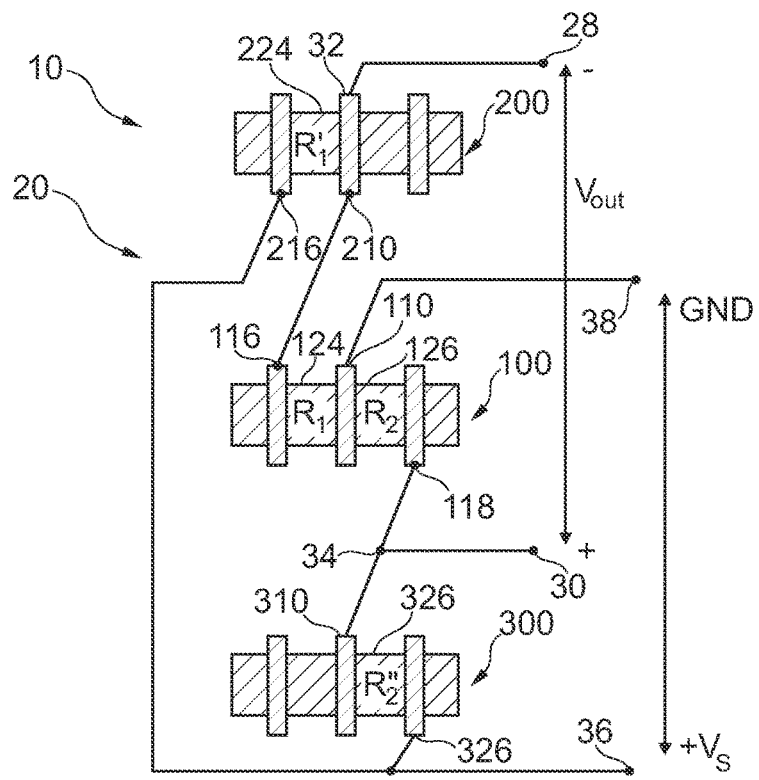

FIG. 5a shows the Wheatstone bridge type circuitry of FIG. 4a for the magnetic field sensor system 10 of FIG. 3a, not in the form of circuit diagram as in FIG. 4a but in the form of a top plan view on a triplet configuration of the first magnetic field sensor 100 in electrical coupling to the first dummy second magnetic field sensor 200 and the second dummy third magnetic field sensor 300 as shown in FIG. 3a. Similarly, FIG. 5b shows the Wheatstone bridge type circuitry of FIG. 4b for the magnetic field sensor system 10 of FIG. 3b, not in the form of circuit diagram as in FIG. 4b but in the form of a top plan view on a triplet configuration of the first magnetic field sensor 100 in electrical coupling to the first dummy second magnetic field sensor 200 and the second dummy third magnetic field sensor 300 as shown in FIG. 3b.

Figure 5B:
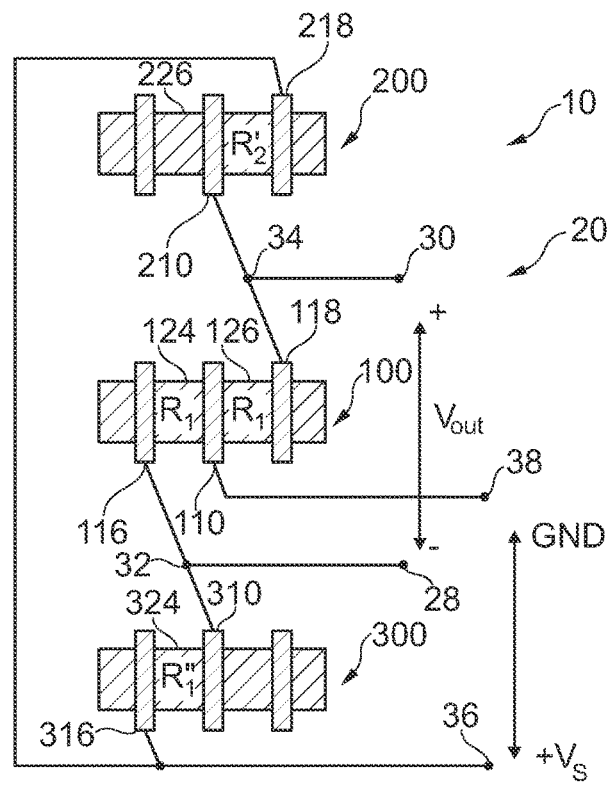
FIG. 5b shows a schematic top view of the differential lateral magnetic field sensor system of FIG. 4b.

The offset compensation according to the scheme illustrated in the FIGS. 4a and 5a based on the magnetic field sensor system 10 of FIG. 3a and similarly the offset compensation according to the scheme illustrated in the FIGS. 4b and 5b based on the magnetic field sensor system 10 of FIG. 3b can be further improved by switching, sequentially in time, from the magnetic field sensor system 10 shown in FIGS. 4a and 5a (and in FIG. 3a) to the magnetic field sensor system 10 shown in FIGS. 4b and 5b (and in FIG. 3a), back to that of FIGS. 4a and 5a, and so on. Such a sequential switching provides for an averaging between the two magnetic field sensor systems 10 of FIGS. 3a (4a, 5a) and 3b (4b, 5b). Additional external electrical connections and switching circuitry is required to implement such switching, as is illustrated in FIG. 6.

Figure 6:
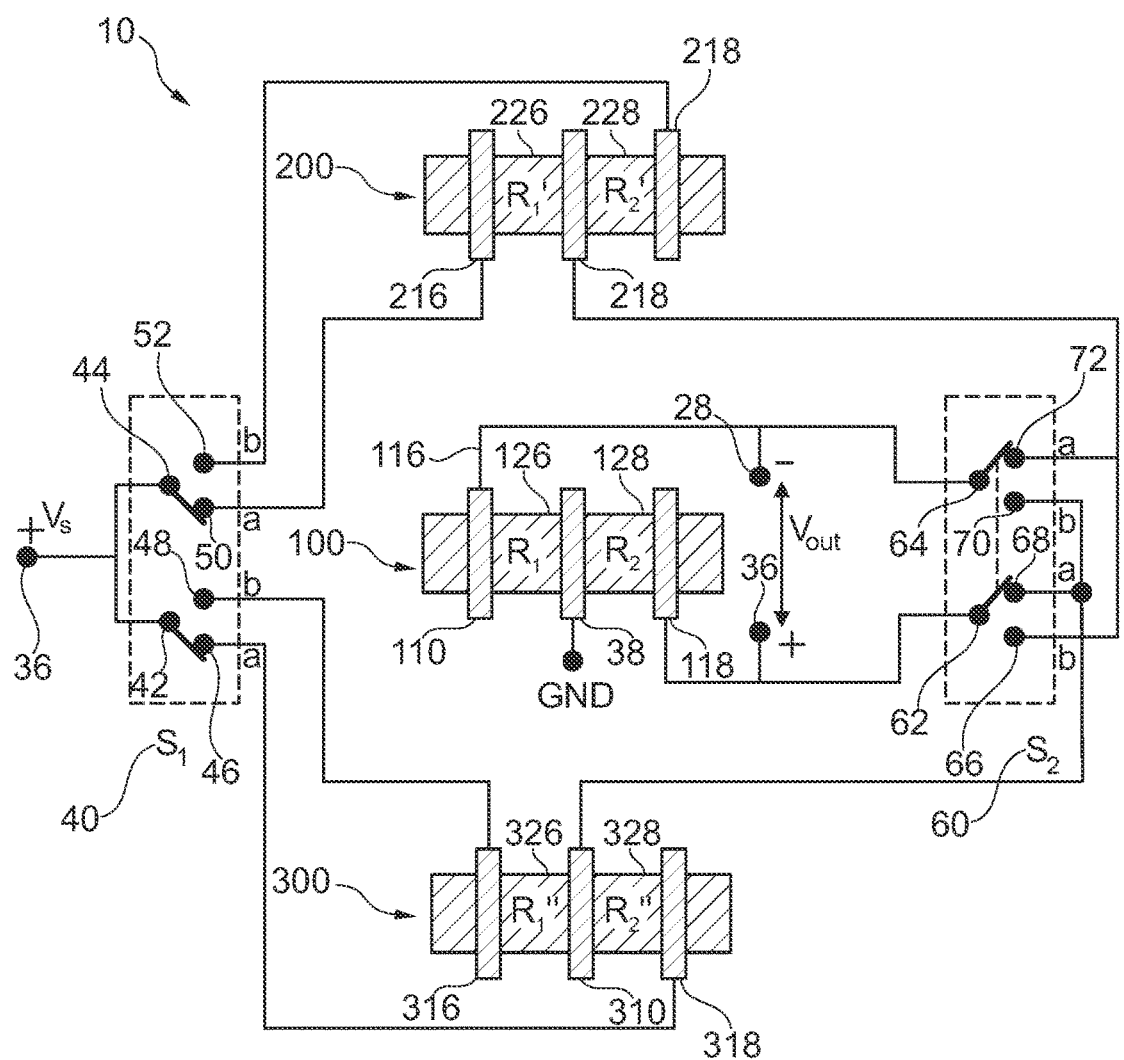
FIG. 6 shows a schematic top view of a differential lateral magnetic field sensor system, based on one of the embodiments of FIGS. 3a, 4a and 5a or of FIGS. 3b, 4b and 5b, further comprising switching circuitry for alternatively switching between two configurations of the system.

The magnetic field sensor system 10 shown in FIG. 6 comprises, in addition to the sensor systems shown in the FIGS. 4a and 5a and in the FIGS. 4b and 5b, switching circuitry comprising a first 1-to-2 multiplexer 40 and a second 1-to-2 multiplexer 60.

The first 1-to-2 multiplexer 40 in FIG. 6 comprises a first and a second input terminal 42 and 44 and a first to fourth output terminal 46, 48, 50 and 52, and is adapted to be switchable, sequentially in time, into an "a" state and alternatively into a "b" state. In the "a" state, the first output terminal 46 is connected to the first input terminal 42, and the third output terminal 40 is connected to the second input terminal 44. In the "b" state, the second output terminal 48 is connected to the first input terminal 42 and the fourth output terminal 52 is connected to the second input terminal 44. Further, the first input terminal 42 is coupled to the second input terminal 44 and to the supply voltage level 36, and the first output terminal 46 is connected to the second collector structure 318 of the third magnetic field sensor 300. The second output terminal 48 is connected to the first collector structure 316 of the third magnetic field sensor 300. The third output terminal 50 is connected to the first collector structure 216 of the second magnetic field sensor 200. The fourth output terminal 52 is connected to the second collector structure 218 of the second magnetic field sensor 200.

The second 1-to-2 multiplexer 60 in FIG. 6 comprises a first input terminal 62 and a second input terminal 64, and a first to fourth output terminal 66, 68, 70 and 72), and is adapted to be switchable, sequentially in time and synchronously with the second 1-to-2 multiplexer 40 in FIG. 6, into an "a" state and alternatively into a "b" state. In the "a" state, the second output terminal 68 is connected to the first input terminal 62, and the fourth output terminal 72 is connected to the second input terminal 64. In the "b" state, the first output terminal 66 is connected to the first input terminal 62 and the third output terminal 70 is connected to the second input terminal 64. Further, the first input terminal 62 is coupled to the second collector structure 118 of the first magnetic field sensor 100 and to the second voltage output terminal 30 of the Wheatstone bridge type circuitry 20. The second input terminal 64 is coupled to the first collector structure 116 of the first magnetic field sensor 100 and to the first voltage output terminal 28 of the Wheatstone bridge type circuitry 20. The first output terminal 66 is connected with the fourth output terminal 72 and coupled to the emitter structure 210 of the second magnetic field sensor 200. The second output terminal 68 is connected with the third output terminal 70 and coupled to the emitter structure 310 of the third magnetic field sensor 300.

Figure 7:
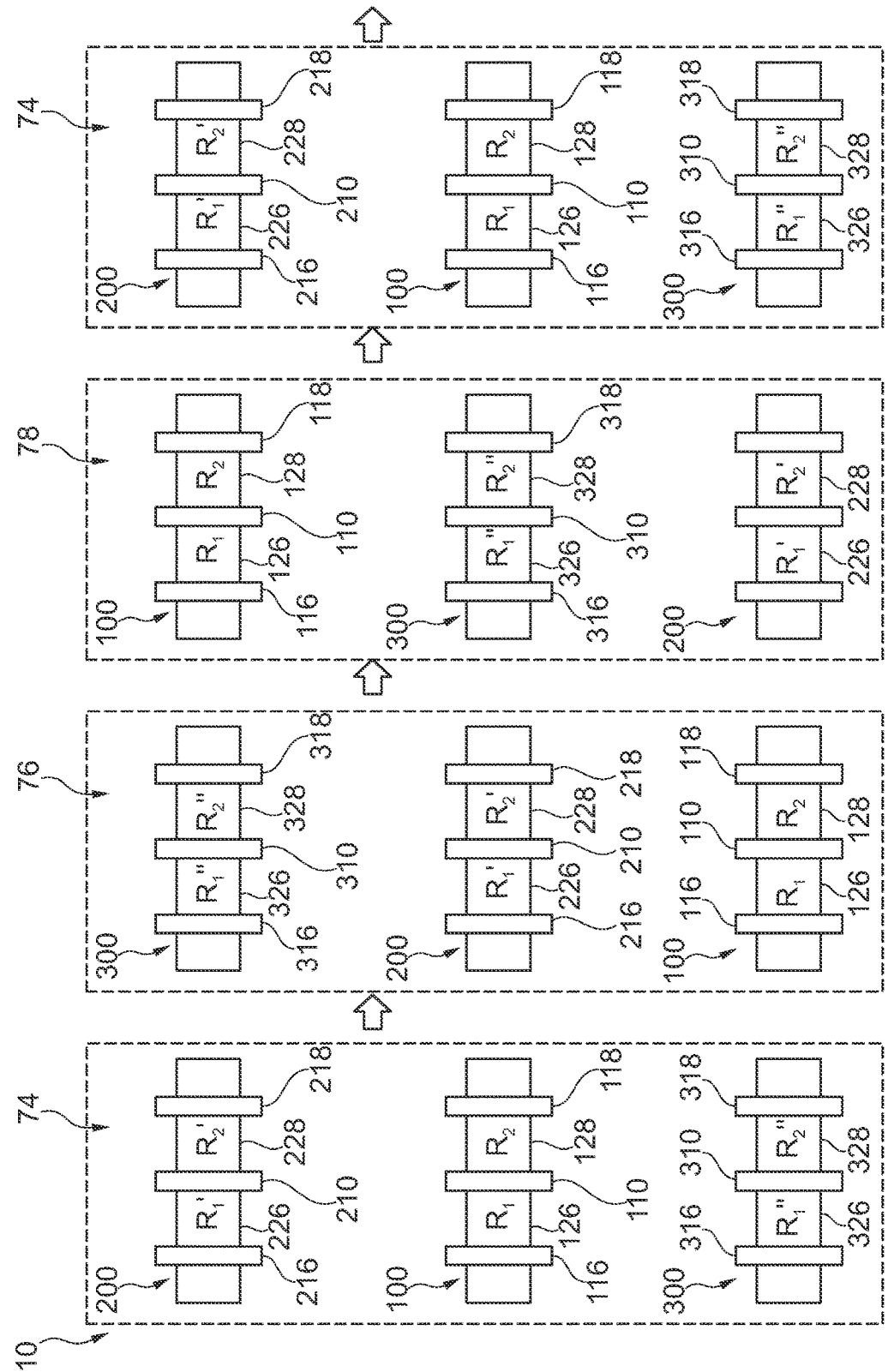
FIG. 7 shows schematic top views of a differential lateral magnetic field sensor system, based on one of the embodiments of FIGS. 3a, 4a and 5a or of FIGS. 3b, 4b and 5b, adapted to be cyclically switchable through three configurations of the system.

The offset compensation according to the switching scheme illustrated in the FIGS. 4a and 5a (or alternatively the switching scheme illustrated in the FIGS. 4b and 5b) can be further improved by switching cyclically and sequentially in time, the roles of the first, second and third magnetic field sensors 100, 200 and 300, as indicated in the FIG. 7. Additional switching circuitry (not shown) is required, as will be obvious for a person skilled in the art, to implement such cyclical switching of the magnetic field sensor system 10 as shown in FIGS. 4a and 5a (or in FIGS. 4b and 5b) from a first state 74 to a second state 76, from the second state 76 to a third state 78, from the third state 78 to the first state 74, and so on, as shown in FIG. 7.

In the cyclical switching scheme shown in FIG. 7, in the first state 74, the first magnetic field sensor 100 is operated double-sided via its first collector structure 116 to its emitter structure 110 and via its second collector structure 118 to its emitter structure 110, the second magnetic field sensor 200 is operated single-sided via its first collector structure 216 to its emitter structure 210, and the third magnetic field sensor 300 is operated single-sided via its second collector structure 318 to its emitter structure 310, as shown in FIG. 3a. In the second state 76, the first magnetic field sensor 100 of the first state has become the third magnetic field sensor, the second magnetic field sensor 200 of the first state has become the first magnetic field sensor and the third magnetic field sensor 300 of the first state has become the second magnetic field sensor. In the third state 78, the first magnetic field sensor 100 of the first state has become the second magnetic field sensor, the second magnetic field sensor 200 of the first state has become the third magnetic field sensor and the third magnetic field sensor 300 of the first state has become the first magnetic field sensor. In summary, when going from the first state 74 via the second state 76 to the third state 78, each of the three magnetic field sensors 100, 200 and 300 changes its role, i.e. being one of the first to third magnetic field sensor of the sensor system 10, in a cyclical manner. The additional switching circuitry that is required to implement the afore-mentioned cyclical switching from the first to the second, further from the second to the third state, and from the third back to the first state, is not shown in FIG. 7; its construction is straightforward and will be obvious for a person skilled in the art.

Figure 8:
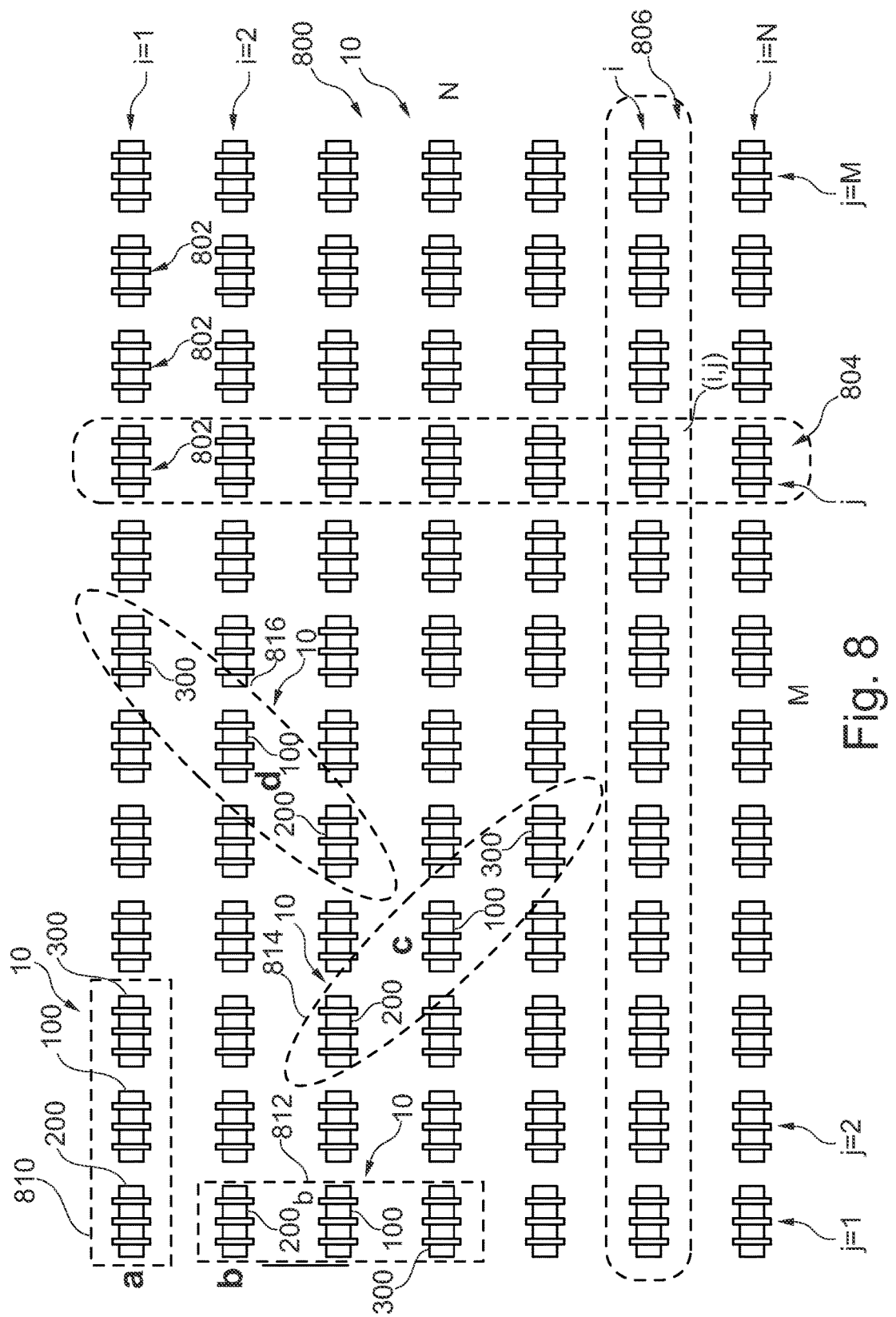
FIG. 8 shows a schematic top view of a two-dimensional array arrangement of differential lateral magnetic field sensors according to the invention, adapted to be switchable in multiple configurations of magnetic field sensor systems according to the invention, each formed by a triplet configuration of magnetic field sensors.

In the state-of-the-art practice of semiconductor manufacturing, an overall structure, such as any one of a lateral magnetic resistor (LMR) 400 as shown in the FIGS. 1a and 1b or 2a and 2b, a lateral magnetic transistor (LMT) 500 as shown in the FIGS. 12a and 12b through to FIGS. 16a and 16b, and a lateral magnetic diode (LMD) 600 as shown in the FIGS. 18a to 18c through to FIGS. 24a to 24c, will be manufactured simultaneously in multiple instances on one wafer substrate, for example in the form of a two-dimensional array arrangement of magnetic field sensors 802, such as an M×N matrix type arrangement comprising M columns 804 and N rows of magnetic field sensors 802, wherein in M and N are predetermined integers. The M columns 804 can be labeled by an index j, which may assume values from 1 to M. The N rows 806 can be labeled by an index i, which may assume values from 1 to N. Each individual magnetic field sensor 802 may be identified by the pair (i, j) of its row index i and its column index j. Such a two-dimensional array arrangement of magnetic field sensors 802 in the form of an M×N matrix is shown in FIG. 8. Each of the magnetic field sensors 802 may be one of an LMR 400, an LMT 500 or an LMD 600.

A triplet configuration comprising three magnetic field sensors 802, i.e. a first, second and third magnetic field sensor 100, 200 and 300, as is shown for example in FIGS. 3a and 3b (involving three LMDs 400), in FIGS. 16a and 16b (involving three LMTs 500) or in FIGS. 25a and 25b (involving the LMDs 600), can be formed in a variety of triplet formation schemes (a), (b), (c) or (d), as exemplified by the triplet configurations 810, 812, 814 and 816, respectively. Each triplet formation scheme achieves a sort of providing multiple instances of triplets, distributed over the area of the wafer, of three magnetic field sensors, viz. the first, second and third magnetic field sensor 100, 200 and 300.

According to triplet configuration scheme (a), the three magnetic field sensors 802, which are electrically connected together to form a magnetic field sensor system 10, are all taken out from one row of sensors as a set of three neighboring sensors, i.e. sensors (i, j), (i, j+1) and (i, j+2) for any i in the range from 1 to M and any j in the range from 1 to N−2, as exemplified in FIG. 8 by the triplet configuration 810.

According to triplet configuration scheme (b), the three magnetic field sensors 802, which are electrically connected together to form a magnetic field sensor system 10, are all taken out from one column of sensors as a set of three neighboring sensors, i.e. sensors (i, j), (i+1, j) and (i+2, j) for any i in the range from 1 to M−2 and any j in the range from 1 to N−2, as exemplified in FIG. 8 by the triplet configuration 812.

According to triplet configuration scheme (c), the three magnetic field sensors 802, which are electrically connected together to form a magnetic field sensor system 10, are all taken out from one diagonal (that is directed for example from the upper left to the lower right in FIG. 8) of sensors as a set of three neighboring sensors, that is sensors (i, j), (i+1, j+1) and (i+2, j+2) for any i in the range from 1 to M and any j in the range from 1 to N−2, as exemplified in FIG. 8 by the triplet configuration 814.

According to triplet configuration scheme (d), the three magnetic field sensors 802, which are electrically connected together to form a magnetic field sensor system 10, are all taken out from another diagonal (that is directed for example from the lower left to the upper right in FIG. 8) of sensors as a set of three neighboring sensors, that is sensors (i, j), (i−1, j+1) and (i−2, j+2) for any i in the range from 1 to M and any j in the range from 1 to N−2, as exemplified in FIG. 8 by the triplet configuration 816.

Each of those triplet configurations (a) (e.g. 810), (b) (e.g. 812), (c) (e.g. 814) and (d) (e.g. 816) shown in FIG. 8 may be electrically connected together according to any one of the schemes shown in the FIG. 4a (5a), 4b (5b), 6 or 7.

Alternatively to the provision of multiple instances of triplet configurations, each of the triplet configurations (a) (e.g. 810), (b) (e.g. 812), (c) (e.g. 814) and (d) (e.g. 816) shown in FIG. 8 may be "stepped", i.e. moved sequentially in time, within the array arrangement 800 according any one of the following positional stepping schemes (1), (2), (3) or (4), of which the stepping schemes (1) and (2) are illustrated in FIG. 9. The skilled person will understand that additional external connection circuitry as well as external clock circuitry, which defines clock cycles starting at time instances t, t+Δt, t+2Δt, and so on, is required to implement such stepping schemes.

Each triplet configuration 810, 812, 814 or 816 of magnetic field sensors 802 (100, 200, 300) may be sequentially stepped within the array arrangement 800 according one of the following positional schemes:

(1) position at time instance t: (i, j),
position at time instance t+Δt: (i+1, j) or (i−1, j), and
position at time instance t+2Δt: (i+2, j) or (i−2, j);
(2) position at time instance t: (i, j),
position at time instance t+Δt: (i, j+1) or (i, j−1), and
position at time instance t+2Δt: (i, j+2) or (i, j−2);
(3) position at time instance t: (i, j),
position at time instance t+Δt: (i+1, j+1) or (i−1, j−1), and
position at time instance t+2Δt: (i+2, j+2) or (i−2, j−2); and
(4) position at time instance t: (i, j),
position at time instance t+Δt: (i+1, j−1) or (i−1, j+1), and
position at time instance t+2Δt: (i+2, j−2) or (i−2, j+2).

In each of the afore-mentioned stepping schemes, the stated sequential positions designate the sequential positions in the array arrangement 800 as taken by one of the magnetic field sensors, for example the first magnetic field sensor 100, of the triplet configuration 810, 812, 814, 816, while the complementary two sensors, in the example the second and the third magnetic field sensors 200 and 300 of the triplet configuration 810, 812, 814, 816, are located at respective fixed relative positions with respect to the one magnetic field sensor according to any one of the triplet configuration schemes (a), (b), (c) or (d).

FIG. 10 shows the results of calculations of the relative output voltage $V_{out}/V_s$ of a Wheatstone bridge type circuit involving three LMRs 400, viz. first, second and third LMR-type magnetic sensors 100, 200 and 300, as shown in FIGS. 3a and 3b, as a function of the applied magnetic flux density B. For the calculation, it is supposed that each LMR 400 has an internal first resistance and second resistance, e.g. first resistance 124 (or $R_1$) and second resistance 126 (or $R_2$) as indicated in FIG. 3a, which are dependent on the applied magnetic flux density. The first resistance 124 or $R_1$ is supposed to have a larger current as compared to the second resistance 126 or $R_2$, when B is directed as indicated in FIG. 3a. Since these current deviations are very small in silicon (because the mobility of the charge carriers is small), one may write the constant voltage biased resistances as being linearly dependent on B:

$$R_1(B)=R_{bal}*(1-S(B-B_{eq}))$$

and $$R_2(B)=R_{bal}*(1+S(B-B_{eq})),$$

where $R_{bal}$ is the resistance value at current balance, i.e. when $B=B_{eq}$, and S is the sensitivity of the sensor defined as $S=(ΔR/R)/ΔB$. The values of the B-sensitive resistances $R_1'$ and $R_2''$ (as in FIG. 3a), or the complementary pair $R_1''$ and $R_2''$ (as in FIG. 3b), are equal to the respective LMR-resistance at zero magnetic flux density (B=0), since they are arranged on the wafer in close vicinity to each other. It is expected that the systematic differences between $R_1(0)$ and $R_2(0)$ have been copied in $R_1'$ and $R_2'$ and in $R_1''$ and $R_2''$. This implies that:

$$R_1''=R_1'=R_1(0)=R_{bal}*(1+SB_{eq})$$

and $$R_2''=R_2'=R_2(0)=R_{bal}*(1-SB_{eq})).$$

The output voltage $V_{out}$ of the Wheatstone bridge 20 is normalized to the supply voltage $V_s$ and in normalized form equals $$V_{out}/V_s=R_2/(R_2+R_2'')-R_1/(R_1+R_2').$$

Inserting the expressions for the resistances, it is found:

$$V_{out}/V_s=2SB/(4-(S(2B_{eq}-B))^2).$$

This relationship for $V_{out}/V_s$ is plotted in FIG. 10 as a function of the magnetic flux density B, with $B_{eq}$ being a parameter and a value for S assumed to be 10%/T. The output $V_{out}/V_s$ is quite linear in its dependency on B, and almost independent of the $B_{eq}$ value, for all practical S values. This reflects the basic finding underlying the present invention, that the offset of a first sensor 100 in a triplet configuration of three sensors 100, 200 and 300, which are electrically connected e.g. in the form of a Wheatstone bridge type circuit, is intrinsically cancelled by values of the B-insensitive internal resistances $R_1'$ of the second sensor and $R_2''$ of the third sensor or the complementary pair $R_1''$ of the second sensor and $R_2'$.

FIGS. 11a and 11b show one instance of a first embodiment of a lateral magneto transistor (LMT) 500 as an example of a magnetic field sensor 100, namely a MOS-gated NPN LMT with far STI and single gate on p-type well and p-type epitaxial layer. The sensor 100 is for use in a magnetic field sensor system according to the invention, which generally involves three instances (100, 200, 300, see FIGS. 16a and 16b) of the same magnetic field sensor. The LMT 500 based magnetic field sensor 100 shown in FIGS. 11a and 11b is manufactured using MOS (metal-oxide-semiconductor) technology performed on a SOI (silicon on oxide) substrate, which is commonly available. The substrate comprises handle wafer silicon 516 employed as a basis, an oxide layer that is deposited on the silicon and that becomes a buried oxide layer 514 after deposition of the next layer, and a p-type epitaxial layer 510 that is deposited on the oxide layer. The further structures which make up the LMT 500 are deposited on this substrate, namely on the epitaxial layer 510.

The LMT 500 further comprises an p-type well 508 that is formed in the p-type epitaxial layer 510 and that forms the surface layer portion 102 mentioned in the appended claims, and an MTI (medium trench isolation) structure 405, which that is a ring-shaped isolation that extends from the top surface of the epitaxial layer 510 down into the buried oxide layer 514, so that isolated islands are formed for the sensor structure inside the ring. The LMT 500 further comprises an emitter structure 110 that is made as an n+-type structure 502 in the centre of the p-type well 508 and symmetrically with respect to a symmetry plane 106 which in turn is perpendicular to the surface 104 of the layers 510 and 508 and perpendicular to the plane of drawing of FIGS. 11a and 11b. The LMT 500 further comprises a first collector structure 116 and a second collector structure 118 that are each made as an $n^+$-type structure 502 in the p-type well 508, on opposite sides of the symmetry plane 106 and such that the first and the second collector structure 116 and 118 are mirror images of each other with respect to the symmetry plane 106.

The LMT 500 further comprises a ring-type STI (shallow trench isolation) area 507 that is formed in an essentially rectangular shape so as to surround the emitter structure 110 and the first and second collector structures 116 and 118. The LMT 500 further comprises a first and a second contact $B_1$ and $B_2$ that are each formed as a $p^+$-type structure 503 in the p-well 508, arranged at a distance and parallel to the first and second collector structure 116 and 118, respectively, on opposite sides of the symmetry plane 106 so as to be substantially mirror images of each other. Still further, the LMT 500 comprises a gate structure 120 that is formed of polysilicon 501 and deposited on the surface of the p-type well 508 in the area between the emitter structure 110 and the first collector structure 116, the area between the emitter structure 110 and the second collector structure 118, and in an area surrounding the emitter and collector structures 110, 116 and 118, see FIG. 11b.

In use of the magnetic field sensor 100 as an LMT 500-type magnetic field sensor, an electric current formed by electrons as the charge carriers is injected via the emitter structure 110 into the p-type well 508. There, the current is divided in two portions having opposite directions, a first current portion flowing to the first collector structure 116 and a second current portion flowing to the second collector structure 118. The first and second current portions are collected at the collector structures 116 and 118, respectively. When a magnetic flux density B is applied in a lateral direction and in the symmetry plane 106 (i.e. perpendicular into the plane of drawing of FIG. 1a, as indicated by B in FIG. 1a), the first and the second current portions are influenced by the Lorentz force acting on the electrons and deviated in opposite directions, respectively, one current portion being deviated closer to the surface and the other current portion being deviated away from the surface. This leads to a difference of the currents that are collected at the first and the second collector structure 116 and 118, which causes at the collector structures 116 and 118 a differential current signal that is a measure for the magnetic flux density B.

The path of the current flow from the ($n^+$-type) emitter structure 110 through the (p-type) well 508 to the first or second ($n^+$-type) collector structure 116 or 118 can be characterized as NPN and involves two pn-junctions. The p-type well 508 is formed in the p-type epitaxial layer 510 for shielding interface defects present at the interface with the buried oxide layer 514. The gate structure 120 made of polysilicon 501 may be connected to a negatively biasing electrical potential that can be adjusted so as to push the charge carriers, i.e. the electrons, into the volume and accumulate the surface with holes, so that holes are attracted to the surface and electrons are pushed away from the surface. For the reasons mentioned above and as will be explained below, the differential current signal may be superimposed by an offset current signal. The offset current signal is significant in magnitude and is to be compensated and/or cancelled, as will be explained further below with reference to FIG. 17.

FIGS. 12a and 12b show one instance of a second embodiment of a lateral magneto transistor (LMT) 500 as an example of a magnetic field sensor 100, namely a MOS-gated, double-emitter NPN LMT with far STI and single gate on p-type well and p-type epitaxial layer. Also this sensor is for use in a magnetic field sensor system according to the invention. The LMT 500 of the second embodiment in FIGS. 12a and 12b is layouted substantially similar as the LMT 500 of the first embodiment in FIGS. 11a and 11b, except for the layout of the emitter structure and that of the gate structure and its electrical connection. Instead of the one emitter structure 110 in the LMT 500 of the first embodiment, in the LMT 500 of the second embodiment, the emitter structure comprises a first portion emitter structure 112 and a second portion emitter structure 114, which are arranged on opposite sides of the symmetry plane 106 so as to be substantially mirror images of one another and which can be electrically contacted individually. Further, instead of the one gate structure 120 in the LMT 500 of the first embodiment, in the LMT 500 of the second embodiment, the gate structure comprises a first gate structure 120 and a second gate structure 122. The second gate structure 122 is formed between the first portion emitter structure 112 and the second portion emitter structure 114 and can be electrically contacted individually. The first gate structure 120 is formed so as to surround the emitter structures 112 and 114 and the collector structures 116 and 118 and to be between the first portion emitter structure 112 and the first collector structure 116 and also between the second portion emitter structure 114 and the second collector structure 118 and can be electrically contacted individually and separately from the second gate structure 122.

FIGS. 13a and 13b show one instance of a third embodiment of a lateral magneto transistor (LMT) 500 as an example of a magnetic field sensor 100, namely a MOS-single gated NPN LMT and single gate on p-type well and p-type epitaxial layer. Also this sensor is for use in a magnetic field sensor system according to the invention. The LMT 500 of the second embodiment in FIGS. 13a and 13b is layouted substantially similar as the LMT 500 of the first embodiment in FIGS. 11a and 11b, except for the layout of the gate structure. Instead of the gate structure 120 in the LMT 500 of the first embodiment, in the LMT 500 of the second embodiment, the gate structure 120 is extended so as to further surround the first and the second contact $B_1$ and $B_2$ areas.

FIGS. 14a and 14b show one instance of a fourth embodiment of a lateral magneto transistor (LMT) 500 as an example of a magnetic field sensor 100, namely a MOS-gated NPN LMT with far STI and dual gate on p-type well and p-type epitaxial layer. Also this sensor is for use in a magnetic field sensor system according to the invention. The LMT 500 of the fourth embodiment in FIGS. 14a and 14b is layouted substantially similar as the LMT 500 of the third embodiment in FIGS. 13a and 13b, except for the layout of the emitter structure and that of the gate structure and its electrical connection. Instead of the one emitter structure 110 in the LMT 500 of the third embodiment, in the LMT 500 of the fourth embodiment, the emitter structure comprises a first portion emitter structure 112 and a second portion emitter structure 114, which are arranged on opposite sides of the symmetry plane 106 so as to be substantially mirror images of one another and which can be electrically contacted individually. Further, instead of the one gate structure 120 in the LMT 500 of the third embodiment, in the LMT 500 of the fourth embodiment, the gate structure comprises a first gate structure 120 and a second gate structure 122. The second gate structure 122 is formed between the first portion emitter structure 112 and the second portion emitter structure 114 and can be electrically contacted individually. The first gate structure 120 is formed so as to surround the first and second B1 and B2 contact 128 and 130 p+ areas, the emitter structures 112 and 114 and the collector structures 116 and 118 and to be between the first portion emitter structure 112 and the first collector structure 116 and also between the second portion emitter structure 114 and the second collector structure 118 and can be electrically contacted individually and separately from the second gate structure 122.

FIGS. 15a and 15b show one instance of a fifth embodiment of a lateral magneto transistor (LMT) 500 as an example of a magnetic field sensor 100, namely a MOS-gated NPN LMT and single gate on p-type well and p-type epitaxial layer. Also this sensor is for use in a magnetic field sensor system according to the invention. The LMT 500 of the fifth embodiment in FIGS. 15a and 15b is layouted substantially similar as the LMT 500 of the fourth embodiment in FIGS. 14a and 14b, except for the electrical connection of the gate structures. Instead of the two individual and separately connectable first and second gate structures 120 and 122 in the LMT 500 of the fourth embodiment, in the LMT 500 of the fifth embodiment, the gate structure is comprised of only one externally connectable gate structure 120, which can be seen to comprise the first and second gate structures 120 and 122 of the fourth embodiment of FIGS. 14a and 14b.

According to the invention and as already stated above, the presently proposed approach toward offset cancellation is to combine one magnetic field sensor (in the following called the first magnetic field sensor 100) that is operated double-sided (as mentioned above and as will be explained in more detail below), i.e. via its first and second collector structures 116 and 118, with two additional identically layouted sensors (in the following called the second magnetic field sensor 200 and the third magnetic field sensor 300) that are each operated single-sided, i.e. via only a respective one of their collector structures and that are arranged in close vicinity to the first sensor 100 on the SOI substrate. The combination of the first magnetic field sensor 100 that is double-sidedly operated with the two additional sensors, viz. the second and the third magnetic field sensors 200 and 300, is shown in FIGS. 16a and 16b. In this example, three instances of the LMT 500 of the fifth embodiment shown in FIGS. 15a and 15b are used in combination.

In FIG. 16a, the first magnetic field sensor 100 is operated double-sided in that an electric current is injected via the (n+-type, 502) emitter structures 112 and 114, which are externally connected to thus form a combined single emitter structure. Due to the symmetric layout the injected current is separated in two current portions. The first current portion is registered at the (n+-type, 502) first collector structure 116 after it has passed through a portion of the p-type well 508, which portion is attributed a first current path 124. The second current portion is registered at the (n+-type, 502) second collector structure 118 after it has passed through another portion of the p-type well 508, which portion is attributed a second current path 126. The second magnetic field sensor 200 is operated single-sided in that an electric current is injected via its second emitter structure 214 and registered at its second collector structure 218 after it has passed through a portion of its p-type well 508, which portion is attributed a second current path 226 and which is analogue to the second current path 126 in the first magnetic field sensor 100. The third magnetic field sensor 300 is operated single-sided in that an electric current is injected via its first emitter structure 312 and registered at its first collector structure 316 after it has passed through a portion of its p-type well 508, which portion is attributed a first current path 324 and which is analogue to the first current path 124 in the first magnetic field sensor 100.

In FIG. 16b, the first magnetic field sensor 100 is operated as in FIG. 16a. However, contrary to the situation in FIG. 16a, the second magnetic field sensor 200 is operated single-sided in that an electric current is injected via its first emitter structure 212 and registered at its first collector structure 216 after it has passed through a portion of its p-type well 508, which portion is attributed a first current path 224 and which is analogue to the first current path 124 in the first magnetic field sensor 100. Also contrary to the situation in FIG. 16a, the third magnetic field sensor 300 is operated single-sided in that an electric current is injected via its second emitter structure 314 and registered at its second collector structure 318 after it has passed through a portion of its p-type well 508, which portion is attributed a second current path 326 and which is analogue to the second current path 126 in the first magnetic field sensor 100.

In both FIGS. 16a and 16b, by virtue of the differential current, i.e. the difference between the first and the second current portions, the first magnetic field sensor 100 is sensitive to the magnetic flux density B. And by virtue of the single-sided operation, the second and the third magnetic field sensors 200 and 300 are not sensitive to the magnetic flux density B and can therefore be called dummy structures. Because of the occurrence of two pn-junctions on each of the first and second current path in each of the three lateral magneto transistors 500 which together form the magnetic field sensor system 10 shown in the FIGS. 16a and 16b, this LMT 500 based sensor system 10 of the FIGS. 16a and 16b cannot be operated in a resistance detection mode which in particular involves a Wheatstone bridge type circuit 20 (see FIGS. 4a and 4b, and 5a and 5b) as can the LMR 400 based sensor system 10 of the FIGS. 3a and 3b. Rather, the LMT 500 based sensor system 10 can be operated in a current detection mode, in which the electrical currents that flow through the first and second current path 124 and 126 of the first magnetic field sensor 100 shown in FIGS. 16a and 16b are detected and the differential (difference of currents) signal, which is a measure for magnetic flux density B, is formed and amplified. Aiming to obtain a compensation of the current offset, the differential current signal obtained from the LMT 500-based first magnetic field sensor 100 (which is operated double-sided) is combined with signals relating to the electric current that flows along the current path 224 in the second magnetic field sensor 200 and the electric current that floes along the current path 326 in the third magnetic field sensor 300, or alternatively the electric currents that flow along the current path 226 and along the current path 324 respectively in the second and third magnetic field sensor 200 and 300 (each of which is operated single-sided), as shown in FIG. 17.

FIG. 17 shows a sensor system 10 (triplet configuration) comprising a first, second and third magnetic field sensor 100, 200 and 300 (as exemplified in FIGS. 16a and 16b), which are electrically connected together so that a chopped differential current read-out circuitry is formed which is suitable for obtaining a signal that is a measure for the magnetic flux density B and that is output from a circuitry that achieves offset compensation. In particular, the sensor system 10 shown in FIG. 17 comprises a chopped differential magnetic field sensor read-out circuitry, which comprises, in addition to the first, second and third magnetic field sensor 100, 200 and 300, a switchable 1-to-2 multiplexer 670, a first differential amplifier 680, a switchable 2-to-1 multiplexer 684, a second differential amplifier 691, a third differential amplifier 695, and clock circuitry, and which is adapted to provide a sensor output signal 99 that is a measure for the magnetic flux density B. The elements 100, 200, 300, 683, 684, 691 and 695 of the sensor read-out circuitry are interconnected as follows.

The switchable 1-to-2 multiplexer 670 has a first and second input terminal 671 and 672 and a first to fourth output terminal 673, 674, 675 and 676, and is adapted to be switchable into an "a"-state and alternatively into a "b"-state. The first and second input terminals 671 and 672 are connected to a current source (I). The first output terminal 673 is connected to the first collector structure 216 of the second magnetic field sensor 200. The second output terminal 674 is connected to the second collector structure 218 of the second magnetic field sensor 200. The third output terminal 675 is connected to the second collector structure 318 of the third magnetic field sensor 300. And the fourth output terminal 676 is connected to the first collector structure 316 of the third magnetic field sensor 300. Further, in the "a"-state, the first input terminal 672 is connected to the second output terminal 674 and the second input terminal 672 is connected to the fourth output terminal 676, while in the "b"-state, the first input terminal 672 is connected to the first output terminal 673 and the second input terminal 672 is connected to the third output terminal 675.

The first differential amplifier 680 comprises a "+"-type input terminal 681, a "−"-type input terminal 682 and an output terminal 683. The "+"-type input terminal 681 is coupled to one of the first and second collector structure 116, 118 of the first magnetic field sensor 100. The "−"-type input terminal 682 is coupled to the other one of the first and second collector structure 118, 116 of the first magnetic field sensor 100.

The switchable 2-to-1 multiplexer 684 comprises a first to fourth input terminal 685, 686, 687, 688 and a first and a second output terminal 689, 690, and is adapted to be switchable into an "a"-state and alternatively into a "b"-state. In the "a"-state, the first input terminal 685 is connected to the first output terminal 689 and the third input terminal 687 is connected to the second output terminal 690. In the "b"-state, the second input terminal 86 is connected to the first output terminal 689 and the fourth input terminal 88 is connected to the second output terminal 690. The first input terminal 685 is coupled to the second collector structure 218 of the second magnetic field sensor 200. The second input terminal 86 is coupled to the second collector structure 318 of the third magnetic field sensor 300. The third input terminal 687 is coupled to the first collector structure 316 of the third magnetic field sensor 300. The fourth input terminal 688 is coupled to the first collector structure 216 of the second magnetic field sensor 200. The clock circuitry (not shown) is adapted to switch the 2-to-1 multiplexer 684 sequentially from its "a"-state to its "b"-state, from its "b"-state to its "a"-state, and so on.

The second differential amplifier 691 comprises a "+"-type input terminal 692, a "−"-type input terminal 693 and an output terminal 694. The "−"-type input terminal 693 is coupled to first output terminal 689 of the 2-to-1 multiplexer 684, and the "+"-type input terminal 692 is coupled to second output terminal 90 of the 2-to-1 multiplexer 684.

The third differential amplifier 695 comprises a "+"-type input terminal 96, a "−"-type input terminal 697 and an output terminal 698. The "+"-type input terminal 696 is coupled to output terminal 683 of the first differential amplifier 680, the "−"-type input terminal 697 is coupled to output terminal 694 of the second differential amplifier 691, and the output terminal 698 provides the sensor output signal 699.

Due to the afore-mentioned mutual interconnection of the elements 100, 200, 300, 683, 684, 691 and 695 of the sensor read-out circuitry, the signal that is output from the output terminal 683 of the first differential amplifier 680 represents the output signal from the first magnetic field sensor 100 plus its offset (or as stated in FIG. 17: "sensor signal+ offset1"). The signal that is output from the output terminal 694 of the second differential amplifier 691 represents the offset that is output signal from the dummy second and third magnetic field sensors 200 and 300 (or as stated in FIG. 17: "offset2"). Depending on the state, i.e. "a"-state or "b"-state, of the switchable 2-to-1 multiplexer 684, the afore-mentioned signals assume values as indicated in the following table:

| state of multiplexer 684 (S1) | signal + offset 1 | offset2 |
|---|---|---|
| a | $I_{C1}-I_{C2}$ $(=I_{124}-I_{126})$ | $I_{C''1}-I_{C2}$ $(=I_{324}-I_{226})$ |
| b | $I_{C1}-I_{C2}$ $(=I_{124}-I_{126})$ | $I_{C1}-I_{C''2}$ $(=I_{224}-I_{326})$ |

In the "a"-state of the switchable 2-to-1 multiplexer 684, the first, second and third magnetic field sensors 100, 200 and 300 are interconnected and operated in the modus shown in FIG. 16a, whereas in the "b"-state of the multiplexer 684, the first, second and third magnetic field sensors 100, 200 and 300 are interconnected and operated in the modus shown in FIG. 16b. The chopping resp. the alternative switching in the switchable 2-to-1 multiplexer 684 between the "a"-state and the "b"-state provides for an averaging, sequentially in time, of the two offset compensation modi shown in FIGS. 16a and 16b. The signal that is output from the output terminal 698 of the third differential amplifier 695 represents the offset compensated output signal from the magnetic field sensor system 10 that is a measure of the magnetic flux density B, namely and as stated in FIG. 17: "sensor signal+offset1−offset2").

The chopped operation of the switchable 2-to-1 multiplexer 684 shown in FIG. 17 is analogous to the chopped operation of the first and second 1-to-2 multiplexers 40 and 60 shown in FIG. 6 in the sense that the chopped operation provides for an averaging, sequentially in time, of the operation configurations of the two dummy (second and third) magnetic field sensors 200 and 300 as shown, respectively, in FIGS. 3a and 3b (involving LMR 400 based sensors 100, 200, 300) and in FIGS. 16a and 16b (involving LMT 500 based sensors 100, 200, 300).

As a further alternative to the configurations of the first to third magnetic field sensors 100 to 300 in the form of LMRs (lateral magneto resistors) 400 or LMTs (lateral magneto transistors) 500, the sensors 100 to 300 may also be configured as LMDs (lateral magneto diodes) 600. The FIGS. 18 to 24 show various embodiments of LMDs that can be employed in a magnetic field sensor system 10 according to the invention. FIGS. 25a and 25b illustrate the operation configurations of the LMD 600 based first magnetic field sensor 100 the two LMD 600 based, dummy (second and third) magnetic field sensors 200 and 300, in analogy to the LMR 400 based and the LMT 500 based operation configurations of first to third magnetic field sensors 100 to 300 shown, respectively, in the FIGS. 3a and 3b and in the FIGS.

16a and 16b. Since LMDs 600 can be operated in a resistance detection mode, the offset compensation of LMD based magnetic field sensor systems can be achieved by electrically connecting LMD 600-based first to third magnetic field sensors 100 to 300 in the form of a Wheatstone bridge type circuitry as shown e.g. in each of FIGS. 26 to 28 (in analogy to the Wheatstone bridge type circuitry 20 shown in FIGS. 4a (5a) and 4b (5b) for LMRs 400). In addition, LMDs 600 can be operated in a current or voltage detection mode, the offset compensation of LMD based magnetic field sensor systems can be achieved by electrically connecting LMD 600-based first to third magnetic field sensors 100 to 300 in the form of a chopped offset compensation differential read-out circuitry as shown e.g. in each of FIGS. 29 to 31 (in analogy to the chopped offset compensation differential read-out circuitry shown in FIG. 17 for LMTs 500).

The basic magnetodiode (LMD 600) structure involves a simpler device structure than for a magnetotransistor (LMT 500). An aim is to combine a high sensitivity with respect to the magnetic flux density B with a small offset. One may distinguish LMDs 600 which have a central n-type well structure 606, such as shown in FIGS. 18 to 22, and LMDs 600 which have a central p-type well structure 608, such as shown in FIGS. 23 and 24. In fact, another aim is to provide a lowly doped n-type or p-type (nearly intrinsic) well structure body, so as to obtain an $n^+$-i-$p^+$ (or the inverse $n^+$-i-$p^+$) diode.

FIGS. 18a to 18c show one instance of a first embodiment of a lateral magneto diode (LMD) 600 as an example of a magnetic field sensor 100, namely a MOS-gated N-body magneto diode on n-type well and n-type epitaxial layer 612. The sensor 100 is for use in a magnetic field sensor system according to the invention, which generally involves three instances (100, 200, 300, see FIGS. 25a and 25b) of the same magnetic field sensor. The LMB 600 based magnetic field sensor 100 shown in FIGS. 18a to 18c is manufactured using MOS (metal-oxide-semiconductor) technology performed on a SOI (silicon on oxide) substrate, which is commonly available. The substrate comprises handle wafer silicon 616 employed as a basis, an oxide layer that is deposited on the silicon and that becomes a buried oxide layer 614 after deposition of the next layer, and an n-type epitaxial layer 612 that is deposited on the oxide layer. The further structures which make up the LMD 600 are deposited on this substrate, namely on the epitaxial layer 612.

The LMD 600 further comprises an n-type well 606 that is formed in the n-type epitaxial layer 612 and that forms the surface layer portion 102 mentioned in the appended claims, and an MTI (medium trench isolation) structure 605, which that is a ring-shaped isolation that extends from the top surface of the epitaxial layer 610 down into the buried oxide layer 614, so that isolated islands are formed for the sensor structure inside the ring. The LMD 600 further comprises an emitter structure 110 that is made as an $n^+$-type structure 602 in the centre of the n-type well 606 and symmetrically with respect to a symmetry plane 106 which in turn is perpendicular to the surface 104 of the layers 612 and 606 and perpendicular to the plane of drawing of FIGS. 18a and 18c. The LMD 600 further comprises a first collector structure 116 and a second collector structure 118 that are each made as an $p^+$-type structure 603 in the n-type well 606, on opposite sides of the symmetry plane 106 and such that the first and the second collector structure 116 and 118 are mirror images of each other with respect to the symmetry plane 106.

The LMD 600 further comprises a ring-type STI (shallow trench isolation) area 607 that is formed in an essentially rectangular shape so as to surround the emitter structure 110 and the first and second collector structures 116 and 118. Then, the LMD 600 comprises a gate structure 120 that is formed of polysilicon 601 and deposited on the surface of the n-type well 606 in the area between the emitter structure 110 and the first collector structure 116, the area between the emitter structure 110 and the second collector structure 118, and in an area surrounding the emitter and collector structures 110, 116 and 118, see FIG. 18c.

In use of the magnetic field sensor 100 as an LMD 600-type magnetic field sensor, an electric current formed by electrons as the charge carriers is injected via the emitter structure 110 into the n-type well 606. There, the current is divided in two portions having opposite directions, a first current portion flowing to the first collector structure 116 and a second current portion flowing to the second collector structure 118. The first and second current portions are collected at the collector structures 116 and 118, respectively. When the diodes are biased (by applying a suitable external voltage) in their forward mode, the first and second collector structures 116 and 118 are injecting holes into the n-type well 606, which will travel to the emitter structure 110 in a direction opposite to the electrons from the emitter. When a magnetic flux density B is applied in a lateral direction and in the symmetry plane 106 (i.e. perpendicular into the plane of drawing of FIG. 18a, as indicated by B in FIG. 18a), the first and the second current portions are influenced by the Lorentz force acting on the electrons and deviated in opposite directions, respectively, one current portion being deviated closer to the surface and the other current portion being deviated away from the surface. This leads to a difference of the currents that are collected at the first and the second collector structure 116 and 118, which causes at the collector structures 116 and 118 a differential current signal that is a measure for the magnetic flux density B.

As the polarity of holes is opposite to that of electrons, the Lorenz force acting on both charge carrier types is similar and enhances the differential signal compared to the electrons' signal. The path of the current flow from the ($n^+$-type 602) emitter structure 110 through the (n-type, nearly intrinsic) well 606 to the first or second ($p^+$-type 603) collector structure 116 or 118 can be characterized as $n^+$-i-$p^+$ and involve a diode transition, as is indicated in schematic (circuit diagram type) representation of the LMT 600 in FIG. 18b. The n-type well 606 is formed in the n-type epitaxial layer 612 for shielding interface defects present at the interface with the buried oxide layer 614. The gate structure 120 made of polysilicon 601 may be connected to a negatively biasing electrical potential that can be adjusted so as to push the charge carriers, i.e. the electrons, into the volume and deplete the surface layers so as to avoid surface carrier flow from the emitter. For the reasons mentioned above and as will be explained below, the differential current signal may be superimposed by an offset current signal. The offset current signal is significant in magnitude and is to be compensated and/or cancelled, as will be explained further below with reference to FIGS. 26 to 28 and FIGS. 29 to 31.

FIGS. 19a to 19c show one instance of a second embodiment of a lateral magneto diode (LMD) 600 as an example of a magnetic field sensor 100, namely a MOS-gated N-body magneto diode with dual emitter on n-type well and n-type epitaxial layer 612. Also this sensor is for use in a magnetic field sensor system according to the invention. The LMD 600 of the second embodiment in FIGS. 19a to 19c is layouted substantially similar as the LMD 600 of the first embodiment in FIGS. 18a to 18c, except for the layout of the emitter structure and that of the gate structure and its electrical connection. Instead of the one emitter structure 110 in the LMD 600 of the first embodiment, in the LMD 600 of the second embodiment, the emitter structure comprises a first portion emitter structure 112 and a second portion emitter structure 114, which are arranged on opposite sides of the symmetry plane 106 so as to be substantially mirror images of one another and which can be electrically contacted individually. Further, instead of the one gate structure 120 in the LMD 600 of the first embodiment, in the LMD 600 of the second embodiment, the gate structure comprises a first gate structure 120 and a second gate structure 122. The second gate structure 122 is formed between the first portion emitter structure 112 and the second portion emitter structure 114 and can be electrically contacted individually. The first gate structure 120 is formed so as to surround the emitter structures 112 and 114 and the collector structures 116 and 118 and to be between the first portion emitter structure 112 and the first collector structure 116 and also between the second portion emitter structure 114 and the second collector structure 118 and can be electrically contacted individually and separately from the second gate structure 122. The second gate structure 122 can be used to further control the offset and/or the sensitivity of the LMD 600.

For the LMD 600 with the dual gate (120 and 122) and double emitter (112 and 114) structure and having an n-type well 606, when the voltages applied at the first and second gate structures 120 and 122 are negative, the surface of the n-type well 606 everywhere, including between the first and second emitter structure 112 and 114 in FIG. 19, is depleted or even inverted. Then, there are the two separate emitter structures 112 and 114. When the voltage at the second gate structure 122 is positive, the surface of the n-type well 606 between the first and second emitter structure 112 and 114 is accumulated. In this case, effectively, the first and second emitter structures 112 and 114 become one wide emitter, due to which the sensitivity will drop. Nevertheless, such operation enables to operate a modulation scheme for offset compensation, from which the offset can be extracted or reduced.

FIGS. 20a to 20c show one instance of a third embodiment of a lateral magneto diode (LMD) 600 as an example of a magnetic field sensor 100, namely a MOS-gated N-body magneto diode on n-type well 606 and n-type epitaxial layer 612. Also this sensor is for use in a magnetic field sensor system according to the invention. The LMD 600 of the third embodiment in FIGS. 20a to 20c is layouted substantially similar as the LMD 600 of the first embodiment in FIGS. 18a to 18c, except for the doping type of the emitter and collector structures. Contrary to the emitter structure 110 in FIG. 18, which is of n$^+$-type 602, the emitter structure 110 in FIG. 20 is of p$^+$-type 603. And contrary to the first and second collector structures 116 and 118 in FIG. 18, which are of p$^+$-type 603, the first and second collector structures 116 and 118 in FIG. 20 are of n$^+$-type 602. Accordingly and as is indicated in FIG. 18b and FIG. 20b, the diode transition shifts from the collector (116, 118)-well (606) transition in the first embodiment of FIG. 18 to the emitter (110)-well (606) transition in the third embodiment of FIG. 20.

FIGS. 21a to 21c show one instance of a fourth embodiment of a lateral magneto diode (LMD) 600 as an example of a magnetic field sensor 100, namely a MOS-gated N-body magneto diode with dual emitter on n-type well and n-type epitaxial layer 612. Also this sensor is for use in a magnetic field sensor system according to the invention. The LMD 600 of the fourth embodiment in FIGS. 21a to 21c is layouted substantially similar as the LMD 600 of the second embodiment in FIGS. 19a to 19c, except for the doping type of the emitter and collector structures. Contrary to the emitter structures 112 and 114 in FIG. 19, which are of n$^+$-type 602, the emitter structures 112 and 114 in FIG. 21 are of p$^+$-type 603. And contrary to the first and second collector structures 116 and 118 in FIG. 19, which are of p$^+$-type 603, the first and second collector structures 116 and 118 in FIG. 21 are of n$^+$-type 602. Accordingly and as is indicated in FIG. 19b and FIG. 21b, the diode transition shifts from the collector (116, 118)-well (606) transition in the second embodiment of FIG. 19 to the emitter (110)-well (606) transition in the fourth embodiment of FIG. 21.

FIGS. 22a to 22c show one instance of a fifth embodiment of a lateral magneto diode (LMD) 600 as an example of a magnetic field sensor 100, namely a MOS-gated N-body magneto diode with dual emitter on n-type well and p-type epitaxial layer 610. Also this sensor is for use in a magnetic field sensor system according to the invention. The LMD 600 of the fifth embodiment in FIGS. 22a to 22c is layouted substantially similar as the LMD 600 of the fourth embodiment in FIGS. 21a to 21c, except for the layout of the STI area 607. Contrary to the STI area 607 in FIG. 21, the STI area 607 in FIG. 22 is divided into an inner and an outer area, which are spaced apart and between which there is further provided a P-contact structure of p$^+$-type 603, see FIGS. 22a and 22c.

FIGS. 23a to 23c show one instance of a sixth embodiment of a lateral magneto diode (LMD) 600 as an example of a magnetic field sensor 100, namely a MOS-gated P-body magneto diode on p-type well 608 and p-type epitaxial layer 610. Also this sensor is for use in a magnetic field sensor system according to the invention. The LMD 600 of the sixth embodiment in FIGS. 23a to 23c is layouted substantially similar as the LMD 600 of the first embodiment in FIGS. 18a to 18c, except for the doping type of the well and the epitaxial layers. Contrary to the well in FIG. 18, which is of n-type 606, the well in FIG. 23 is of p-type 603. And contrary to the epitaxial layer in FIG. 18, which is of n-type 612, the epitaxial layer in FIG. 20 is of p$^+$ type 610. Accordingly and as is indicated in FIG. 18b and FIG. 23b, the diode transition shifts from the collector (116, 118) well (608) transition in the first embodiment of FIG. 18 to the emitter (110)-well (608) transition in the sixth embodiment of FIG. 23.

FIGS. 24a to 24c show one instance of a seventh embodiment of a lateral magneto diode (LMD) 600 as an example of a magnetic field sensor 100, namely a MOS-gated P-body magneto diode with dual emitter on p-type well and p-type epitaxial layer 610. Also this sensor is for use in a magnetic field sensor system according to the invention. The LMD 600 of the seventh embodiment in FIGS. 24a to 24c is layouted substantially similar as the LMD 600 of the sixth embodiment in FIGS. 23a to 23c, except for the layout of the emitter structure and that of the gate structure and its electrical connection. Instead of the one emitter structure 110 in the LMD 600 of the sixth embodiment, in the LMD 600 of the seventh embodiment, the emitter structure comprises a first portion emitter structure 112 and a second portion emitter structure 114, which are arranged on opposite sides of the symmetry plane 106 so as to be substantially mirror images of one another and which can be electrically contacted individually. Further, instead of the one gate structure 120 in the LMD 600 of the sixth embodiment, in the LMD 600 of the seventh embodiment, the gate structure comprises a first gate structure 120 and a second gate structure 122. The second gate structure 122 is formed between the first portion emitter structure 112 and the second portion emitter structure 114 and can be electrically contacted individually. The first gate structure 120 is formed so as to surround the emitter structures 112 and 114 and the collector structures 116 and 118 and to be between the first portion emitter structure 112 and the first collector structure 116 and also between the second portion emitter structure 114 and the second collector structure 118 and can be electrically contacted individually and separately from the second gate structure 122. The second gate structure 122 can be used to further control the offset and/or the sensitivity of the LMD 600.

For the LMD 600 with the dual gate (120 and 122) and double emitter (112 and 114) structure and having an p-type well 608, when the voltages applied at the first and second gate structures 120 and 122 are negative, the surface of the p-type well 608 everywhere, including between the first and second emitter structure 112 and 114 in FIG. 24, is accumulated. Then, there are the two separate emitter structures 112 and 114. When the voltage at the second gate structure 122 is positive, the surface of the p-type well 608 between the first and second emitter structure 112 and 114 is depleted or even inverted. In this case, upon inversion, effectively, the first and second emitter structures 112 and 114 become one wide emitter, due to which the sensitivity will drop. Nevertheless, such operation enables to operate a modulation scheme for offset compensation, from which the offset can be extracted or reduced, as is explained in the following.

According to the invention and as already stated above, the presently proposed approach toward offset cancellation is to combine one magnetic field sensor (in the following called the first magnetic field sensor 100) that is operated double-sided (as mentioned above and as will be explained in more detail below), i.e. via its first and second collector structures 116 and 118, with two additional identically layouted sensors (in the following called the second magnetic field sensor 200 and the third magnetic field sensor 300) that are each operated single-sided, i.e. via only a respective one of their collector structures and that are arranged in close vicinity to the first sensor 100 on the SOI substrate. The combination of the first magnetic field sensor 100 that is double-sidedly operated with the two additional sensors the second and the third magnetic field sensors 200 and 300, is shown in FIGS. 25*a* and 25*b* using as an example three instances of the LMD 600 of the seventh embodiment shown in FIGS. 24*a* to 24*c*.

In FIG. 25*a*, the first magnetic field sensor 100 is operated double-sided in that an electric current is injected via the (n⁺-type, 602) emitter structures 112 and 114 and—due to the symmetric layout—separated in two current portions. The first current portion is registered at the (n⁺-type, 602) first collector structure 116 after it has passed through a portion of the p-type well 608, which portion is attributed a first current path 124. The second current portion is registered at the (n⁺-type, 602) second collector structure 118 after it has passed through another portion of the p-type well 608, which portion is attributed a second current path 126. The second magnetic field sensor 200 is operated single-sided in that an electric current is injected via its second emitter structure 214 and registered at its second collector structure 218 after it has passed through a portion of its p-type well 608, which portion is attributed a second current path 226 and which is analogue to the second current path 126 in the first magnetic field sensor 100. The third magnetic field sensor 300 is operated single-sided in that an electric current is injected via its first emitter structure 312 and registered at its first collector structure 316 after it has passed through a portion of its p-type well 608, which portion is attributed a first current path 324 and which is analogue to the first current path 124 in the first magnetic field sensor 100.

In FIG. 25*b*, the first magnetic field sensor 100 is operated as in FIG. 25*a*. However, contrary to the situation in FIG. 25*a*, the second magnetic field sensor 200 is operated single-sided in that an electric current is injected via its first emitter structure 212 and registered at its first collector structure 216 after it has passed through a portion of its p-type well 608, which portion is attributed a first current path 224 and which is analogue to the first current path 124 in the first magnetic field sensor 100. Also contrary to the situation in FIG. 25*a*, the third magnetic field sensor 300 is operated single-sided in that an electric current is injected via its second emitter structure 314 and registered at its second collector structure 318 after it has passed through a portion of its p-type well 608, which portion is attributed a second current path 326 and which is analogue to the second current path 126 in the first magnetic field sensor 100.

In both FIGS. 25*a* and 25*b*, by virtue of the differential current, i.e. the difference between the first and the second current portions, the first magnetic field sensor 100 is sensitive to the magnetic flux density B. And by virtue of the single-sided operation, the second and the third magnetic field sensors 200 and 300 are not sensitive to the magnetic flux density B and can therefore be called dummy structures. Because of the occurrence of two pn-junctions as well as a diode transition on each of the first and second current path in each of the three lateral magneto diodes 600 which together form the magnetic field sensor system 10 shown in the FIGS. 25*a* and 25*b*, this LMD 600 based sensor system 10 of the FIGS. 25*a* and 25*b* can be operated in a resistance detection mode which in particular involves a Wheatstone bridge type circuit 20 (see FIGS. 26 to 28, analogue to FIGS. 4*a* and 4*b* and FIGS. 5*a* and 5*b*) as can the LMR 400 based sensor system 10 of the FIGS. 3*a* and 3*b*. In addition, the LMD 600 based sensor system 10 can be operated in a current detection mode, in which the electrical currents that flow through the first and second current path 124 and 126 of the first magnetic field sensor 100 shown in FIGS. 25*a* and 25*b* are detected and the differential (difference of currents) signal, which is a measure for magnetic flux density B, is formed and amplified. Aiming to obtain a compensation of the current offset, the differential current signal obtained from the LMD 600-based first magnetic field sensor 100 (which is operated double-sided) is combined with signals relating to the electric current that flows along the current path 224 in the second magnetic field sensor 200 and the electric current that floes along the current path 326 in the third magnetic field sensor 300, or alternatively the electric currents that flow along the current path 226 and along the current path 324 respectively in the second and third magnetic field sensor 200 and 300 (each of which is operated single-sided), as shown in FIGS. 26 to 28.

FIG. 26 shows a magnetic field sensor structure 10 formed by the electrical connection of the two dummy structure magnetic field sensors 200 and 300 to the first magnetic field sensor 100 of FIGS. 19*a* to 19*c* in the form of a Wheatstone bridge type circuit 20. In particular, the LMD 600 based first, second and third magnetic field sensor 100, 200 and 300 are externally connected in the form of a Wheatstone bridge type circuitry 20, in which a first voltage divider 22 and a second voltage divider 24 are coupled between a, for example positive, supply voltage level 36 and a common ground voltage level 38. The Wheatstone bridge type circuit 20 involving LMD 600 based first to third magnetic field sensors 100 to 300 shown in FIG. 26 is analoguous to the Wheatstone bridge type circuit 20 involving LMR 400 based first to third magnetic field sensors 100 to 300 shown in FIGS. 4 and 5.

In FIG. 26, the first voltage divider 22 comprises a structure comprising the first collector structure 216 and the emitter structure 212 of the second magnetic field sensor 200, and a structure comprising the first collector structure 116 and the emitter structure 112 of the first magnetic field sensor 100. In the first voltage divider 22, the first collector structure 216 of the second magnetic field sensor 200 is coupled to the supply voltage level 36, the emitter structure 212 of the second magnetic field sensor 200 is coupled to the first collector structure 116 of the first magnetic field sensor 100 and the emitter structure 112 of the first magnetic field sensor 100 is coupled to the common ground voltage level 38. The second voltage divider 24 comprises a structure comprising the second collector structure 318 and the emitter structure 314 of the third magnetic field sensor 300, and a structure comprising the second collector structure 118 and the emitter structure 114 of the first magnetic field sensor 100. In the second voltage divider 24, the second collector structure 318 of the third magnetic field sensor 300 is coupled to the supply voltage level 36, and the emitter structure 314 of the third magnetic field sensor 300 is coupled to the second collector structure 118 of the first magnetic field sensor 100, and the emitter structure 114 of the first magnetic field sensor 100 is coupled to the common ground voltage level 38 and thereby also to the other emitter structure 112 of the first magnetic field sensor 100.

The sensor system 10 of FIG. 26 further comprises a differential voltage output terminal, which in turn comprises a first voltage output terminal 28 and a second voltage output terminal 30. The first voltage output terminal 28 is coupled to a first node 32 in the connection between the emitter structure 212 of the second magnetic field sensor 200 and the first collector structure 116 of the first magnetic field sensor 100. The second voltage output terminal 30 is coupled to a second node 34 in the connection between the emitter structure 314 of the third magnetic field sensor 300 and the second collector structure 118 of the first magnetic field sensor 100.

In the Wheatstone bridge type 20 electrical connection between the first magnetic field sensor 100 and the second and third magnetic field sensors 200 and 300 of FIG. 25b, the first current path 124 of the first magnetic field sensor 100 is compensated by the analogous first current path 224 of the second magnetic field sensor 200, and the second current path 126 of the first magnetic field sensor 100 is compensated by the analogous second current path 326 of the third magnetic field sensor 300. The differential signal $V_{out}$ at the differential output, viz. the difference of the signal at the output 28 and the signal at the output 30 in FIG. 26, is a measure for the magnetic flux density B, whereby a compensation of the systematic offsets of the first and second current paths 124 and 126 in the first magnetic field sensor 100 is achieved by the electrical coupling as shown in FIG. 26 with the first current path 224 in the second magnetic field sensor 200 and the second current path 326 in the third magnetic field sensor 300.

FIG. 27 shows a magnetic field sensor structure 10 formed by the electrical connection of the two dummy structure magnetic field sensors 200 and 300 to the first magnetic field sensor 100 of FIGS. 21a to 21c in the form of a Wheatstone bridge type circuit 20. The Wheatstone bridge type circuit 20 involving LMD 600 based first to third magnetic field sensors 100 to 300 shown in FIG. 27 and its functioning are analoguous to the Wheatstone bridge type circuit 20 involving LMD 600 based first to third magnetic field sensors 100 to 300 shown in FIG. 26, and its description is the same as that for the circuit shown in FIG. 26, so that it shall not be repeated here.

FIG. 28 shows a magnetic field sensor structure 10 formed by the electrical connection of the two dummy structure magnetic field sensors 200 and 300 to the first magnetic field sensor 100 of FIGS. 24a to 24c in the form of a Wheatstone bridge type circuit 20. The Wheatstone bridge type circuit 20 involving LMD 600 based first to third magnetic field sensors 100 to 300 shown in FIG. 28 and its functioning are analoguous to the Wheatstone bridge type circuit 20 involving LMD 600 based first to third magnetic field sensors 100 to 300 shown in FIGS. 26 and 27, and its description is the same as that for the circuit shown in FIG. 26, so that it shall not be repeated here.

The person skilled in the art will appreciate that the further schemes of compensating and averaging offset in a magnetic field sensor system 10 comprising triplet configurations comprising a double-sidedly operated first magnetic field sensor 100 and two single-sidedly operated (dummy) second and third magnetic field sensors 200 and 300, which are electrically connected together in the form of Wheatstone bridge type circuit and are implemented as LMRs 400, as disclosed above with reference to the FIGS. 6 to 9, can also and similarly be implemented for triplet configurations comprising first to third magnetic field sensors 100 to 300, which are electrically connected together in the form of Wheatstone bridge type circuit and are implemented as LMRs 600. The description of such LMD 600 based triplet configurations and the offset compensation and averaging schemes are the same as for the LMR 400 based triplet configurations provided with reference to the FIGS. 6 to 9, so that these shall not be repeated here.

FIGS. 29 to 31 show sensor systems 10 (triplet configuration) comprising a LMD 600 based first, second and third magnetic field sensor 100, 200 and 300 (as exemplified in FIGS. 25a and 25b), which are electrically connected together so that a chopped differential current read-out circuitry is formed which is suitable for obtaining a signal that is a measure for the magnetic flux density B and that is output from a circuitry that achieves offset compensation, in analogy to the offset compensated, LMR 400 based sensor system 10 disclosed with reference to FIG. 17. In particular, the sensor systems 10 shown in each of FIGS. 29 to 31 comprises a chopped differential magnetic field sensor read-out circuitry, which comprises, in addition to the LMD 600 based first, second and third magnetic field sensor 100, 200 and 300, a switchable 1-to-2 multiplexer 670, a first differential amplifier 680, a switchable 2-to-1 multiplexer 684, a second differential amplifier 691, a third differential amplifier 695, and clock circuitry, and which is adapted to provide a sensor output signal 699 that is a measure for the magnetic flux density B. In the sensor system 10 shown in FIG. 29, the first to third magnetic field sensor 100 to 300 are implemented in the form of the LMD 600 according to the second embodiment shown in FIGS. 19a to 19c. In the sensor system 10 shown in FIG. 30, the sensors 100 to 300 are implemented in the form of the LMD 600 according to the fourth embodiment shown in FIGS. 21a to 21c. Finally, in the sensor system 10 shown in FIG. 31, the sensors 100 to 300 are implemented in the form of the LMD 600 according to the seventh embodiment shown in FIGS. 24a to 24c. The elements 100, 200, 300, 670, 680, 684, 691 and 695 of the sensor read-out circuitry are interconnected as follows.

The first differential amplifier 680 comprises a "+"-type input terminal 681, a "−"-type input terminal 682 and an output terminal 683. The "+"-type input terminal 681 is coupled to one of the first and second collector structure 116, 118 of the first magnetic field sensor 100. The "−"-type input terminal 682 is coupled to the other one of the first and second collector structure 118, 116 of the first magnetic field sensor 100.

The switchable 1-to-2 multiplexer 670 comprises a first and a second input terminal 671 and 672, and a first to fourth output terminal 673, 674, 675, 676, and is adapted to be switchable into an "a"-state and alternatively into a "b"-state. Both, the first and second input terminals 671 and 672 are, through a current source I, connected to a supply voltage (not referenced in the FIGS. 29 to 31). In the "a"-state, the first input terminal 671 is connected to the second output terminal 674 and the second input terminal 672 is connected to the fourth output terminal 676. In the "b"-state, the first input terminal 671 is connected to the first output terminal 673 and the second input terminal 672 is connected to the third output terminal 675. The first output terminal 673 is coupled to the first emitter structure 212 of the second magnetic field sensor 200. The second output terminal 674 is coupled to the second emitter structure 214 of the second magnetic field sensor 200. The third output terminal 675 is coupled to the second emitter structure 314 of the third magnetic field sensor 300. And the fourth output terminal 676 is coupled to the first emitter structure 312 of the third magnetic field sensor 300.

The switchable 2-to-1 multiplexer 684 comprises a first to fourth input terminal 685, 686, 687, 688 and a first and a second output terminal 689, 690, and is adapted to be switchable into an "a"-state and alternatively into a "b"-state. In the "a"-state, the first input terminal 685 is connected to the first output terminal 689 and the third input terminal 687 is connected to the second output terminal 690. In the "b"-state, the second input terminal 686 is connected to the first output terminal 689 and the fourth input terminal 688 is connected to the second output terminal 690. The first input terminal 685 is coupled to the second collector structure 218 of the second magnetic field sensor 200. The second input terminal 686 is coupled to the second collector structure 318 of the third magnetic field sensor 300. The third input terminal 687 is coupled to the first collector structure 316 of the third magnetic field sensor 300. The fourth input terminal 688 is coupled to the first collector structure 216 of the second magnetic field sensor 200. The clock circuitry (not shown) is adapted to switch the 1-to-2 multiplexer 670 and the 2-to-1 multiplexer 684 sequentially and simultaneously from their "a"-state to their "b"-state, from their "b"-state to their "a"-state, and so on.

The second differential amplifier 691 comprises a "+"-type input terminal 692, a "−"-type input terminal 693 and an output terminal 694. The "−"-type input terminal 693 is coupled to first output terminal 689 of the 2-to-1 multiplexer 684, and the "+"-type input terminal 692 is coupled to second output terminal 690 of the 2-to-1 multiplexer 684.

The third differential amplifier 695 comprises a "+"-type input terminal 696, a "−"-type input terminal 697 and an output terminal 698. The "+"-type input terminal 696 is coupled to output terminal 683 of the first differential amplifier 680, the "−"-type input terminal 697 is coupled to output terminal 694 of the second differential amplifier 691, and the output terminal 698 provides the sensor output signal 699.

Due to the afore-mentioned mutual interconnection of the elements 100, 200, 300, 670, 683, 684, 691 and 695 of the sensor read-out circuitry, the signal that is output from the output terminal 683 of the first differential amplifier 680 represents the output signal from the first magnetic field sensor 100 plus its offset (or as stated in FIGS. 29 to 31: "sensor signal+offset1"). The signal that is output from the output terminal 694 of the second differential amplifier 691 represents the offset that is output signal from the dummy second and third magnetic field sensors 200 and 300 (or as stated in FIGS. 29 to 31: "offset2"). Depending on the state, i.e. "a"-state or "b"-state, of the combination of the switchable 1-to-2 multiplexer 670 and the switchable 2-to-1 multiplexer 684, the afore-mentioned signals assume values as indicated in the following table:

| state of multiplexer combination 670 and 684 (S1 and S2) | signal + offset 1 | offset2 |
| --- | --- | --- |
| a | $I_{C1}-I_{C2}$ (=$I_{124}-I_{126}$) | $I_{C''1}-I_{C'2}$ (=$I_{324}-I_{226}$) |
| b | $I_{C1}-I_{C2}$ (=$I_{124}-I_{126}$) | $I_{C'1}-I_{C''2}$ (=$I_{224}-I_{326}$) |

In the "a"-state of the switchable multiplexers 670 and 684, the first, second and third magnetic field sensors 100, 200 and 300 are interconnected and operated in the modus shown in FIG. 25a, whereas in the "b"-state of the multiplexers 670 and 684, the first, second and third magnetic field sensors 100, 200 and 300 are interconnected and operated in the modus shown in FIG. 25b. The chopping resp. the alternative switching in the switchable multiplexers 670 and 684 between the "a"-state and the "b"-state provides for an averaging, sequentially in time, of the two offset compensation modi shown in FIGS. 25a and 25b. The signal that is output from the output terminal 698 of the third differential amplifier 695 represents the offset compensated output signal from the magnetic field sensor system 10 that is a measure of the magnetic flux density B, namely and as stated in FIGS. 29 to 31: "sensor signal+offset1−offset2").

The chopped operation of the switchable multiplexer 670 and 684 shown in FIGS. 29 to 31 is analogous to the chopped operation of the switchable multiplexers 40 and 60 shown in FIG. 6 and the switchable multiplexers 670 and 684 shown in FIG. 17 in the sense that the copped operation provides for an averaging, sequentially in time, of the operation configurations of the two dummy (second and third) magnetic field sensors 200 and 300 as shown, respectively, in FIGS. 3a and 3b (involving LMR 400 based sensors 100, 200, 300) and in FIGS. 16a and 16b (involving LMT 500 based sensors 100, 200, 300).

Various embodiments of the invention may be considered in addition to the embodiments described hereinbefore. The embodiments described above shall be considered as examples for implementing the present invention. In addition to the embodiments of the invention described above, an examination of the specification, the detailed description and the appended drawings will show, that there are still other embodiments of the invention. Accordingly, many combinations, permutations, variations and modifications of the embodiments of the invention mentioned hereinbefore, even those which have not been mentioned hereinbefore, will nevertheless be comprised in the scope of the present invention as defined by the appended set of claims.

LIST OF REFERENCE NUMERALS 10 differential magnetic field sensor system
20 Wheatstone bridge type circuit
22 first voltage divider
24 second voltage divider
26 differential output terminal
28 first output terminal
30 second output terminal
32 first node
34 second node
36 supply voltage level, e.g. V+
38 common ground voltage level, e.g. GND
40 first 1-to-2 multiplexer
42 first input terminal
44 second input terminal
46 first output terminal
48 second output terminal
50 third output terminal
52 fourth output terminal
60 second 1-to-2 multiplexer
62 first input terminal
64 second input terminal
66 first output terminal
68 second output terminal
70 third output terminal
72 fourth output terminal
74 first state
76 second state
78 third state
100 first magnetic field sensor
102 surface layer portion
104 surface
106 symmetry plane
110, E emitter structure
112, E1 first portion emitter structure
114, E2 second portion emitter structure
116, C1 first collector structure
118, C2 second collector structure
120, G, G1 first gate structure
122, G2 second gate structure
124 first current path
126 second current path
128, B1 first base structure
130, B2 second base structure
132, P P contact
200 second magnetic field sensor
202 SOI layer portion
204 surface
206 symmetry plane
210 emitter structure
212 first portion emitter structure
214 second portion emitter structure
216 first collector structure
218 second collector structure
220 first gate structure
222 second gate structure
224 first current path
226 second current path
300 third magnetic field sensor
302 SOI layer portion
304 surface
306 symmetry plane
310 emitter structure
312 first portion emitter structure
314 second portion emitter structure
316 first collector structure
318 second collector structure
320 first gate structure
322 second gate structure
324 first current path
326 second current path
400 lateral magneto resistor
401 poly-gate structure
402 $n^+$-type structure
403 $p^+$-type structure
405 MTI
406 n-type well
407 STI
410 p-type epitaxial layer
414 buried oxide layer
416 silicon handle wafer
500 lateral magneto transistor
501 poly-gate structure
502 $n^+$-type structure
503 $p^+$-type structure
504 $n^-$-type structure
505 MTI
507 STI
508 p-type well
510 p-type epitaxial layer
514 buried oxide layer
516 silicon handle wafer
600 lateral magneto diode
601 poly-gate structure
602 $n^+$-type structure
303 $p^+$-type structure
604 $n^-$-type structure
605 MTI
606 n-type well
607 STI
608 p-type well
610 p-type epitaxial layer
612 n-type epitaxial layer
614 buried oxide layer
616 silicon handle wafer
670 switchable 2-to-1 multiplexer
671 first input terminal
672 second input terminal
673 first output terminal
674 second output terminal
675 third output terminal
676 fourth output terminal
680 first differential amplifier
681 "+"-type input
682 "−"-type input
683 output terminal
684 switchable 2-to-1 multiplexer
685 first input terminal
686 second input terminal
687 third input terminal
688 fourth input terminal
689 first output terminal
690 second output terminal
691 second differential amplifier
692 "+"-type input
693 "−"-type input
694 output terminal
695 third differential amplifier
696 "+"-type input
697 "−"-type input
698 output terminal
699 sensor output (signal)
800 array arrangement 802 magnetic field sensor
804 column [1 . . . M]
806 row [1 . . . N]
810 first triplet configuration
812 second triplet configuration
814 third triplet configuration
816 fourth triplet configuration

The invention claimed is:

1. A differential magnetic field sensor system comprising:
 a first, a second and a third magnetic field sensor, each of which is layouted substantially identically and comprises a, preferably silicon-on-insulator (SOI), surface layer portion provided as a surface portion on a, preferably SOI, wafer and having a surface, on and/or in which is arranged:
 a central emitter structure formed substantially mirror symmetrical with respect to a symmetry plane that is substantially perpendicular to the surface,
 a first and a second collector structure, each of which is arranged spaced apart from the emitter structure and which are arranged on opposite sides of the symmetry plane so as to be substantially mirror images of each other, wherein:
 the first magnetic field sensor is operated double-sided in that its first collector structure and its emitter structure are externally connected via a first read-out circuitry and its second collector structure and its emitter structure are externally connected via a second read-out circuitry,
 the second magnetic field sensor is operated single-sided in that its first collector structure and its emitter structure are externally connected via a third read-out circuitry, and
 the third magnetic field sensor is operated single-sided in that its second collector structure and its emitter structure are externally connected via a fourth read-out circuitry.

2. The sensor system according to claim 1, wherein each of the first, second and third magnetic field sensor has a lateral dimension and wherein the distance between the first and the second magnetic field sensor and the distance between the first and the third magnetic field sensor is less than ten times, preferably less than five times and more preferably less than two times the lateral dimension.

3. The sensor system according to claim 1, wherein in each of the first, second and third magnetic field sensor, the emitter structure is formed by a first portion emitter structure and a second portion emitter structure, wherein the first portion and the second portion emitter structure are arranged adjacent to each other, on opposite sides of the symmetry plane and so as to be substantially mirror images of one another.

4. The sensor system according to claim 1, wherein each of the first, second and third magnetic field sensor is implemented as a lateral magneto-resistor (LMR), in which the emitter structure and the first and the second collector structure are as $n^+$-type structures on and/or in the surface of an n-type well.

5. The sensor system according to claim 4, wherein the first, the second, the third and the fourth read-out circuitry are one of a resistor read-out, a voltage read-out or a current read-out circuitry.

6. The sensor system according to claim 1, wherein each of the first, second and third magnetic field sensor is implemented as a lateral magneto-transistor (LMT), in which the emitter structure and the first and the second collector structure are formed as $n^+$-type structures on and/or in the surface of a p-type.

7. The sensor system according to claim 6, wherein the first, the second, the third and the fourth read-out circuitry are a current read-out circuitry.

8. The sensor system according to claim 1, wherein each of the first, second and third magnetic field sensor is implemented as a lateral magneto-diode (LMD), in which one of the following configurations is implemented:
 (1) the emitter structure is formed as an $n^+$-type structure and the first and the second collector structure are formed as $p^+$-type structures, all on and/or in the surface of an n-type well,
 (2) the emitter structure is formed as a $p^+$-type structure and the first and the second collector structure are formed as $n^+$-type structures, all on and/or in the surface of an n-type well,
 (3) the emitter structure is formed as an $n^+$-type structure and the first and the second collector structure are formed as $p^+$-type structures, all on and/or in the surface of a p-type well, or
 (4) the emitter structure is formed as an $p^+$-type structure and the first and the second collector structure are formed as $n^+$-type structures, all on and/or in the surface (104) of a p-type well.

9. The sensor system according to claim 8, wherein the first, the second, the third and the fourth read-out circuitry are one of a resistor read-out, a voltage read-out or a current read-out circuitry.

10. The sensor system according to claim 1, wherein the first, the second and the third magnetic field sensor are externally connected to form a Wheatstone bridge type circuitry, in which a first and a second voltage divider are coupled between a, for example positive, supply voltage level and a common ground voltage level, wherein:
 the first voltage divider comprises the structure comprising the first collector structure and the emitter structure of the second magnetic field sensor, and the structure comprising the first collector structure and the emitter structure of the first magnetic field sensor, and
 the second voltage divider comprises the structure comprising the second collector structure and the emitter structure of the third magnetic field sensor, and the structure comprising the second collector structure and the emitter structure of the first magnetic field sensor.

11. The sensor system according to claim 10,
 wherein in the first voltage divider,
 the first collector structure of the second magnetic field sensor is coupled to the supply voltage level, the emitter structure of the second magnetic field sensor is coupled to the first collector structure of the first magnetic field sensor and the emitter structure of the first magnetic field sensor is coupled to the common ground voltage level,
 wherein in the second voltage divider,
 the second collector structure of the third magnetic field sensor is coupled to the supply voltage level, the emitter structure of the third magnetic field sensor is coupled to the second collector structure of the first magnetic field sensor,
 and wherein the sensor system further comprises a differential voltage output terminal comprising a first and a second voltage output terminal,
 wherein the first voltage output terminal is coupled to a first node in the connection between the emitter structure of the second magnetic field sensor and the first collector structure of the first magnetic field sensor, and the second voltage output terminal is coupled to a second node in the connection between the emitter structure of the third magnetic field sensor and the second collector structure of the first magnetic field sensor.

12. The sensor system according to claim 11, further comprising a first 1-to-2 multiplexer and a second 1-to-2 multiplexer, wherein:

the first 1-to-2 multiplexer has a first and a second input terminal and a first to fourth output terminal, and is adapted to be switchable into an "a" state and alternatively into a "b" state, wherein in the "a" state, the first output terminal is connected to the first input terminal and the third output terminal is connected to the second input terminal, and in the "b" state, the second output terminal is connected to the first input terminal and the fourth output terminal is connected to the second input terminal, wherein further the first input terminal is coupled to the second input terminal and to the supply voltage level, the first output terminal is connected to the second collector structure of the third magnetic field sensor, the second output terminal is connected to the first collector structure of the third magnetic field sensor, the third output terminal is connected to the first collector structure of the second magnetic field sensor, and the fourth output terminal is connected to the second collector structure of the second magnetic field sensor; and wherein the second 1-to-2 multiplexer has a first and a second input terminal and a first to fourth output terminal, and is adapted to be switchable into an "a" state and alternatively into a "b" state, wherein in the "a" state, the second output terminal is connected to the first input terminal and the fourth output terminal is connected to the second input terminal, and in the "b" state, the first output terminal is connected to the first input terminal and the third output terminal is connected to the second input terminal, wherein further the first input terminal is coupled to the second collector structure of the first magnetic field sensor and to the second voltage output terminal of the Wheatstone bridge type circuitry, the second input terminal is coupled to the first collector structure of the first magnetic field sensor and to the first voltage output terminal of the Wheatstone bridge type circuitry, the first output terminal is connected with the fourth output terminal and coupled to the emitter structure of the second magnetic field sensor, the second output terminal is connected with the third output terminal and coupled to the emitter structure of the third magnetic field sensor.

13. The sensor system according to claim 10, further comprising external switching circuitry adapted to cyclically switch the magnetic field sensor system from a first state to a second state, from the second state to a third state, from the third state to the first state, and so on, wherein:

in the first state, the first magnetic field sensor is operated double-sided via its first collector structure to its emitter structure and via its second collector structure to its emitter structure, the second magnetic field sensor is operated single-sided via its first collector structure to its emitter structure, and the third magnetic field sensor is operated single-sided via its second collector structure to its emitter structure, in the second state, the first magnetic field sensor of the first state has become the third magnetic field sensor, the second magnetic field sensor of the first state has become the first magnetic field sensor and the third magnetic field sensor of the first state has become the second magnetic field sensor, in the third state, the first magnetic field sensor of the first state has become the second magnetic field sensor, the second magnetic field sensor of the first state has become the third magnetic field sensor and the third magnetic field sensor of the first state has become the first magnetic field sensor.

14. The sensor system according to claim 1, further comprising a chopped differential magnetic field sensor read-out circuitry, which comprises a switchable 1-to-2 multiplexer, a first differential amplifier, a switchable 2-to-1 multiplexer, a second differential amplifier, a third differential amplifier, and clock circuitry, and which is adapted to provide a sensor output signal, wherein:

the switchable 1-to-2 multiplexer has a first and second input terminal and a first to fourth output terminal and is adapted to be switchable into an "a"-state and alternatively into a "b"-state, wherein the first and second input terminals are connected to a current source, the first output terminal is connected to the first collector structure of the second magnetic field sensor, the second output terminal is connected to the second collector structure of the second magnetic field sensor, the third output terminal is connected to the second collector structure of the third magnetic field sensor and the fourth output terminal is connected to the first collector structure of the third magnetic field sensor and wherein in the "a"-state, the first input terminal is connected to the second output terminal and the second input terminal is connected to the fourth output terminal and in the "b"-state, the first input terminal is connected to the first output terminal and the second input terminal is connected to the third output terminal, the first differential amplifier has a "+"-type input terminal, a "−"-type input terminal and an output terminal, wherein the "+"-type input terminal is coupled to one of the first and second collector structure of the first magnetic field sensor and the "−"-type input terminal is coupled to the other one of the first and second collector structure of the first magnetic field sensor, the switchable 2-to-1 multiplexer has a first to fourth input terminal and a first and a second output terminal and is adapted to be switchable into an "a"-state and alternatively into a "b"-state, wherein in the "a"-state, the first input terminal is connected to the first output terminal and the third input terminal is connected to the second output terminal, and in the "b"-state, the second input terminal is connected to the first output terminal and the fourth input terminal is connected to the second output terminal; and wherein the first input terminal is coupled to the second collector structure of the second magnetic field sensor, the second input terminal is coupled to the second collector structure of the third magnetic field sensor, the third input terminal is coupled to the first collector structure of the third magnetic field sensor, the fourth input terminal is coupled to the first collector structure of the second magnetic field sensor;

the clock circuitry is adapted to switch the 2-to-1 multiplexer sequentially from its "a"-state to its "b"-state, from its "b"-state to its "a"-state, and so on;

the second differential amplifier has a "+"-type input terminal, a "−"-type input terminal and an output terminal, wherein the "−"-type input terminal is coupled to first output terminal of the 2-to-1 multiplexer, and the "+"-type input terminal is coupled to second output terminal of the 2-to-1 multiplexer; and the third differential amplifier has a "+"-type input terminal, a "−"-type input terminal and an output terminal, wherein the "+"-type input terminal is coupled to output terminal of the first differential amplifier, the "−"-type input terminal is coupled to output terminal of the second differential amplifier, and the output terminal provides the sensor output signal.

15. A two-dimensional magnetic field sensor array arrangement comprising an M×N array of magnetic field sensors, the array having M columns and N rows, the M columns being numbered by an integer index i which can assume any value from 1 to M, the N rows being numbered by an integer index j which can assume any value from 1 to N, wherein M and N are integers that are greater than or equal to 3, wherein each magnetic field sensor comprises a, preferably silicon-on-insulator, surface layer portion and has a surface, on and/or in which is arranged:

a central emitter structure formed substantially mirror symmetrical with respect to a symmetry plane that is substantially perpendicular to the surface, a first and a second collector structure, each of which is arranged spaced apart from the emitter structure and which are arranged on opposite sides of the symmetry plane so as to be substantially mirror images of each other, wherein each magnetic field sensor is referenced by the integer index i indicating the column to which the sensor belongs and by the integer index j indicating the row (806) to which the sensor belongs, the magnetic field sensor array arrangement further comprising external connection circuitry configured such that triplets of magnetic field sensors are formed according to one of the following triplet configurations:

(a) (i, j), (i, j+1) and (i, j+2) for any i in the range from 1 to M and any j in the range from 1 to N−2, (b) (i, j), (i+1, j) and (i+2, j) for any i in the range from 1 to M−2 and any j in the range from 1 to N, (c) (i, j), (i+1, j+1) and (i+2, j+2) for any i in the range from 1 to M−2 and any j in the range from 1 to N−2, (d) (i, j), (i−1, j+1) and (i−2, j+2) for any i in the range from 3 to M and any j in the range from 1 to N−2, and (e) a random selection of three magnetic field sensors out of all available magnetic field sensors (i, j) for any i in the range from 1 to M and any j in the range from 1 to N, and wherein each of the triplet configurations (a) through (e) is configured to form a differential magnetic field sensor system according to claim 1.

16. The two-dimensional magnetic field sensor array arrangement according to claim 15, further comprising external connection circuitry and clock circuitry defining clock cycles starting at time instances t, t+Δt, t+2Δt, and so on, such that each triplet configuration of magnetic field sensors is sequentially stepped within the array arrangement according one of the following positional schemes:

(1) position at time instance t: (i, j),
position at time instance t+Δt: (i+1, j) or (i−1, j), and
position at time instance t+2Δt: (i+2, j) or (i−2, j);

(2) position at time instance t: (i, j),
position at time instance t+Δt: (i, j+1) or (i, j−1), and
position at time instance t+2Δt: (i, j+2) or (i, j−2);

(3) position at time instance t: (i, j),
position at time instance t+Δt: (i+1, j+1) or (i−1, j−1), and
position at time instance t+2Δt: (i+2, j+2) or (i−2, j−2); and (4) position at time instance t: (i, j),
position at time instance t+Δt: (i+1, j−1) or (i−1, j+1), and
position at time instance t+2Δt: (i+2, j−2) or (i−2, j+2);

wherein the stated sequential positions (i, j) refer to the position in the array arrangement of the first magnetic field sensor of the triplet configuration, while the second and the third magnetic field sensor of the triplet configuration are located at respective fixed relative positions with respect to the first magnetic field sensor.

* * * * *